United States Patent
Ko et al.

(10) Patent No.: US 10,512,931 B2
(45) Date of Patent: Dec. 24, 2019

(54) APPARATUS AND TECHNIQUES FOR ELECTRONIC DEVICE ENCAPSULATION

(71) Applicant: Kateeva, Inc., Newark, CA (US)

(72) Inventors: Alexander Sou-Kang Ko, Santa Clara, CA (US); Justin Mauck, Belmont, CA (US); Eliyahu Vronsky, Los Altos, CA (US); Conor F. Madigan, San Francisco, CA (US); Eugene Rabinovich, Fremont, CA (US); Nahid Harjee, Sunnyvale, CA (US); Christopher Buchner, Sunnyvale, CA (US); Gregory Lewis, Mountain View, CA (US)

(73) Assignee: KATEEVA, INC., Newark, CA (US)

( * ) Notice: Subject to any disclaimer, the term of this patent is extended or adjusted under 35 U.S.C. 154(b) by 0 days.

(21) Appl. No.: 15/421,190

(22) Filed: Jan. 31, 2017

(65) Prior Publication Data

US 2017/0232462 A1 Aug. 17, 2017

Related U.S. Application Data

(63) Continuation of application No. 15/047,458, filed on Feb. 18, 2016, now Pat. No. 9,579,905, which is a
(Continued)

(30) Foreign Application Priority Data

Jan. 20, 2015 (TW) .............................. 104101762 A

(51) Int. Cl.
*B05C 15/00* (2006.01)
*H01L 21/67* (2006.01)
(Continued)

(52) U.S. Cl.
CPC .............. *B05B 15/60* (2018.02); *B05C 13/00* (2013.01); *B05C 15/00* (2013.01); *B05D 5/00* (2013.01);
(Continued)

(58) Field of Classification Search
None
See application file for complete search history.

(56) References Cited

U.S. PATENT DOCUMENTS 4,226,897 A 10/1980 Coleman
4,587,002 A 5/1986 Bok
(Continued)

FOREIGN PATENT DOCUMENTS

CN 1956209 A 5/2007
CN 201446232 U 5/2010
(Continued)

OTHER PUBLICATIONS

CN Second Office Action dated Apr. 6, 2017 for CN Patent Application 201580002316.7.
(Continued)

*Primary Examiner* — Binu Thomas
(74) *Attorney, Agent, or Firm* — Paula J. Tostado

(57) ABSTRACT

Apparatus and techniques for use in manufacturing a light emitting device, such as an organic light emitting diode (OLED) device can include using one or more modules having a controlled environment. The controlled environment can be maintained at a pressure at about atmospheric pressure or above atmospheric pressure. The modules can be arranged to provide various processing regions and to facilitate printing or otherwise depositing one or more patterned organic layers of an OLED device, such as an organic encapsulation layer (OEL) of an OLED device. In an example, uniform support for a substrate can be provided at
(Continued)

least in part using a gas cushion, such as during one or more of a printing, holding, or curing operation comprising an OEL fabrication process. In another example, uniform support for the substrate can be provided using a distributed vacuum region, such as provided by a porous medium.

27 Claims, 39 Drawing Sheets

Related U.S. Application Data continuation of application No. 14/727,602, filed on Jun. 1, 2015, now Pat. No. 9,343,678, which is a continuation of application No. PCT/US2015/011854, filed on Jan. 16, 2015.

(60) Provisional application No. 61/929,668, filed on Jan. 21, 2014, provisional application No. 61/945,059, filed on Feb. 26, 2014, provisional application No. 61/947,671, filed on Mar. 4, 2014, provisional application No. 61/986,868, filed on Apr. 30, 2014, provisional application No. 62/002,384, filed on May 23, 2014.

(51) Int. Cl.
| | | |
|---|---|---|
| H01L 21/677 | (2006.01) | |
| B41J 11/00 | (2006.01) | |
| B05B 15/60 | (2018.01) | |
| B05C 13/00 | (2006.01) | |
| H01L 51/00 | (2006.01) | |
| B41J 3/407 | (2006.01) | |
| B05D 5/00 | (2006.01) | |
| H01L 51/52 | (2006.01) | |
| H01L 51/56 | (2006.01) | |
| B41J 2/01 | (2006.01) | |
| C09D 11/101 | (2014.01) | |

(52) U.S. Cl.
CPC ............... *B41J 2/01* (2013.01); *B41J 3/407* (2013.01); *B41J 11/0015* (2013.01); *H01L 21/6715* (2013.01); *H01L 21/6719* (2013.01); *H01L 21/6776* (2013.01); *H01L 21/67115* (2013.01); *H01L 21/67161* (2013.01); *H01L 21/67184* (2013.01); *H01L 21/67207* (2013.01); *H01L 21/67784* (2013.01); *H01L 51/00* (2013.01); *H01L 51/0005* (2013.01); *H01L 51/5253* (2013.01); *H01L 51/56* (2013.01); *B41J 11/002* (2013.01); *C09D 11/101* (2013.01)

(56) References Cited

U.S. PATENT DOCUMENTS

| | | | |
|---|---|---|---|
| 5,016,363 A | 5/1991 | Krieger | |
| 5,053,355 A | 10/1991 | Campe | |
| 5,344,365 A * | 9/1994 | Scott | ............... H01L 21/67712 454/187 |
| 5,651,625 A | 7/1997 | Smith et al. | |
| 6,089,282 A | 7/2000 | Spiegelman et al. | |
| 6,939,212 B1 | 9/2005 | Pham | |
| 8,414,688 B1 | 4/2013 | Delgado et al. | |
| 9,343,678 B2 | 5/2016 | Ko et al. | |
| 2002/0053589 A1 | 5/2002 | Owen et al. | |
| 2004/0021762 A1 | 2/2004 | Seki et al. | |
| 2004/0075112 A1 | 4/2004 | Yamazaki et al. | |
| 2004/0075385 A1 | 4/2004 | Tao | |
| 2005/0062773 A1 | 3/2005 | Fouet | |
| 2005/0079278 A1 | 4/2005 | Burrows et al. | |
| 2005/0140764 A1 | 6/2005 | Chang et al. | |
| 2006/0008591 A1 | 1/2006 | Sun et al. | |
| 2006/0096395 A1 | 5/2006 | Weiss et al. | |
| 2006/0274096 A1 | 12/2006 | Kanda et al. | |
| 2007/0024686 A1 | 2/2007 | Kadomatsu et al. | |
| 2007/0026151 A1 * | 2/2007 | Higginson | ........ H01L 21/67161 118/719 |
| 2007/0195653 A1 | 8/2007 | Yassour et al. | |
| 2008/0145190 A1 * | 6/2008 | Yassour | .................. H01L 21/00 414/147 |
| 2008/0273072 A1 * | 11/2008 | Chung | .................. C03C 17/002 347/102 |
| 2009/0031579 A1 * | 2/2009 | Piatt | ........ B41J 11/002 34/82 |
| 2009/0047103 A1 * | 2/2009 | Inamasu | ........... H01L 21/67784 118/500 |
| 2009/0244510 A1 | 10/2009 | Domanowski | |
| 2009/0295857 A1 | 12/2009 | Kikuchi et al. | |
| 2009/0324368 A1 | 12/2009 | Koparal et al. | |
| 2010/0201749 A1 | 8/2010 | Somekh et al. | |
| 2010/0255184 A1 | 10/2010 | Yamazaki et al. | |
| 2010/0282271 A1 | 11/2010 | Devitt | |
| 2010/0301377 A1 * | 12/2010 | Kato | ..................... H01L 23/296 257/100 |
| 2011/0096124 A1 | 4/2011 | North et al. | |
| 2011/0100394 A1 | 5/2011 | Yi et al. | |
| 2012/0056923 A1 | 3/2012 | Vronsky et al. | |
| 2012/0089180 A1 | 4/2012 | Fathi et al. | |
| 2012/0128890 A1 | 5/2012 | Mirchev | |
| 2012/0154473 A1 * | 6/2012 | Tennis | ..................... B41J 2/175 347/17 |
| 2012/0326139 A1 | 12/2012 | Chen | |
| 2013/0004656 A1 | 1/2013 | Chen et al. | |
| 2013/0038649 A1 | 2/2013 | Lowrance et al. | |
| 2013/0040061 A1 * | 2/2013 | Lowrance | ................ B41J 3/407 118/500 |
| 2013/0203269 A1 | 8/2013 | Yokouchi | |
| 2013/0209199 A1 | 8/2013 | Maeda et al. | |
| 2013/0252533 A1 | 9/2013 | Mauck et al. | |
| 2013/0258709 A1 | 10/2013 | Thompson et al. | |
| 2013/0307898 A1 | 11/2013 | Somekh et al. | |
| 2013/0316182 A1 * | 11/2013 | Mori | ..................... H01L 51/524 428/448 |
| 2014/0134776 A1 * | 5/2014 | Furutani | ............. H01G 9/2059 438/57 |
| 2014/0290567 A1 | 10/2014 | Mauck et al. | |
| 2014/0311405 A1 | 10/2014 | Mauck et al. | |
| 2015/0314325 A1 | 11/2015 | Ko et al. | |
| 2017/0189935 A1 | 7/2017 | Ko et al. | |

FOREIGN PATENT DOCUMENTS

| | | |
|---|---|---|
| CN | 101794076 A | 8/2010 |
| CN | 101911281 B | 8/2012 |
| CN | 102983289 A | 3/2013 |
| EP | 2315501 A1 | 4/2011 |
| JP | 2003266007 A | 9/2003 |
| JP | 2003270417 | 9/2003 |
| JP | 2003272847 A | 9/2003 |
| JP | 2005254038 A | 9/2005 |
| JP | 2006026463 A | 2/2006 |
| JP | 2008004919 A | 1/2008 |
| JP | 2011129275 A | 6/2011 |
| JP | 201369701 | 4/2013 |
| JP | 2013175486 | 9/2013 |
| KR | 20050092369 A | 9/2005 |
| KR | 1020060031968 | 4/2006 |
| KR | 1020060031968 A | 4/2006 |
| KR | 20060080899 A | 8/2006 |
| KR | 20080026168 A | 3/2008 |
| KR | 1020080026168 | 3/2008 |
| KR | 20090126568 A | 12/2009 |
| KR | 20110039133 A | 4/2011 |
| KR | 1020110058008 | 6/2011 |
| KR | 1020120001852 | 1/2012 |
| KR | 20120022197 A | 3/2012 |
| KR | 20120040070 A | 4/2012 |
| KR | 1020120040070 A | 4/2012 |
| KR | 20120128996 A | 11/2012 |

(56) References Cited

FOREIGN PATENT DOCUMENTS

| KR | 1020130079682 A | 11/2013 |
|---|---|---|
| TW | 200301665 A | 7/2003 |
| TW | 200504798 A | 2/2005 |
| TW | 200508124 A | 3/2005 |
| TW | 200400537 A | 11/2007 |
| TW | 201316593 A | 4/2013 |
| TW | 201322518 A | 6/2013 |
| WO | 2013023099 A1 | 2/2013 |
| WO | 2015112454 A1 | 7/2015 |
| WO | 2015168036 A1 | 11/2015 |

OTHER PUBLICATIONS

First Examination Report dated Mar. 2, 2017 for EP Application No. 15740186.0.
Official Action with Search Report dated Feb. 21, 2017 for TW Application No. 105119106.
TW Office Action dated Mar. 7, 2017 for TW Application No. 105126475.
KR—Notice of first (non-final) Refusal dated May 31, 2017 for KR patent application No. 10-2016-7015302.
TW Examination Report dated Jun. 6, 2017 for TW Patent Application No. 104113869.
European Supplemental Search Report dated Nov. 7, 2016 for EP Application No. 15740186.0.
First Office Action dated Aug. 23, 2016 for CN Application No. 201580002316.7.
International Search Report and Written Opinion dated Apr. 17, 2015, to PCT Application PCT/US15/11854.
International Search Report and Written Opinion dated Aug. 4, 2015, PCT Application PCT/US15/27835.
Office Action dated Oct. 11, 2016 for JP 2016-528850.
Provisional Rejection dated Oct. 14, 2016 for KR Application No. 10-2016-7015302.
Examination Report dated Mar. 23, 2018, to TW Patent Application No. 106120173.
Extended EP Search Report dated Dec. 15, 2017, to EP Patent Application No. 15786568.4.
Office Action dated Feb. 13, 2018, to CN Patent Application No. 201710368338.6.
Office action dated Mar. 2, 2018, to JP Patent Application No. 2016-563454.
Provisional Rejection dated Apr. 18, 2018, on KR Patent Application No. 10-2016-7033463.
Non-Final Office action dated Dec. 3, 2018, to U.S. Appl. No. 15/417,583.
Office action dated Nov. 28, 2018, to CN Patent Application No. 201710914561.6.
Provisional Rejection dated Dec. 10, 2018, to KR Application No. 10-2017-7031818.
Provisional Rejection dated Nov. 14, 2018, to KR Patent Application No. 10-2018-7019537.
Third Office Action dated Nov. 23, 2018, to CN Patent Application 201710368338.6.
Final Office action dated Sep. 17, 2018, to U.S. Appl. No. 15/417,583.
Official Letter dated Jul. 17, 2018, to TW Patent Application No. 106120173.
Second Office Action dated Aug. 14, 2018, to CN Patent Application No. 201710368338.6.
Office action dated Sep. 3, 2018, to CN Patent Application No. 201580023550.8.
Supplemental Notice of Allowability dated Feb. 28, 2019, to U.S. Appl. No. 15/184,755.
Second Office action dated Mar. 5, 2019, to CN Patent Application No. 201580023550.8.
Second Office Action dated Jan. 31, 2019, to JP Patent Application No. 2017-114390.
Examination Report dated May 20, 2019 for EP Application 14810543.0.
Final Office action dated Mar. 22, 2019, to U.S. Appl. No. 15/446,984.
Non Final Office Action dated Mar. 28, 2019 to U.S. Appl. No. 16/102,392.
Non Final Office Action dated May 23, 2019 for U.S. Appl. No. 15/409,844.
Notice of Allowance dated Mar. 7, 2019 to U.S. Appl. No. 15/605,806.
Notice of Allowance dated Apr. 17, 2019 to U.S. Appl. No. 15/184,755.
Notice of Allowance dated Apr. 4, 2019 for U.S. Appl. No. 15/106,907.
Notice of Allowance dated Feb. 14, 2019 to U.S. Appl. No. 14/275,637.
Notice of Allowance dated Feb. 27, 2019, to U.S. Appl. No. 14/543,786.
Notice of allowance dated Mar. 4, 2019, to U.S. Appl. No. 15/409,844.
Notice of Allowance dated Mar. 8, 2019 to U.S. Appl. No. 14/275,637.
Notification of Provisional Rejection dated Apr. 4, 2019.
Provisional Rejection dated Jan. 28, 2019, to KR Patent Application No. 10-2018-7035564.
Office action dated Apr. 26, 2019, to CN Patent Application No. 201610837821.X.
Office Action dated May 7, 2019 for JP Application 2018-142544.

\* cited by examiner

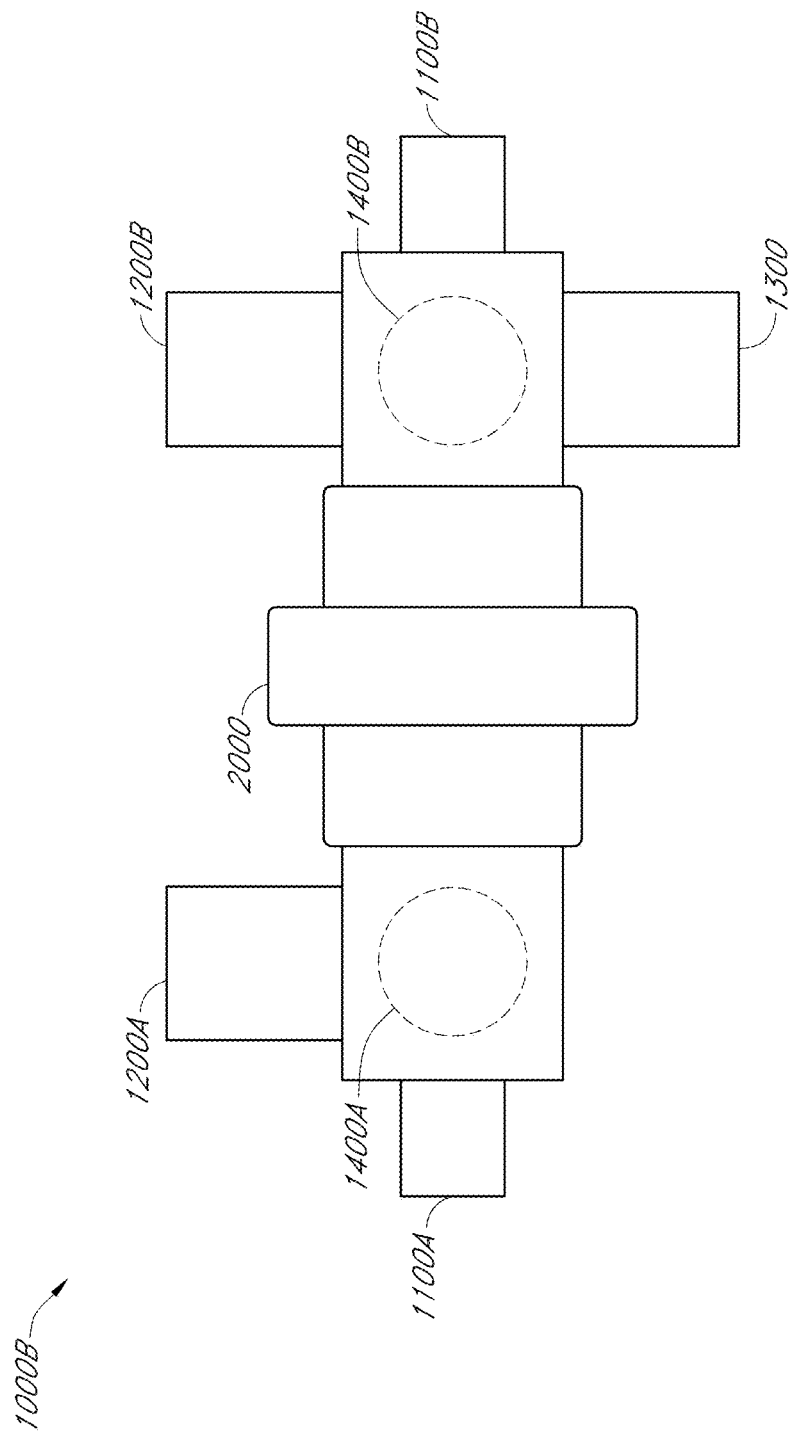

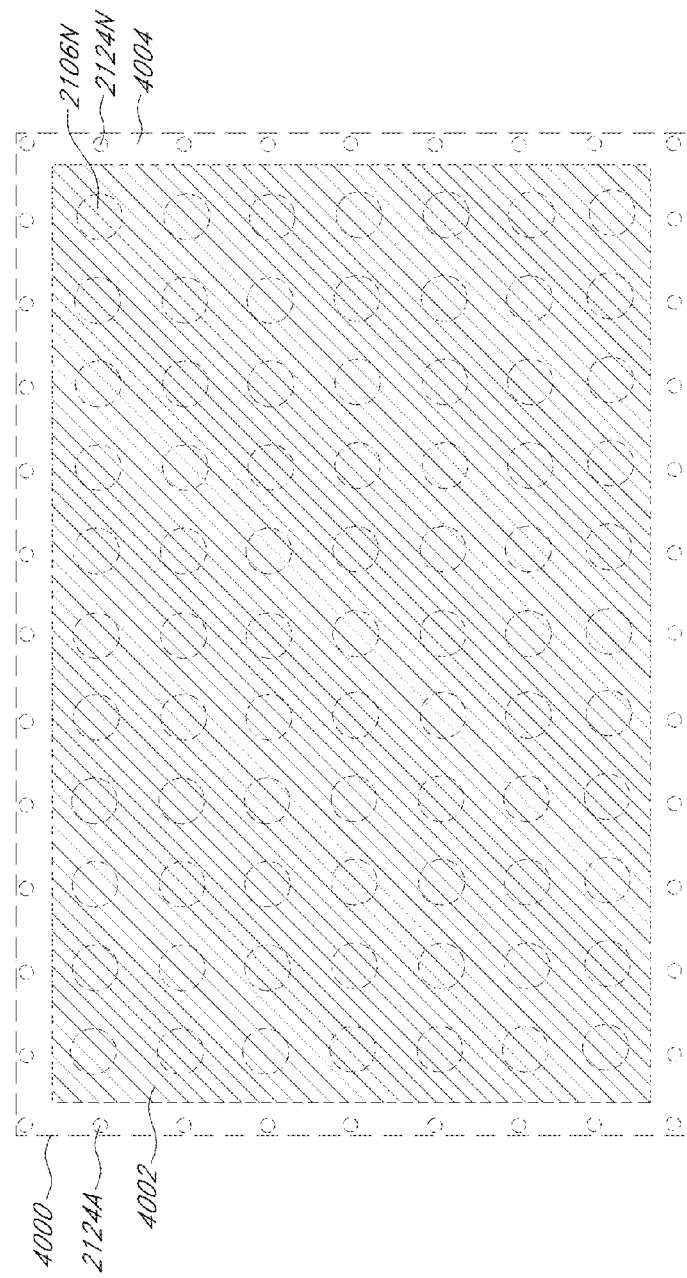
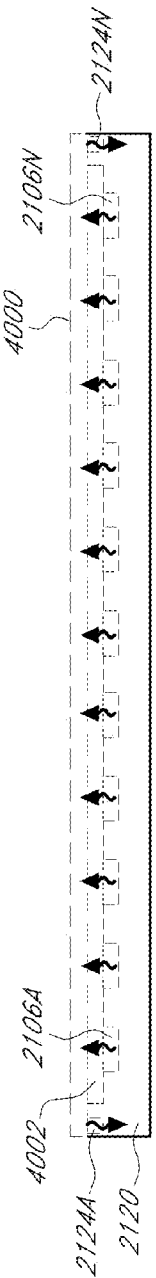
FIG. 14B
FIG. 14C

APPARATUS AND TECHNIQUES FOR ELECTRONIC DEVICE ENCAPSULATION

CLAIM OF PRIORITY

This patent application is a continuation of U.S. application Ser. No. 15/047,458, filed Feb. 18, 2016. U.S. application Ser. No. 15/047,458 is a continuation of U.S. Ser. No. 14/727,602, filed Jun. 1, 2015, and issued as U.S. Pat. No. 9,343,678 on Jun. 17, 2016. U.S. Pat. No. 9,343,678 is a continuation of PCT application no. PCT/US2015/11854, filed Jan. 16, 2015. PCT application no. PCT/US2015/11854 claims benefit of priority of each of the following: (1) U.S. Provisional Patent Application Ser. No. 61/929,668, titled "DISPLAY DEVICE FABRICATION SYSTEMS AND TECHNIQUES USING INERT ENVIRONMENT," filed on Jan. 21, 2014; (2) U.S. Provisional Patent Application Ser. No. 61/945,059, titled "DISPLAY DEVICE FABRICATION SYSTEMS AND TECHNIQUES USING INERT ENVIRONMENT," filed on Feb. 26, 2014; (3) U.S. Provisional Patent Application Ser. No. 61/947,671, titled "DISPLAY DEVICE FABRICATION SYSTEMS AND TECHNIQUES USING INERT ENVIRONMENT," filed on Mar. 4, 2014; (4) U.S. Provisional Patent Application Ser. No. 61/986,868, titled "Systems and Methods for the Fabrication of Inkjet Printed Encapsulation Layers," filed on Apr. 30, 2014; and (5) U.S. Provisional Patent Application Ser. No. 62/002,384, titled "DISPLAY DEVICE FABRICATION SYSTEMS AND TECHNIQUES USING INERT ENVIRONMENT," filed on May 23, 2014. All applications listed in the claim of priority herein are hereby incorporated by reference, each in its entirety.

CROSS-REFERENCE TO RELATED PATENT DOCUMENTS

This patent application is related to U.S. Patent Pub. No. US 2013/0252533 A1 (Mauck, et al.), titled "GAS ENCLOSURE ASSEMBLY AND SYSTEM," U.S. Patent Pub. No. US 2013/0206058 A1 (Mauck, et al.), titled "GAS ENCLOSURE ASSEMBLY AND SYSTEM," and U.S. Pat. No. 8,383,202 (Somekh et al.), titled "METHOD AND APPARATUS FOR LOAD-LOCKED PRINTING," each of which is hereby incorporated herein by reference in its entirety.

BACKGROUND

Electronic devices, such as optoelectronic devices, can be fabricated using organic materials, particularly using thin-film processing techniques. Such organic optoelectronic devices can be volumetrically compact because of their relatively thin and planar structure, along with providing enhanced power efficiency and enhanced visual performance, such as compared to other display technologies. In certain examples, such devices can be mechanically flexible (e.g., foldable or bendable), or optically transparent, unlike competing technologies. Applications for an organic optoelectronic device can include general illumination, use as a backlight illumination source, or use as a pixel light source or other element in an electroluminescent display, for example. One class of organic optoelectronic devices includes organic light emitting diode (OLED) devices, which can generate light using electroluminescent emissive organic materials such as small molecules, polymers, fluorescent, or phosphorescent materials, for example.

In one approach, OLED devices can be fabricated in part via vacuum deposition of a series of organic thin films onto a substrate using the technique of thermal evaporation. However, vacuum processing in this manner is relatively: (1) complex, generally involving a large vacuum chamber and pumping subsystem to maintain such vacuum; (2) wasteful of the organic raw material, as a large fraction of the material in such a system is generally deposited onto the walls and fixtures of the interior, such that more material is generally wasted than deposited onto the substrate; and (3) difficult to maintain, such as involving frequently stopping the operation of the vacuum deposition tool to open and clean the walls and fixtures of built-up waste material. Furthermore, in OLED applications it can be desirable to deposit the organic films in a pattern.

In another approach, a blanket coating can be deposited over the substrate and photolithography can be considered for achieving desired patterning. But, in various applications and for OLED materials in particular, such photolithography processes can damage the deposited organic film or the underlying organic films. A so-called shadowmask can be used to pattern the deposited layer directly when using a vacuum deposition technique. The shadowmask in such cases comprises a physical stencil, often manufactured as a metal sheet with cut-outs for the deposition regions. The shadowmask is generally placed in proximity to or in contact with, and aligned to, the substrate prior to deposition, kept in place during deposition, and then removed after deposition. Such direct-patterning via shadowmask adds substantial complexity to vacuum-based deposition techniques, generally involving additional mechanisms and fixturing to handle and position the mask precisely relative to the substrate, further increasing the material waste (due to the waste from material deposited onto the shadowmask), and further increasing the need for maintenance to continuously clean and replace the shadowmasks themselves. Shadowmask techniques also generally involve relatively thin masks to achieve the pixel scale patterning required for display applications, and such thin masks are mechanically unstable over large areas, limiting the maximum size of substrate that can be processed. Improving scalability remains a major challenge for OLED manufacturing, so such limitations on scalability can be significant.

The organic materials used in OLED devices are also generally highly sensitive to exposure to various ambient materials, such as oxygen, ozone, or water. For example, organic materials used in various internal layers of an OLED device, such as including an electron injection or transport layer, a hole injection or transport layer, a blocking layer, or an emission layer, for example, can be subject to a variety of degradation mechanisms. Such degradation can be driven at least in part by incorporation of chemically or electrically/optically active contaminants into the device structure, either within the bulk material of each film or at the interfaces between layers in the overall device stack. Over time chemically active contaminants can trigger a chemical reaction in the film that degrades the film material. Such chemical reactions can occur simply as a function of time, absent any other triggers, or can be triggered by ambient optical energy or injected electrical energy, for example. Electrically or optically active contaminants can create parasitic electrical or optical pathways for the electrical or optical energy introduced or generated in the device during operation. Such pathways can result in suppression of light output, or generation of incorrect light output (e.g., light output of the wrong spectrum.) The degradation or loss may manifest as failure of an individual OLED display elements, "black" spotting in portions of an array of OLED elements, visible artifacts or loss of electrical or optical efficiency, or unwanted deviation in color rendering accuracy, contrast, or brightness in various affected regions of the array of OLED elements.

OVERVIEW

One or more layers of an OLED device can be fabricated (e.g., deposited or patterned) using a printing technique. For example, an organic material, such as for example a hole injection material, a hole transport material, an emissive material, an electron transport material, a hole blocking material, or an electron injection material can be dissolved or otherwise suspended in a carrier fluid (e.g., a solvent), and a layer of an OLED device including the organic material can be formed by ink-jet printing and subsequent evaporation of the carrier fluid to provide a patterned layer. For example, an organic material, such as an organic thin film encapsulation material, can be inkjet printed in a pattern onto a substrate as a liquid mixture of organic compounds, the patterned organic layer coating at least a portion of a light-emitting device fabricated upon the substrate and subsequently solidified by a curing process, such by UV illumination so as to induce a cross linking reaction, thereby forming a patterned solid layer. In another approach, a solid-phase organic material can be vaporized thermally for deposition onto a substrate through a jet. In yet another approach, organic material can be dissolved or otherwise suspended in a carrier liquid, and a layer of OLED device including the organic material can be formed by dispensing a continuous stream on fluid from a nozzle onto a substrate to form a line (so-called "nozzle printing" or "nozzle jet") and subsequent evaporation of the carrier to provide a line patterned layer. Such approaches can generally be referred to as organic "printing" techniques, such as can be performed using a printing system.

The present inventors have recognized, among other things, that printing techniques and other processing operations can be carried out using systems having enclosures configured to provide a controlled environment, such as including an atmosphere comprising a gas that is minimally reactive or non-reactive with one or more species deposited upon or comprising a substrate being processed, such gas having a specified purity level. Such a purity level can also include controlled maximum impurity concentrations of other species, such as oxygen or water, such as to prevent degradation of OLED devices during fabrication or to inhibit or suppress defects. Particulate controls can also be provided, such as to maintain a specified particulate level within the controlled environment. The arrangement of enclosures can include respective modules having individually-maintained controlled environments, or one or more of the modules can share a controlled environment with other modules. Facilities such as gas purification, temperature control, solvent abatement, or particulate control can be shared between modules or can be provided in a dedicated manner.

OLED devices being fabricated, such as substrates including many OLED devices, can be transferred to other fabrication equipment such as using one or more of a loading module (e.g., a "load-lock"), a transfer module including a handler, or using techniques such as an inert or otherwise non-reactive gas curtain and gate arrangement. In this manner, transfer of a respective substrate being fabricated can occur without substantially altering an environment of the enclosed modules or without requiring purging of the enclosed modules. For example, the environment of the enclosed modules can be controlled, such as to provide an environment having less than 100 parts-per-million of oxygen and less than 100 parts-per-million of water vapor. The present inventors have also recognized that use of a load-locked arrangement can allow for controlled-atmosphere-containing line elements to be integrated with other fabrication processes such as open-air or vacuum processes, without substantially altering the controlled (e.g., non-reactive and particulate controlled) environment within a respective module, or without requiring time-consuming purging of the non-reactive gas volumes in each enclosed module.

The present inventors have also recognized, among other things, that a problem can exist where active regions of a substrate are not supported continuously and uniformly can exhibit non-uniformities or visible defects during or after processing. For example, the substrate can be supported by a mechanical chuck that employs vacuum or mechanical clamping to hold the substrate in place during processing. In one approach when processing substrates, lift pins can be used in center regions of the substrate so as to raise or lower the substrate with respect to the chuck so as to facilitate loading and unloading. In the case of vacuum chucks, vacuum holes or grooves in the center regions of the substrates are generally used to hold the substrate down in place. In such an approach, holes or grooves are therefore present in the center region of the chuck when such generally-available support techniques are used and such holes or grooves can represent regions of non-uniform support. Without being bound by theory, such defects are believed to be associated with, for example, a non-uniform thermal profile or non-uniform electrostatic field profile across the surface of the substrate or on a surface opposite a coating or film layer being deposited or treated. The present inventors have recognized that various specialized uniform support techniques can be used to achieve uniform, defect free coatings such as including avoiding non-uniform support in areas of the substrate upon or opposite such active regions.

For example, the present inventors have recognized, among other things, that the substrate can be uniformly supported at least in part using a gas cushion, such as during one or more of a printing operation or other processing such as before or during ultraviolet treatment in a curing module. Use of such a gas cushion can enhance uniformity of a coating or film layer on the substrate, such as by reducing or minimizing mura or other visible defects. In this manner, for example, an organic thin film encapsulation layer can be printed and treated, such as using support techniques including a gas cushion upon or opposite active regions of the substrate where light emitting devices are located. In addition, or instead, the substrate can be uniformly supported by one or more of uniform physical contact within the active regions or by non-uniform physical contact outside of the active region—for example, a vacuum chuck can be configured such that all of the vacuum grooves and holes and lift pin holes are confined to be outside of the active regions. Alternatively, the substrate can be uniformly supported by uniform physical contact within those active regions for which the coating uniformity must be maintained at a high level and supported by non-uniform physical contact outside of the active region or within those active regions for which the coating uniformity need not be maintained at a high level (e.g. for use as test devices or in lower graded products). Alternatively (or additionally), the use of vacuum grooves and holes can be avoided by retaining the substrate using a distributed vacuum region thereby avoiding or reducing discontinuities in the thermal and electrical characteristics of the structure supporting the substrate in one or more active regions, at least with respect to the vacuum retention mechanism.

In an example, a coating system for providing a coating on a substrate can include an enclosed printing system configured to deposit a patterned organic layer on a substrate, the patterned organic layer coating at least a portion of a light-emitting device fabricated upon the substrate, an enclosed curing module including an ultraviolet treatment region configured to accommodate a substrate and configured to provide an ultraviolet treatment to the patterned organic layer, and an enclosed substrate transfer module configured to receive the substrate from an atmospheric environment different from an environment of one or more of the enclosed printing system or the enclosed curing module. The patterned organic layer can occupy a deposition region of the substrate on a first side of the substrate; and the enclosed curing module can be configured to uniformly support the substrate in the ultraviolet treatment region using a gas cushion, the gas cushion provided to a second side of the substrate opposite the first side, the gas cushion established between the substrate and a chuck.

In an example, a technique, such as a method, can include transferring a substrate from an inorganic thin film encapsulation system to a transfer module of an organic thin film encapsulation system, transferring the substrate to an enclosed printing system, the enclosed printing system configured to deposit a patterned organic layer in a deposition region on a first side of the substrate, the patterned organic layer coating at least a portion of a light-emitting device fabricated upon the substrate, uniformly supporting the substrate in the enclosed printing system using a first gas cushion provided to a second side of the substrate opposite the deposition region, printing monomer over the deposition region of the substrate using the enclosed printing system, transferring the substrate from the enclosed printing system to the transfer module, transferring the substrate from the transfer module to an enclosed curing module, uniformly supporting the substrate in the enclosed curing module using a second gas cushion provided to the second side of the substrate opposite the first side, and treating the monomer film layer in the enclosed curing module to provide a mura-free polymerized organic layer in the deposition region.

In an example, a technique, such as a method, can include transferring a substrate from an inorganic thin film encapsulation system to a transfer module of an organic thin film encapsulation system, transferring the substrate to an enclosed printing system, the enclosed printing system configured to deposit a patterned organic layer in a deposition region on a first side of the substrate, the patterned organic layer coating at least a portion of a light-emitting device fabricated upon the substrate, uniformly supporting the substrate in the enclosed printing system using a first uniform support provided to a second side of the substrate opposite the deposition region, printing monomer over the deposition region of the substrate using the enclosed printing system, transferring the substrate from the enclosed printing system to the transfer module, transferring the substrate from the transfer module to an enclosed curing module, uniformly supporting the substrate in the enclosed curing module using a second uniform support provided to the second side of the substrate opposite the first side, and treating the monomer film layer in the enclosed curing module to provide a mura-free polymerized organic layer in the deposition region. One or more of the first or second uniform support regions can include a distributed vacuum region in physical contact with the substrate or a gas cushion.

In an example, a coating system for providing a coating on a substrate can include an enclosed printing system configured to deposit a patterned organic layer on a substrate, the patterned organic layer coating at least a portion of a light-emitting device being fabricated upon the substrate, the enclosed first printing system configured to provide a first processing environment, an enclosed curing module including a stacked configuration of ultraviolet treatment regions, the ultraviolet treatment regions offset from each other and each configured to accommodate a substrate, the enclosed curing module configured to provide a second processing environment, an enclosed substrate transfer module comprising a chamber configured to receive the substrate from an atmospheric environment different from the environment of one or more of the enclosed printing system or the enclosed curing module. The first and second processing environments can include controlled environments at or near atmospheric pressure and established to remain below specified limits of limits of particulate contamination level, water vapor content, and oxygen content.

The systems and techniques described herein can be used in support of manufacturing a range of different electronic device configurations, such as including one or more optoelectronic devices. For example, a flat panel display device can be fabricated at least in part using systems or techniques described herein. Such a flat panel display device can include an organic light emitting diode (OLED) flat panel display. Several OLED flat panel displays can be processed on a substrate (or "mother" glass). Use of the word "substrate" or the phrase "substrate being fabricated" refers generally to an assembly in-process that can include an OLED device. The examples herein need not be restricted to a particular panel geometry or size. For example, such systems and techniques can be used in support of fabrication of display devices on substrates having a generation 2 ("Gen 2") size, such as having a rectangular geometry including dimensions of about 37 centimeters (cm) by about 47 cm. The systems described herein can also be used for somewhat larger substrate geometries, such as in support of fabrication of display devices on substrates having a generation 3.5 ("Gen 3.5") substrate size, such as having a rectangular geometry including dimensions of about 61 centimeters (cm) by about 72 cm. The systems described herein can also be used for even larger substrate geometries, such as in support of fabrication of display devices on substrates having a substrate size corresponding to "Gen 5.5," having dimensions of about 130 cm×150 cm, or a "Gen 7" or "Gen 7.5" substrate, having dimensions of about 195 cm×225 cm. For example, a Gen 7 or Gen 7.5 substrate can be singulated (e.g., cut or otherwise separated) into eight 42 inch (diagonal dimension) or six 47 inch (diagonal dimension) flat panel displays. A "Gen 8" substrate can include dimensions of about 216×246 cm. A "Gen 8.5" substrate can include dimensions of about 220 cm×250 cm, and can be singulated to provide six 55 inch or eight 46 inch flat panels per substrate.

Dimensions beyond Gen 8.5 can be supported using systems and techniques described herein. For example, a "Gen 10" substrate having dimensions of about 285 cm×305 cm, or beyond, can be fabricated at least in part using systems and techniques described herein. The panel sizes described herein, while generally applicable to glass substrates, can applied to substrates of any material suitable for use in display device fabrication, and in particular OLED display fabrication that can include forming one or more layers using printing techniques. For example, a variety of glass substrate materials can be used, as well as a variety of polymeric substrate materials, for example, polyimide.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

FIG. 2A illustrates generally an example of a plan view of at least a portion of a system that can be used in manufacturing a light emitting device (e.g., an OLED device).

FIG. 14A, FIG. 14B, FIG. 14C, and FIG. 14D include illustrative examples depicting various regions of a substrate, and corresponding fixtures such as a chuck or end effector that can include one or more pressurized gas ports, vacuum ports, or vacuum regions.

Figure 1A:
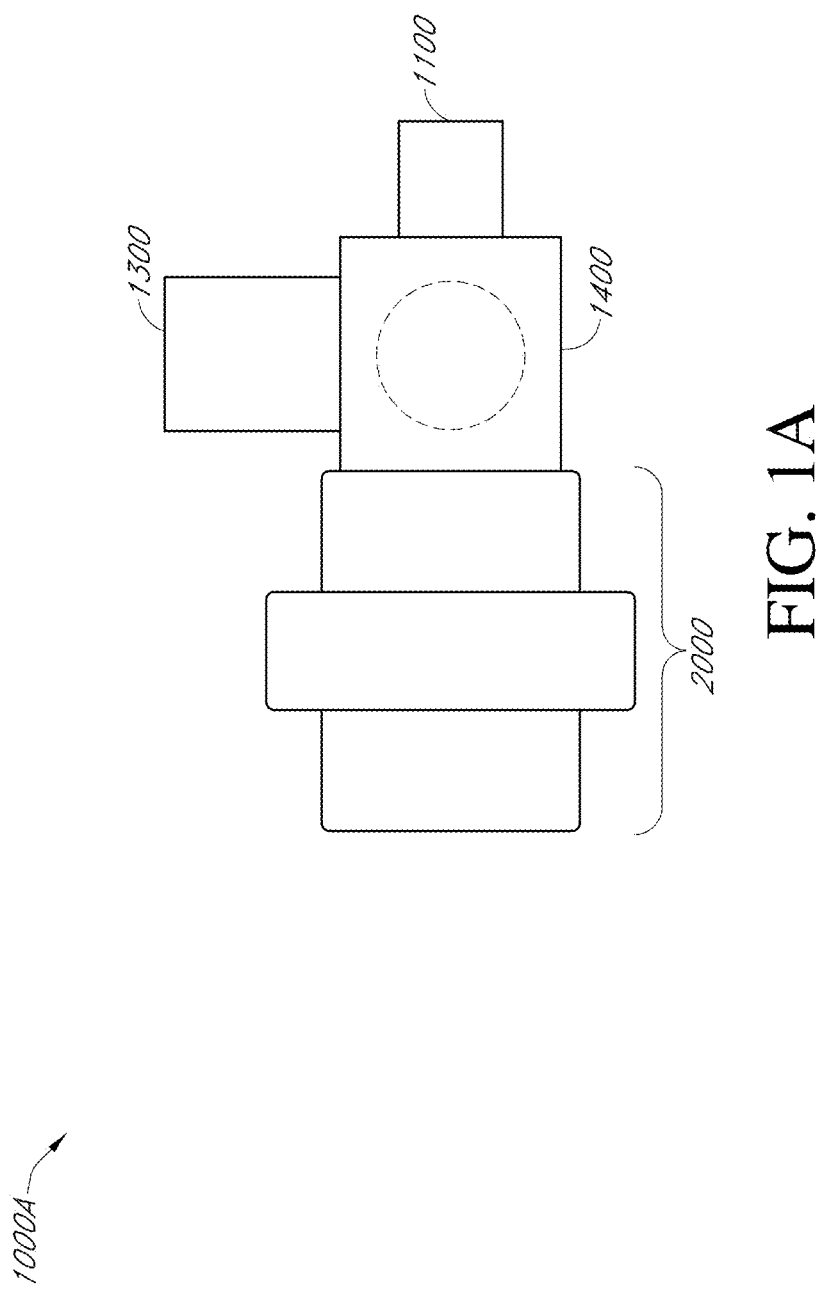
FIG. 1A illustrates generally an example of a plan view of at least a portion of a system, such as including a printing system and a curing module, that can be used in manufacturing an electronic device (e.g., an organic light emitting diode (OLED) device).

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

FIG. 1A illustrates generally an example of a plan view of at least a portion of a system 1000A, such as including a printing system 2000 and a processing module 1300, that can be used in manufacturing an electronic device (e.g., an organic light emitting diode (OLED) device). For example, the system 1000A can be used to form an organic thin film encapsulation layer (OTFEL) upon a substrate containing one or more electronic devices.

Similar to other examples described herein, the system 1000A can include a printing system 2000 (e.g., to "print" or otherwise deposit a film encapsulation layer onto a substrate). The system 1000A can include a transfer module 1400. One or more processing modules such as a processing module 1300 can be coupled to the transfer module 1400. As in other examples described herein, each of the printing system 2000, the transfer module 1400, and processing module 1300 can be enclosed, such as to provide a controlled environment at about atmospheric pressure or above atmospheric pressure (e.g., a nitrogen environment having a specified maximum level of one or more impurity species). Substrates can be transferred to or from the system 1000A such as using a loading module 1100. In this manner, respective controlled environments in one or more other portions of the system 1000A can be maintained without contamination or without requiring purging of an entirety of such controlled environments during transfer of a substrate into or out of the system 1000A. The processing module 1300 can be configured to perform one or a variety of processing operations, such as one or more of a holding operation, a curing operation (e.g., using heat or exposure to ultraviolet radiation to treat a substrate, for example), a buffering operation, or one or more other operations.

The system 1000A of FIG. 1A can be stand-alone, or can be integrated with other elements, such as shown in other examples herein. The system 1000A of FIG. 1A can operate in aggregate in a cluster or in-line mode. For example, in a cluster mode, substrates can be loaded and unloaded from loading module 1100. For example, in an in-line mode, substrates can be loaded into the left side of printing system 2000 and unloaded from loading module 1100.

Figure 1B:
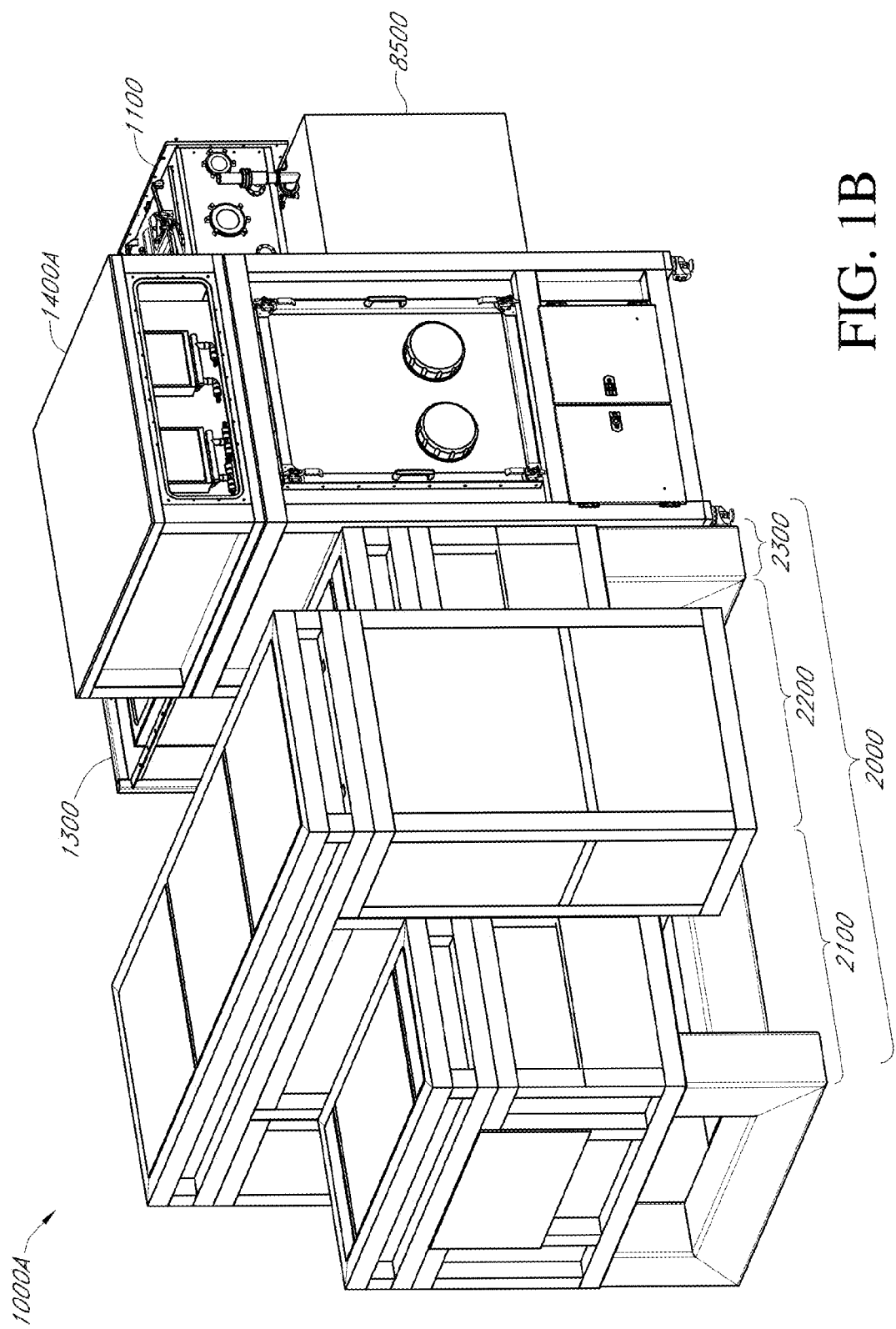
FIG. 1B and FIG. 1C illustrate generally illustrative examples of isometric views of at least a portion of a system, such as including a printing system and a curing module, that can be used in manufacturing an electronic device (e.g., an organic light emitting diode (OLED) device).
Figure 1C:
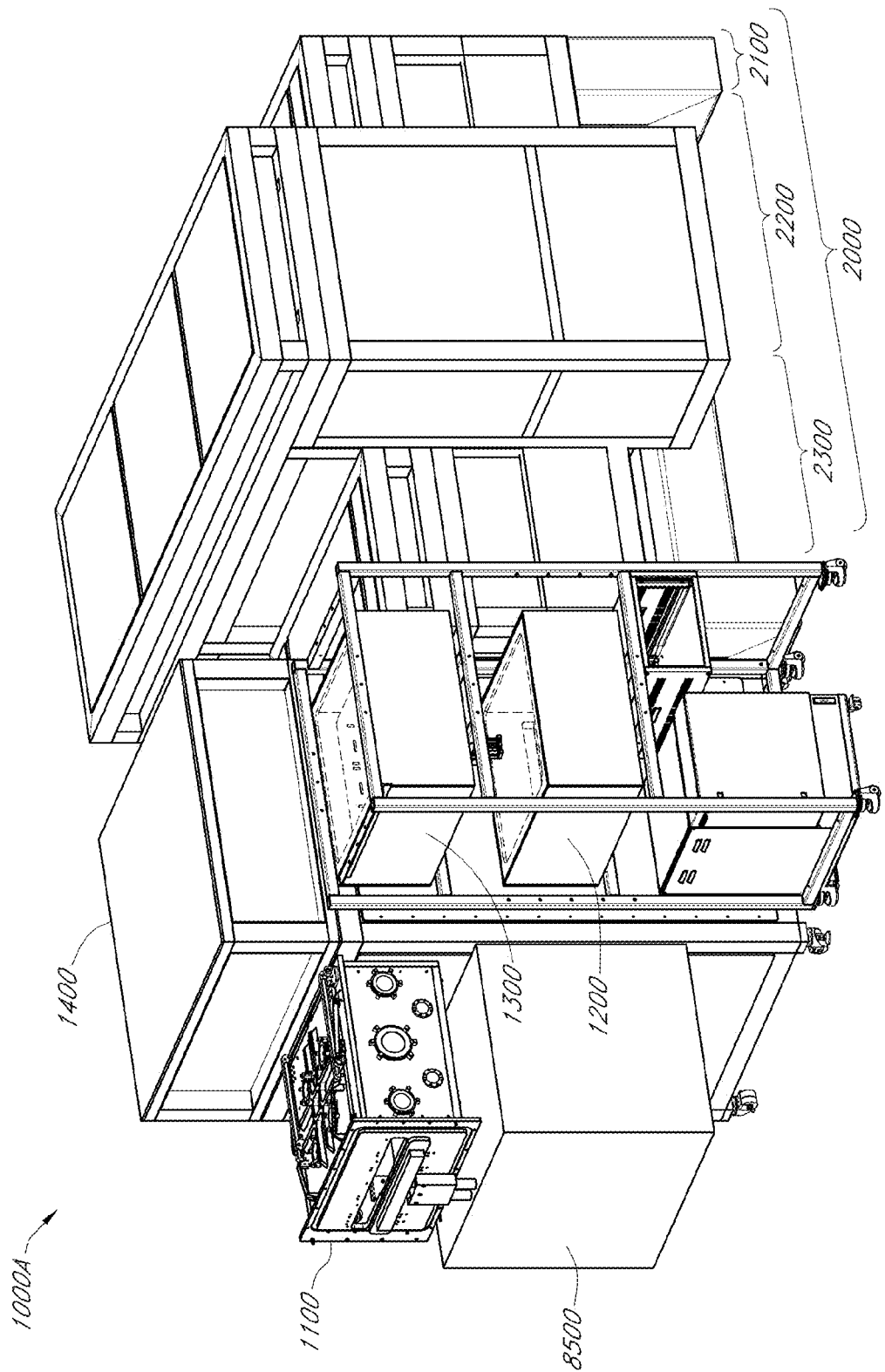
Figure 4A:
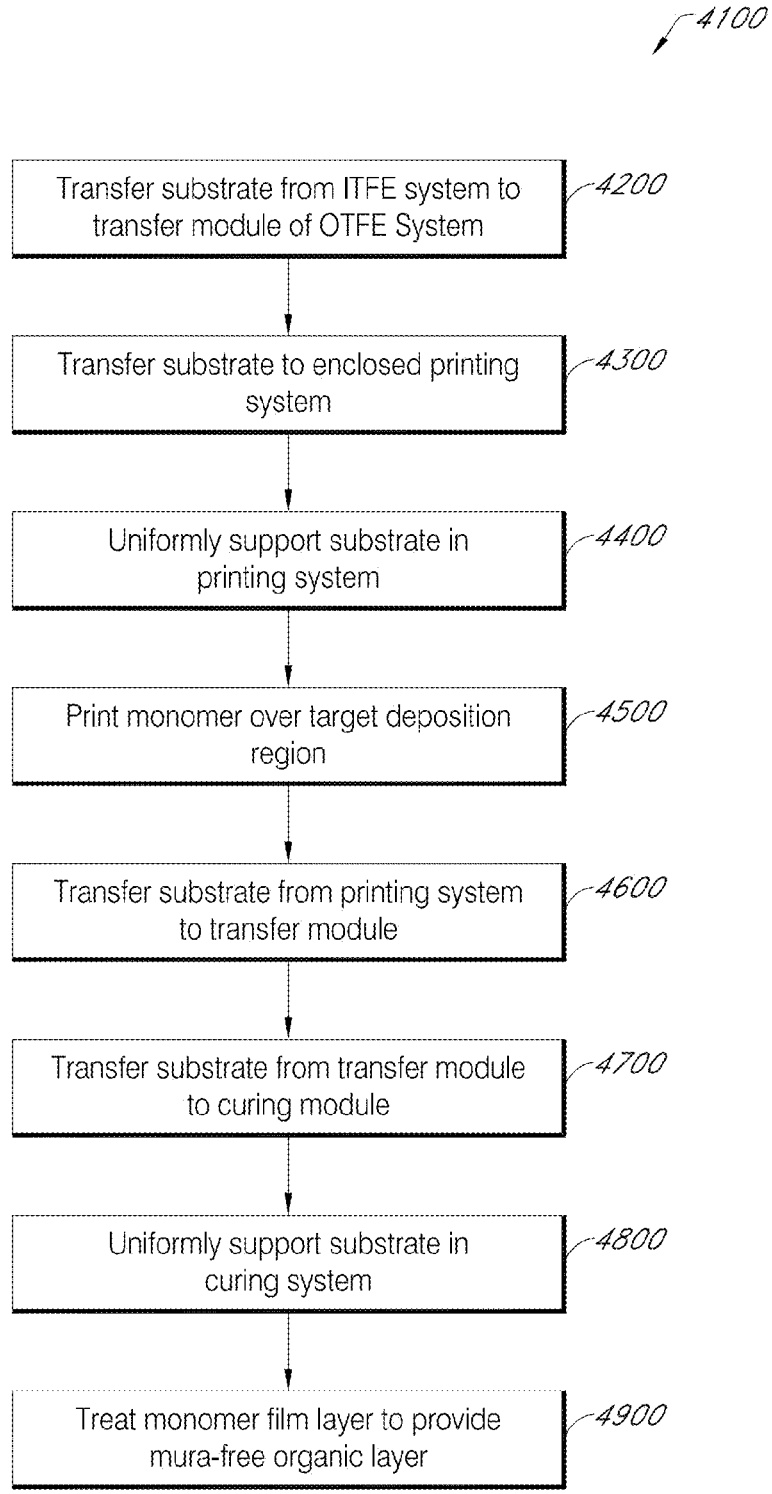
FIG. 4A and FIG. 4B illustrate techniques, such as methods, that can include forming an organic thin-film encapsulation layer (OTFEL) of a light emitting device (e.g., an OEL of an OLED device).
Figure 4B:
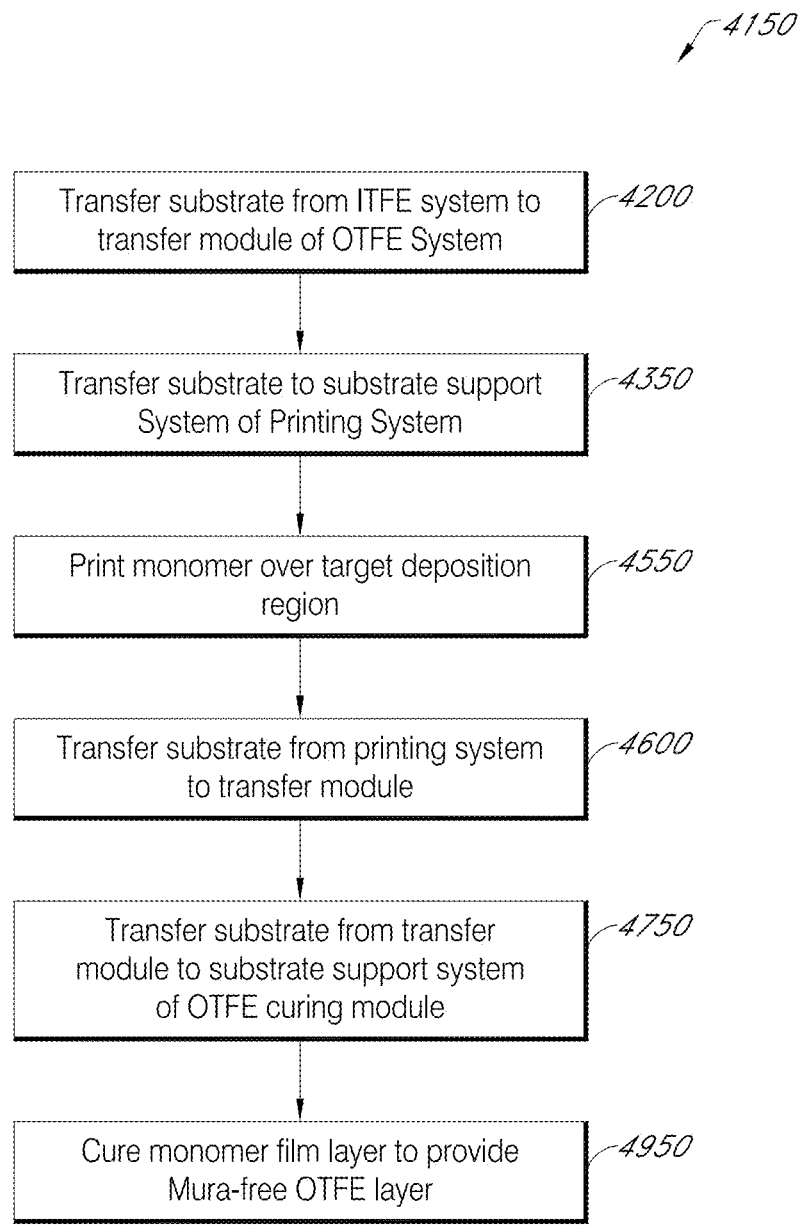

FIG. 1B and FIG. 1C illustrate generally illustrative example of front-facing and rear-facing isometric views of at least a portion of the system 1000A that can be used in manufacturing a light emitting device (e.g., an OLED device), such as for fabricating an OTFEL of an OLED device according to the techniques illustrated in FIG. 4A or 4B. The system 1000A can include a loading module 1100 for transfer of one or more substrates into or out of a controlled environment within one or more portions of the system 1000A, such as using a handler located in a transfer module 1400.

The system 1000A can include a printing system 2000, such as having a conveyor extending through a first region 2100, a printing region 2200, and second region 2300, similar to other printing system examples described herein. Substrates to be processed can be queued or can be held to provide a specified holding duration to allow flowing or dispersal of an organic material deposited upon the substrate by the printing system 2000. For example, one or more of a first module 1200, a second module 1300, or a third module 8500 can be used for holding one or more substrates before printing or after printing. The configuration of the one or more modules 1200, 1300, or 8500 can be specified at least in part using information about the substrate panel size.

As an illustrative example, for a configuration for organic encapsulation layer (OEL) fabrication for a Gen 3.5 substrate geometry or a ¼ Gen 5 substrate geometry, the first module 1200 can be used as an encapsulation layer holding module and a curing module, such as providing uniform support for the substrate using one or more of the techniques described elsewhere herein (e.g., using a gas cushion or otherwise uniformly supporting the substrate using uniform physical contact inside the "active" regions where light emitting devices are formed on the substrate). The inventors have recognized, among other things, that uniform support techniques described below including gas floatation (or alternatively uniform physical contact inside the "active" regions) during one or more of printing, holding, or curing operations can suppress or inhibit formation of visible non-uniformities (e.g., mura) in an OEL fabrication process.

Figure 21A:
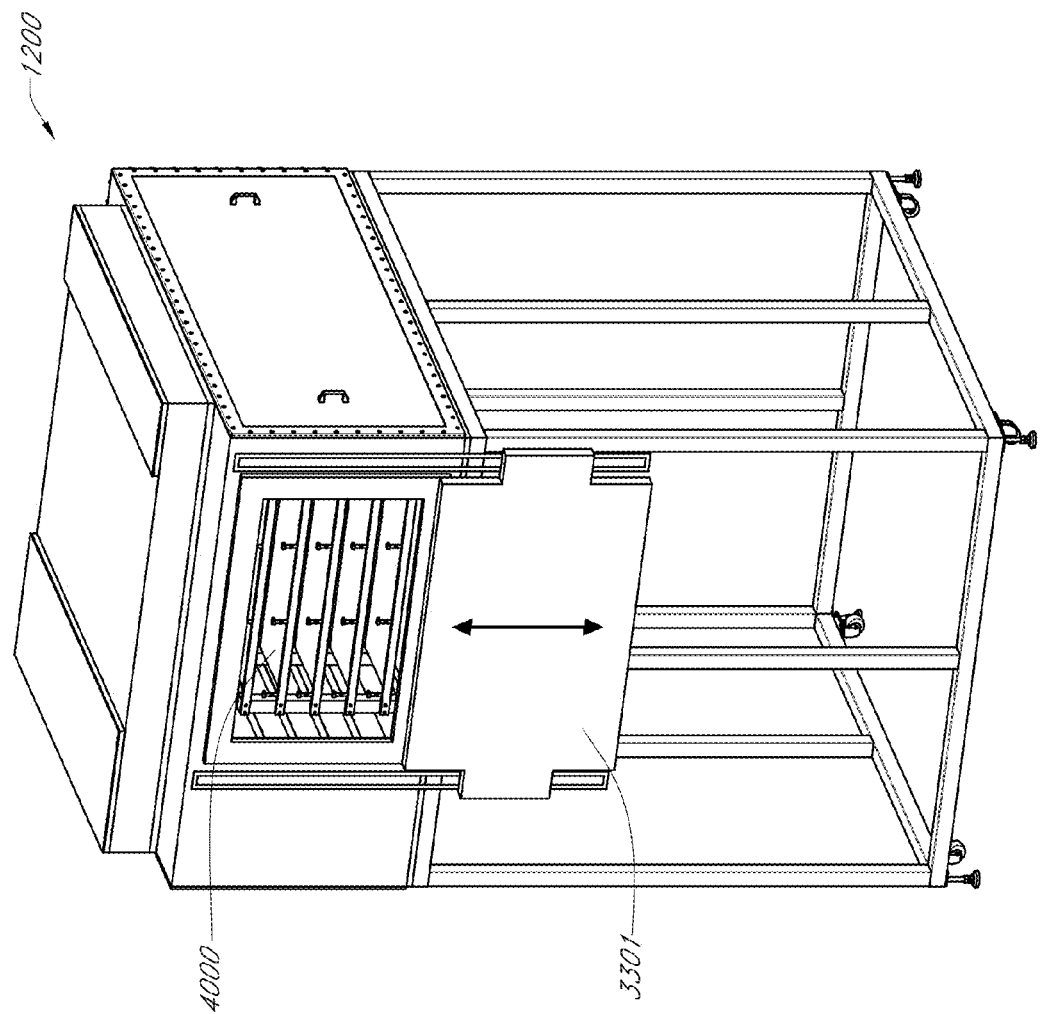
FIG. 21A and FIG. 21B illustrate generally views of a portion of a system, such as can include a stacked configuration of substrate processing areas that can be used in manufacturing an electronic device (e.g., an organic light emitting diode (OLED) device).
Figure 21B:
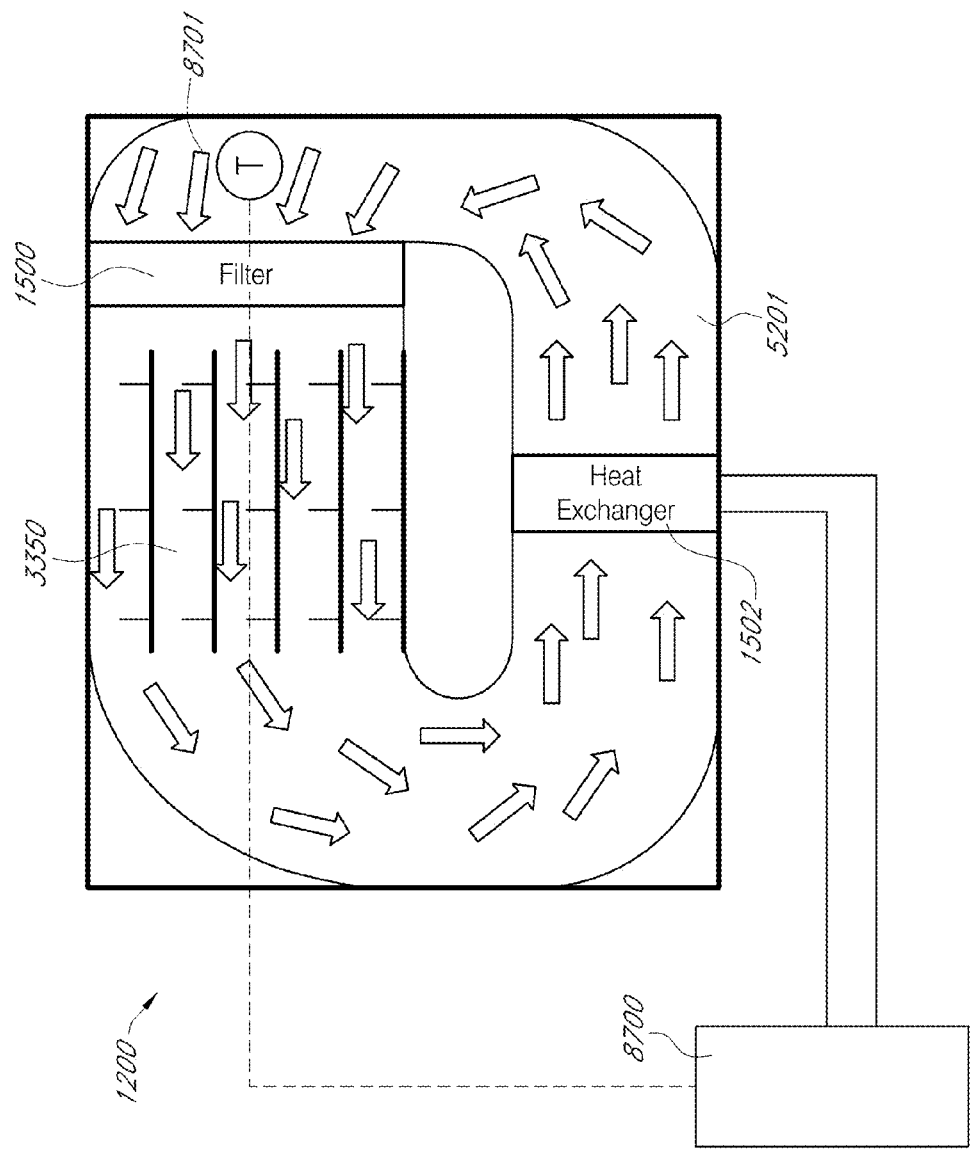

The second module 1300 can be used as a reorientation module. The reorientation module can provide a volume in which a handler can flip or rotate a substrate being fabricated. The third module 8500 can include a holding module such as to store substrates in environmentally-controlled regions in a stacked configuration such as shown illustratively in examples elsewhere herein (e.g., as shown in FIG. 21A or FIG. 21B). In another example, such as for a larger substrate geometry, the third processing module 8500 can be configured to provide a reorientation module, the first processing module 1200 can be configured to provide an encapsulation curing module, and the second processing module 1300 can be configured as a holding or buffering module having one or more environmentally-controlled regions. Other configurations can be used, such as shown illustratively in the examples of FIG. 2A or 2B, such as can be used with large panel geometries or to enhance throughput.

A controlled environment within one or more enclosed portions of the system can include specifications such as including one or more of (1) better than Class 10 particle control for particles greater than or equal to two micrometers in diameter, (2) less than 10 parts-per-million of each of water and oxygen or less than 1 part-per-million of each of water and oxygen, or (3) temperature control of the ambient gas environment to within plus or minus 2 degrees Celsius.

Figure 2B:
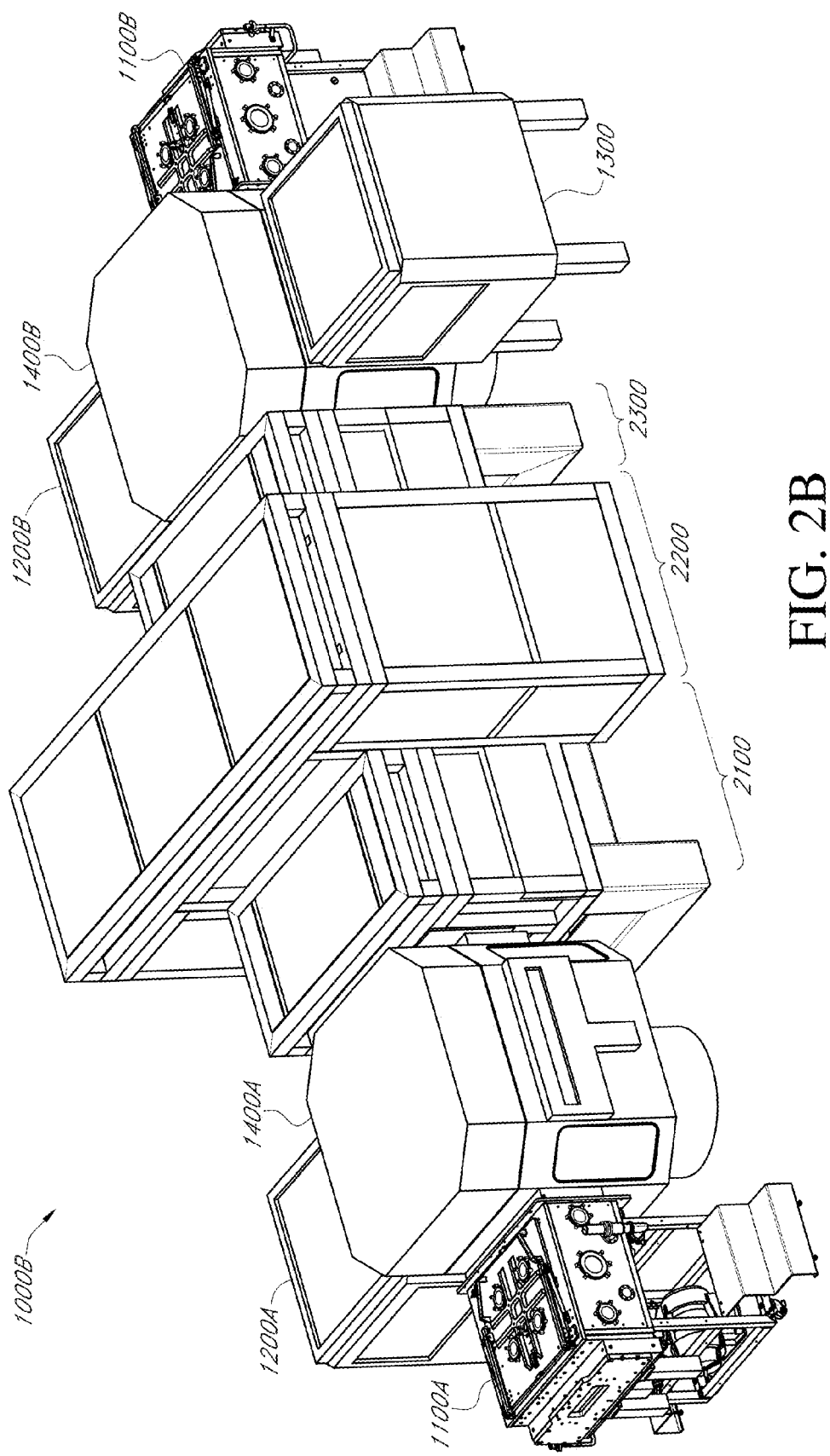
FIG. 2B illustrates generally an isometric view of at least a portion of a system that can be used in manufacturing a light emitting device (e.g., an OLED device).

While the illustrations of FIGS. 1A and 1B show a single processing module 1200 coupled to the transfer module 1400A, other configurations are possible. FIG. 2A illustrates generally an example of a plan view of at least a portion of a system 1000B, such as including a printing system 2000, first and second processing modules 1200A and 1200B, and a third processing module 1300, that can be used in manufacturing an electronic device (e.g., an organic light emitting diode (OLED) device) and FIG. 2B illustrates generally an illustrative example of an isometric view of at least a portion of the system 1000B.

The system 1000B can include first and second transfer modules 1400A and 1400B coupled to the printing system 2000. One or more other modules can be coupled to the printing system 2000, such as through the transfer module 1400A or the second transfer module 1400B. For example, the first processing module 1200A can be coupled to the first transfer module 1400A, and the second and third processing modules 1200E and 1300 can be coupled to the second transfer module 1400B.

The first, second, or third processing modules 1200A, 1200B, or 1300 can include a holding or buffer module, a curing module, or one or more other modules. One or more of the first, second, or third processing modules can include a stacked configuration, such as shown illustratively in the examples of FIG. 5, FIG. 21A, or FIG. 21B. In addition to simply holding substrates for the purpose of substrate flow management, such as holding a substrate for a period of time until another module is ready to receive it or providing a place to hold defective or damaged substrates until they can be removed, a holding or buffer module can also be used to hold substrates for a period of time as a part of a functional process flow.

For example, after a printing operation, the substrate can be held for in a holding module, such as to provide a specified duration for dispersal or flowing of an organic material printed upon the substrate, such as during a process for forming an organic encapsulation layer. Such a holding operation can have a specified duration. In another example, the substrate can be held (e.g., for a specified duration), in a curing module, such as before enabling ultraviolet or heat treatment of the substrate. Such timed holding operation can be performed to allow the substrate to evolve from one state to another. For example, after a printing operation in which a liquid material is deposited onto the substrate and prior to a curing operation to form a solid film, a timed holding operation having a specified duration may be used to allow the liquid to flow, settle, dry, or any combination of the three prior to fixing the film via a curing operation, such as a curing operation including thermal treatment or optical treatment.

The first, second, or third processing modules 1200A, 1200B, or 1300 can include a vacuum drying module, such as can accommodate a single substrate or multiple substrates, such as in a stacked configuration, as shown illustratively in FIG. 21A or FIG. 21B. Such a vacuum drying module can provide for the drying (at pressures below ambient pressures) of a liquid material, such as can be deposited onto the substrate via printing. In an example, the system 1000B can include both a holding module providing various functions as described above and a separate vacuum drying module. Alternatively (or in addition), the system 1000E can include a holding module configured to provide holding or buffering at ambient pressure, or at about ambient pressure during certain durations, and to provide vacuum drying during other durations.

The system 1000B can be enclosed, such as having an controlled processing environment. Such a controlled processing environment can be established to remain below specified limits of one or more of particulate contamination level, water vapor content, oxygen content, and organic vapor content. For example, the controlled processing environment can include nitrogen or another gas or mixture of gases specified for minimal or no reactivity with a species deposited on a substrate being processed using the system 1000B. As described in other examples below, such a controlled processing environment can be established at least in part using a gas purification system include within or coupled to various portions of the system 1000S (e.g., as shown in FIG. 17, FIG. 18A, FIG. 18B, FIG. 19A, FIG. 19B, or FIG. 19C). A particulate level of the controlled environment can also be controlled, such as using apparatus coupled to the system 1000E or located within one or more modules of the system 1000B, as shown and described in other examples herein.

As an illustrative example, one or more of the first, second, or third processing modules 1200A, 1200B, or 1200C, the printing system 2000, or the transfer module 1400A, can include an controlled environment established by a shared gas purification facility, a single dedicated gas purification facility, or multiple dedicated gas purification facilities individually associated with different portions of the system 1000B. For example, various modules can include gates or valving such as to be controllably isolated from other portions of the system 1000B to allow various operations as might be performed during nominal system operation or during maintenance, without requiring an entirety of the controlled environment of the system 1000E to be purged or otherwise contaminated.

The system 1000B can include one or more loading modules, such as one or more of a first loading module 1100A or a second loading module 1100B, such as to provide a point-of-entry or point-of-exit for one or more substrates being fabricated. The first or second loading modules 1100A or 1100E can be fixed or removable, such as directly coupling the system 1000E to other apparatus in a manufacturing line, or even providing a removable assembly that can be transported to or from other apparatus. For example, one or more of the first or second loading modules 1100A or 1100E can be configured to transfer the substrate to or from an environment different from the environment within the system 1000B.

For example, the first loading module 1100A or second loading module 1100E can be coupled to a vacuum source, or a purge source, or both, and can be configured for independently sealing the interface port to system 1000E and the interface port to the prior or next environment (which could be the ambient environment or a controlled environment associated with another enclosed processing module). In this manner, the first or second loading modules 1100A or 1100E can internally seal itself and transition the internal environment of the loading modules 1100A or 1100E between one that is not compatible with system 1000E to one that is compatible with system 1000E (e.g., a controlled environment at about atmospheric pressure or above atmospheric pressure that when exposed to system 1000E via the interface port would substantially maintain the quality of the controlled environment in system 1000B). Similarly, the first loading module 1100A or second loading module 1100B can be used to transfer the substrate to an environment suitable for other processing (e.g., a second environment at or near atmospheric pressure but having a different composition than the controlled environment, or a vacuum environment). In this manner, the first or second loading modules 1100A or 1100E can provide a transfer conduit between the controlled environment of the system 1000B and other apparatus.

As mentioned above, the first loading module 1100A or the second loading module 1100E can include a permanently-attached configuration, or a cart or other transportable configuration. A substrate being fabricated can be placed within one of the loading modules 1100A or 1100E through a port, such as using a handler located within the system 1000B, or using one or more handlers located elsewhere, such as a first handler (e.g., a robot) located within the first transfer module 1400A or elsewhere, or a second handler located within the second transfer module 1400E or elsewhere.

In an example, a loading module (e.g., the first loading module 1100A or the second loading module 1100B) can then be provided with a non-reactive atmosphere or otherwise "charged" using a purified gas stream, such as including one or more purge operations, to prepare an interior region of the loading module (e.g., the first loading module 1100A or the second loading module 1100B) for exposure to interior portions of the enclosed system 1000B. For example, an internal region of one or more of the first or second loading modules can be at least partially evacuated or purged in order to avoid contamination in a manner exceeding the specified limits of particulate contamination level, water vapor content, oxygen content, ozone content, and organic vapor content of the controlled processing environment within an enclosed region defined by other portions of the system 1000B.

Similarly, after processing by the system 1000B, a substrate being processed can be placed in the first or second loading modules 1100A or 1100B. As an illustration, the loading module (e.g., the first loading module 1100A or the second loading module 1100B) can be isolated from a non-reactive gas environment elsewhere in the system 1000B, such as coupled to a vacuum source to be evacuated for subsequent processing under vacuum conditions, or otherwise for transport of the substrate being fabricated to other apparatus or processing under vacuum conditions, ambient conditions or some other static controlled environment. As a further illustration, one of the first or second loading modules 1100A or 1100E can be configured to provide the substrate to the controlled processing environment within the system 1000E without raising a concentration of a reactive species by more than, for example, 1000 parts per million within the enclosed region or similarly, without raising the ambient particle levels by more than a specified amount, or without depositing more than a specified number of particles of specified size per square meter of substrate area onto the substrate.

In an example, the first loading module 1100A can be coupled to the transfer module 1400A by a port (e.g., including a physical gate having a substantially gas impermeable seal) or gas curtain. When the port is opened, an interior of the first loading module 1100A can be accessed by a handler located in the first transfer module 1400A. The handler can include a robotic assembly having various degrees of freedom, such as to manipulate a substrate using an end effector. Such an end effector can include a tray or frame configured to support the substrate by gravity, or the end effector can securely grasp, clamp, or otherwise retain the substrate, such as to allow reorientation of the substrate from a face-up or face-down configuration to one or more other configurations. Other end effector configurations can be used, such as including pneumatic or vacuum-operated features to either actuate portions of the end effector or otherwise retain the substrate. Further illustrative examples of transfer modules including handlers, and various end effector configurations are described below.

In aggregate, the system 1000B can be operated in so-called "cluster" and "linear" (or "in-line") modes, these two operating modes being mainly differentiated by the flow of a substrate in from and then back to the same chamber in the "cluster" mode and the flow of a substrate in from one chamber and out to a different chamber in the "linear" or "in-line" mode. The subject matter described herein can be included or used in both "cluster" and "linear" or "in-line" configurations.

Figure 19A:
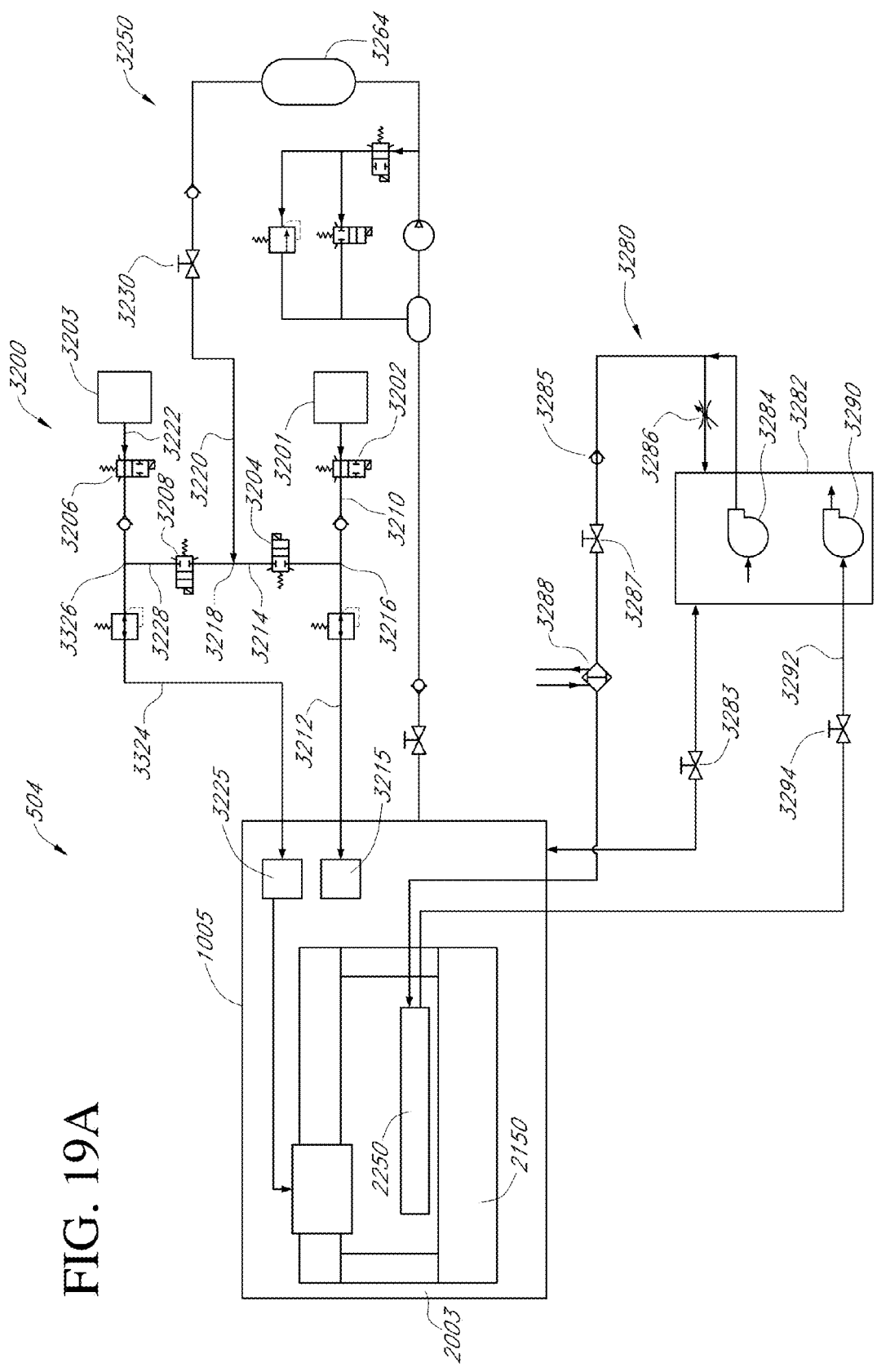
FIGS. 19A and 19B illustrate generally examples of a gas enclosure system for integrating and controlling non-reactive gas and clean dry air (CDA) sources such as can be used to establish the controlled environment referred to in other examples described elsewhere herein, and such as can include a blower loop to provide, for example, pressurized gas and at least partial vacuum for use with a floatation table.
Figure 19B:
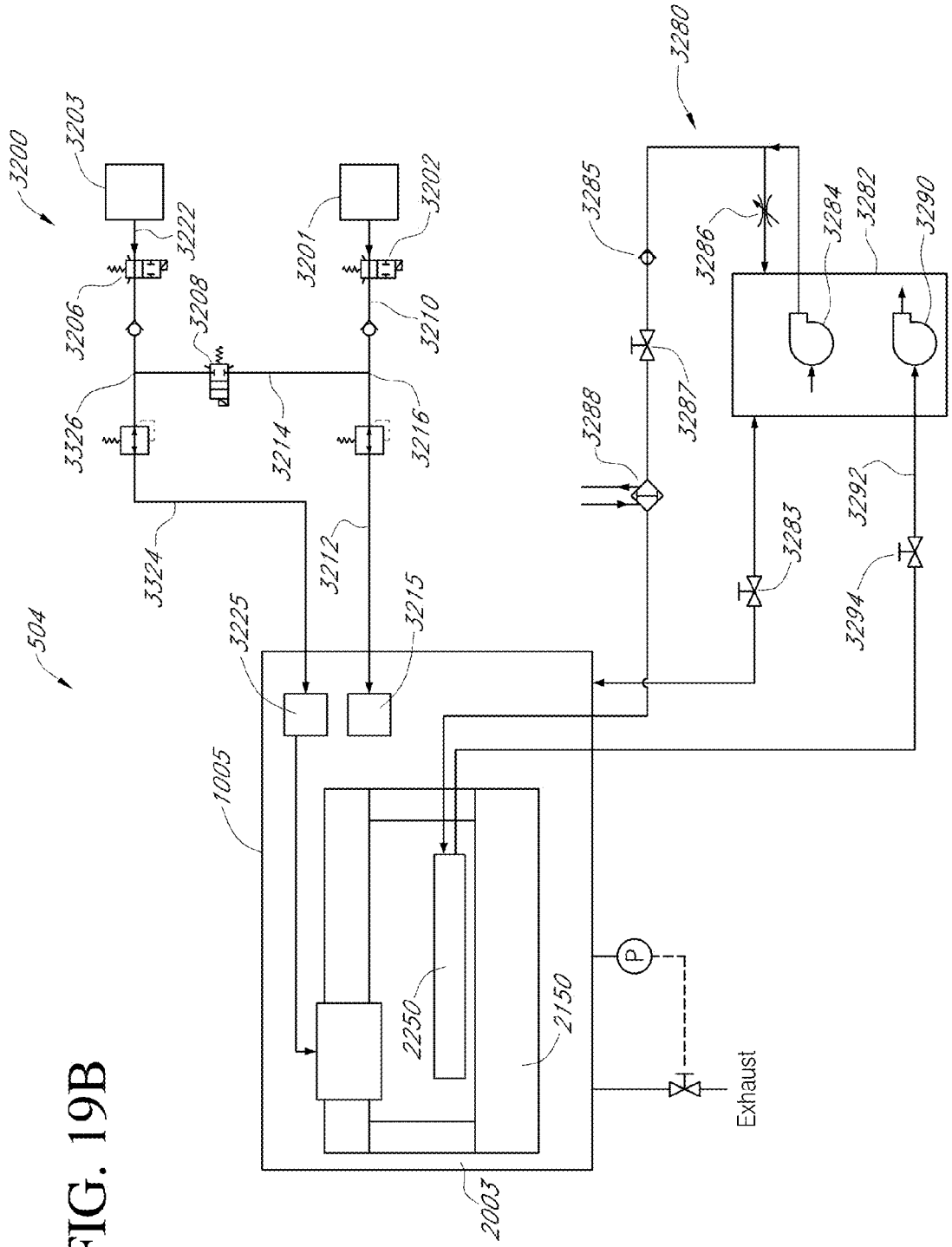
Figure 19C:
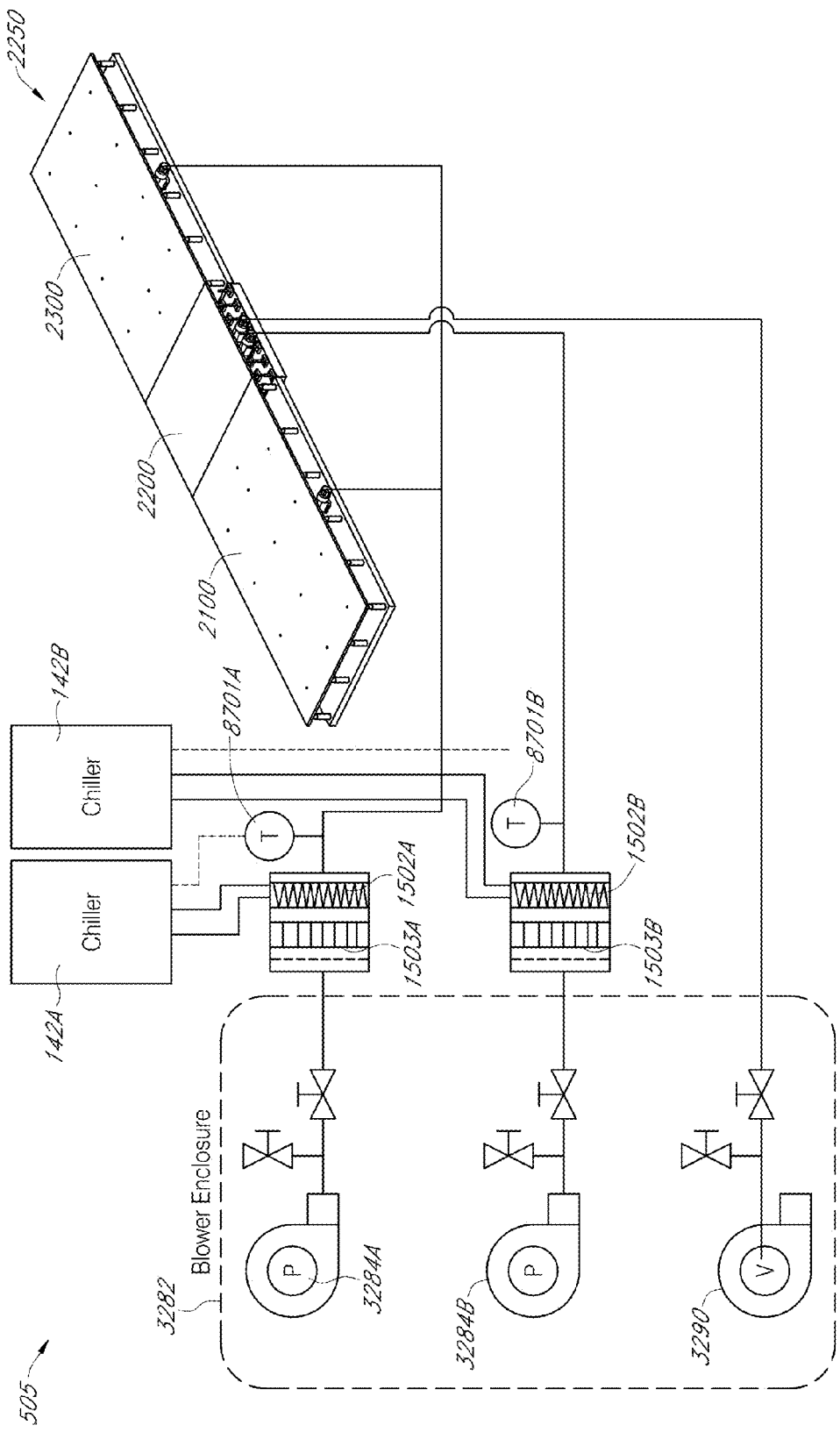
FIG. 19C illustrates generally a further example of a system for integrating and controlling one or more gas or air sources, such as to establish floatation control zones included as a portion of a floatation conveyance system.

In an example, the first transfer module 1400A can position a substrate to be located in an input enclosure region 2100 of a printing system, such as located on a conveyor. The conveyor can position the substrate at a specified location within the printing module such as using one or more of physical mechanical contact or using gas cushion to controllably float the substrate (e.g., an "air bearing" table configuration). An illustrative example of floatation control zones, such as can be included for floatation-type conveyance is illustrated in FIG. 19C.

A printer region 2200 of the system 1000E can be used to controllably deposit one or more film layers on the substrate during fabrication. The printer region 2200 can also be coupled to an output enclosure region 2300 of the printing module. The conveyor can extend along the input enclosure region 2100, the printer region 2200, and the output enclosure region 2300 of the printing module, and the substrate 4000 can be repositioned as desired for various deposition tasks, or during a single deposition operation. The controlled environments within the input enclosure region 2100, the printer region 2200, and the output enclosure region 2300 can be commonly-shared.

The printer region 2200 can include one or more print heads, e.g. nozzle printing, thermal jet or ink-jet type, coupled to or otherwise traversing an overhead carriage, such as configured to deposit one or more film layers on the substrate in a "face up" configuration of the substrate. Such layers can include one or more of an electron injection or transport layer, a hole injection or transport layer, a blocking layer, or an emission layer, for example. Such materials can provide one or more electrically functional layers. Other materials can be deposited using printing techniques, such as a monomer or polymer material, as described in other examples described herein, such as for providing one or more encapsulation layers for a substrate being fabricated.

After deposition of one or more layers onto the substrate 4000, the system 1000 can include a second transfer module 1400B, such as including a second handler 1410B that can be similar to the first handler 1410A. The substrate 4000 can be manipulated by the second handler 1410B, such as accessed using the output enclosure region 2300 of the printing module. The second handler 1410E can be isolated from the printing module, such as using a gate or other arrangement. A second processing module 1300, such as having an controlled environment, can be coupled to the second transfer module 1400B, such as to provide a buffer having one or more environmentally-controlled regions, or to provide one or more other capabilities supporting fabrication. The system can include a second loading module 1100B, such as similar to the first loading module 1100A. The second loading module can be used to transfer substrates out of the system 1000, such as after one or more deposition operations involving the printing module, or after other processing.

According to various examples, the first or second processing modules 1200 or 1300 can provide other processing, such as for drying or solvent evaporation. Other examples can include ultraviolet exposure, substrate holding (e.g., to facilitate material flow or dispersal after printing and before curing, so as to achieve a more planar or uniform coating), reorientation (e.g., to rotate the substrate 4000), holding, or buffering (e.g., storage of substrates in-process in a controlled environment such as in a queued fashion).

Use of a gas cushion arrangement to uniformly support the substrate during one or more of printing or other processing operations such as substrate holding (e.g., to facilitate material flow or dispersal) or film curing can reduce or suppress formation of visible defects (e.g., "mura") in active regions of the substrate. For example, such active regions can be defined as portions of the area of the substrate where light emitting electronic devices are being fabricated or encapsulated.

Figure 3A:
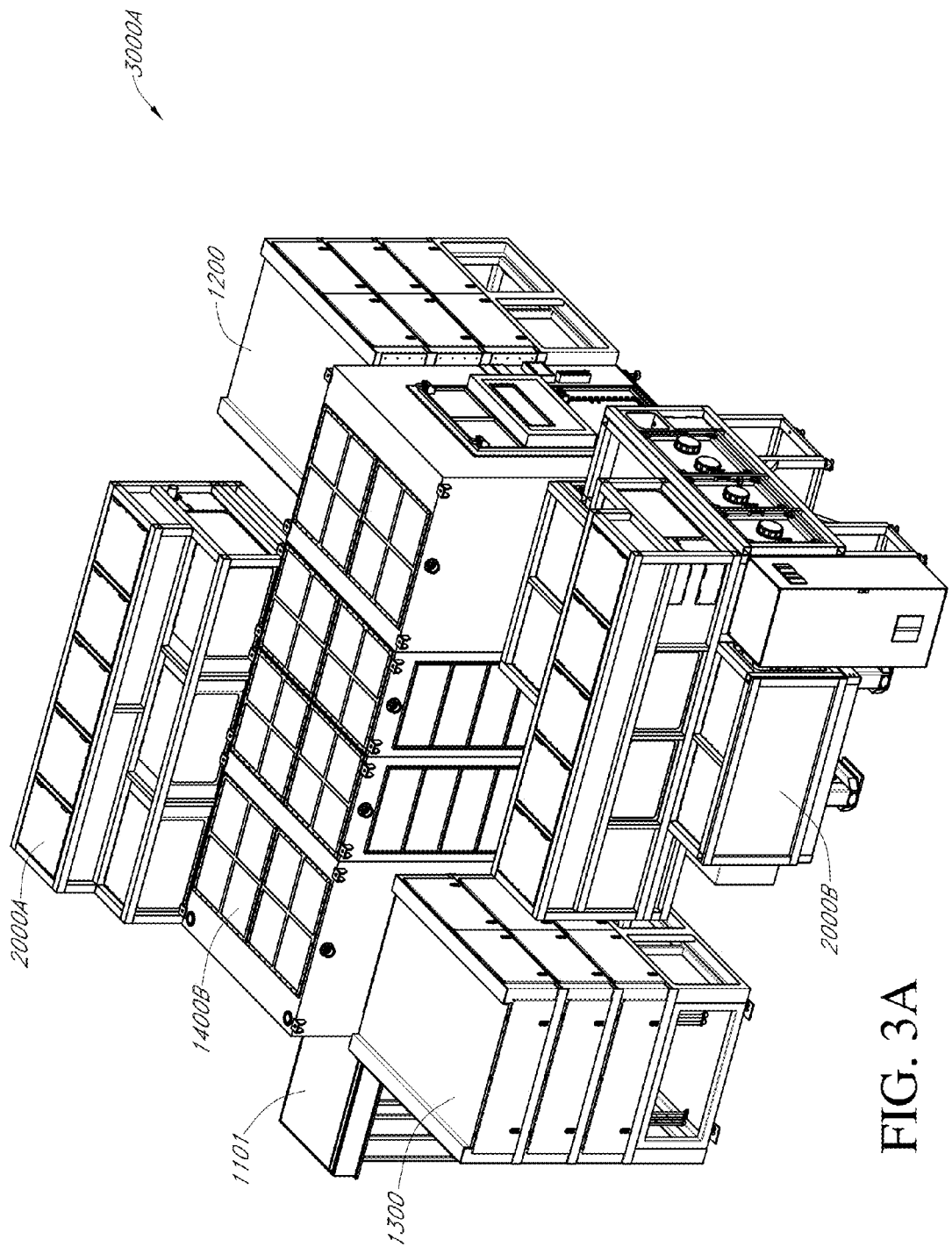
FIG. 3A illustrates generally an isometric view of at least a portion of a system, such as including a printing system and other modules.
Figure 3B:
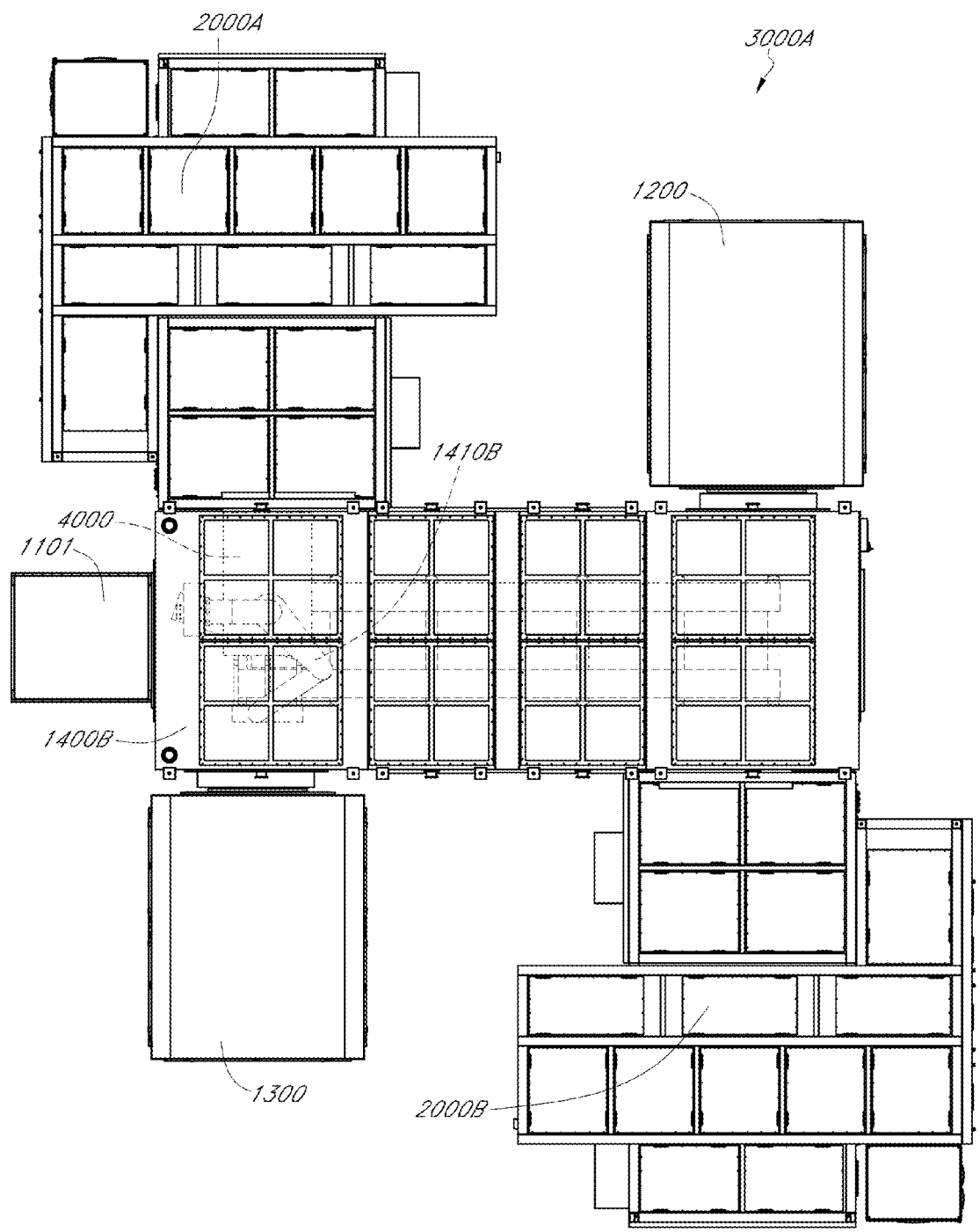
FIG. 3B illustrates generally a plan view of at least a portion of a system, such as can include a printing system and other modules.

FIG. 3A illustrates generally an isometric view and FIG. 3B illustrates generally a plan view of at least a portion of a system 3000A, such as including a first printing system 2000A, a second printing system 2000B, and other modules, that can be used in manufacturing an electronic device (e.g., an organic light emitting diode (OLED) device).

The system 3000A can include a first printing system 2000A, such as a printing system as described in relation to other examples herein. In order to provide one or more of increased throughput, redundancy, or multiple processing operations, other printing systems can be included, such as a second printing system 2000B. The system 3000A can also include one or more other modules, such as first processing module 1200 or a second processing module 1300.

As mentioned above, the first or second processing modules 1200 or 1300 can be used for one or more of holding a substrate (e.g., to facilitate flowing or dispersing the deposited material layer, such as to achieve a more planar or uniform film) or curing (e.g. via UV light illumination) a layer of material, such as deposited by one or more of the first or second printing modules 2000A or 2000B. For example, as described elsewhere herein, a material layer that flows or disperses, or is cured, using the first or second processing modules 1200 or 1300 can include a portion of an encapsulation layer (such as a thin film layer comprising an organic encapsulant cured or treated via exposure to ultraviolet light). The first or second processing modules 1200 or 1300 can be configured for holding substrates as described above, such as in a stacked configuration. Processing module 1300 could alternatively (or additionally) be configured for vacuum drying one or more substrates, such as in a stacked configuration. In the case that one or more of the first or second processing modules 1200 or 1300 function as a vacuum drying module for more than one substrate at a time, the stacked configuration can include multiple drying slots in a single chamber or a stack of isolated chambers, each having a single drying slot. In yet another configuration, one or more of the first or second processing modules 1200 or 1300 can be configured for holding substrates and another processing module can be provided attached to transfer module 1400A for vacuum drying one or more substrates. The first and second printers 2000A and 2000B can be used, for example, to deposit the same layers on the substrate or printers 2000A and 2000E can be used to deposit different layers on the substrate.

The system 3000A can include a input or output module 1101 (e.g., a "loading module"), such as can be used as a load-lock or otherwise in a manner that allows transfer of a substrate 4000 into or out of an interior of one or more chambers of the system 3000A in a manner that substantially avoids disruption of a controlled environment maintained within one or more enclosures of the system 3000A. For example, in relation to FIG. 3A and other examples described herein, "substantially avoids disruption" can refer to avoiding raising a concentration of a reactive species by a specified amount, such as avoiding raising such a species by more than 10 parts per million, 100 parts per million, or 1000 parts per million within the one or more enclosures during or after a transfer operation of a substrate 4000 into or out the one or more enclosures. A transfer module 1400B, such as can include a handler 1410B, can be used to manipulate the substrate 4000 before, during, or after various operations. An example of a configuration that can be used for the transfer module 14008 is shown illustratively in FIGS. 22A and 22B. One or more additional handlers can be included, such as to provide a substrate to the input or output module 1101 or receive a substrate from the input or output module 1101.

Figure 3C:
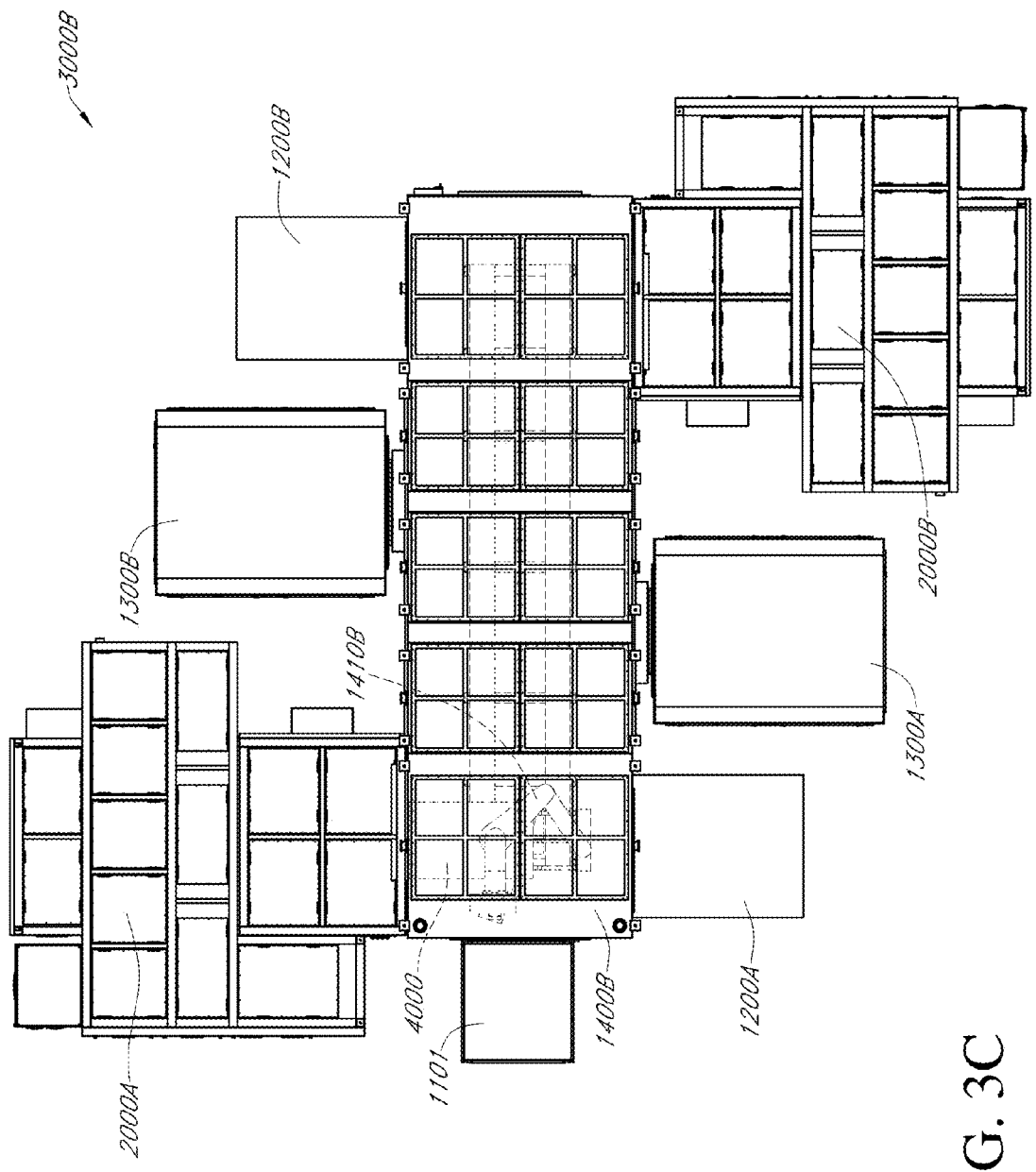
FIG. 3C illustrates generally a further example of a plan view of at least a portion of a system, such as can include a printing system and other modules.
Figure 7A:
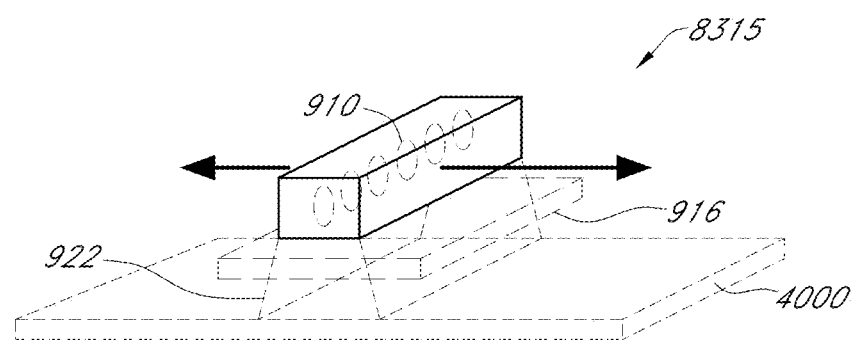
FIG. 7A and FIG. 7B illustrate generally examples of at least a portion of an ultraviolet treatment system that can include a linear configuration of ultraviolet sources, such as can be used in manufacturing a light emitting device.
Figure 7B:
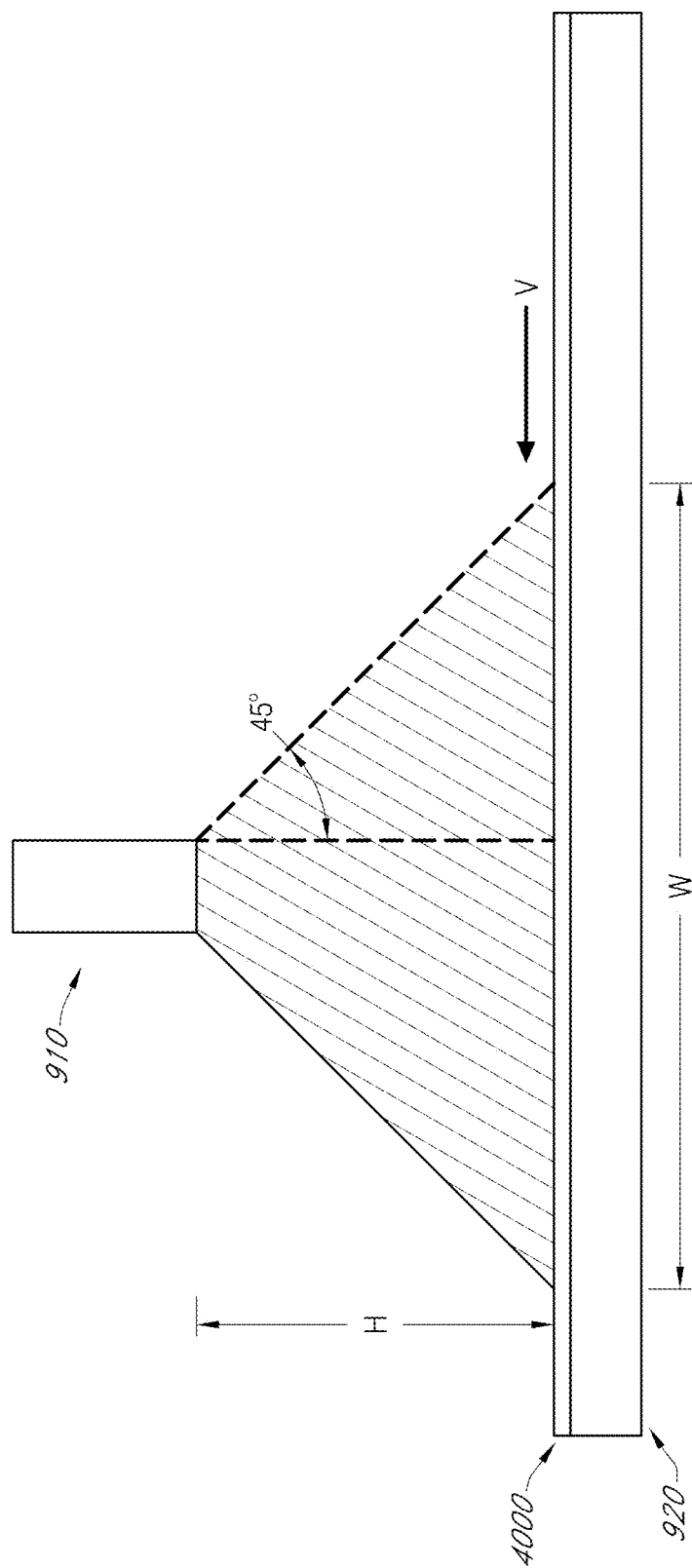

FIG. 3C illustrates generally a further example of a plan view of at least a portion of a system 3000B, such as can be used in manufacturing an electronic device (e.g., an organic light emitting diode (OLED) device). In FIG. 7C, first and second printing systems 2000A and 20008 can be arranged similarly to the example of FIGS. 7A, 7B (e.g., for depositing different or similar layers on a substrate). The system 30008 can be extended as compared with the example of system 3000A, such as including first and second processing modules 1200A and 1200B, and third and fourth processing modules 1300A and 1300B. As an illustrative example, the processing modules 1200A, 1200B, 1300A, or 1300E can include curing modules configured to provide ultraviolet treatment or can be configured to hold one or more substrates for any of the holding functions described elsewhere. Other arrangements are possible. For example, the examples of FIGS. 3A, 3B, and 3C illustrate generally a configuration that can include two printing systems 2000A and 2000B, but more than two printing systems can be included. Similarly, additional (or fewer) processing modules can be included.

FIG. 4A and FIG. 4B illustrate techniques, such as methods, that can include forming an organic thin-film encapsulation layer (OTFEL) of a light emitting device (e.g., an OEL of an OLED device). In the example 4100 of FIG. 4A, at 4200, as substrate can be transferred from an inorganic thin film encapsulation system to a transfer chamber of an organic thin film encapsulation (OTFE) system, such as a system as shown and described in relation to other examples herein. The substrate can be transferred from an environment different from a controlled environment of the transfer module, such as using loading module (e.g., "load lock"). At 4300, the substrate can be transferred to an enclosed printing system, such as at least in part using a handler robot located within the transfer module or within the enclosed printing system. At 4400, the substrate can be uniformly supported in the printing system, such as using techniques and apparatus to reduce or inhibit formation of visible defects or "mura" during printing operations or other operations.

For example, such support can include a chuck configuration (e.g., a planar chuck or tray) such as configured to provide uniform physical contact in areas of the substrate upon or opposite regions of the substrate where active devices such as light emitting electronic devices have been formed. This, however, can present a variety of challenges because generally-available chucks generally provide holes in central regions of the substrate through which lift pins can raise and lower the substrate, so as to facilitate loading and unloading operations. These holes can represent regions of non-uniform physical contact with the substrate. In the example of a vacuum chuck, there can also be grooves or holes through which the vacuum suction is provided that holds the substrate in place, and generally some of such groove or hole features are located in the central region of the substrate to achieve desired hold-down performance.

The present inventors have recognized, among other things, that a support chuck (or other portion of the system supporting the substrate), can be configured so as to position chuck features to minimize or eliminate their impact on the target coating pattern. In an example, the chuck can further provide non-uniform physical contact to certain areas of the substrate upon or opposite regions of the substrate outside where active devices such as light emitting electronic devices have been formed, or where active devices such as light emitting devices have been formed but which do not have a strict uniformity requirement for example, devices that will only be used for testing or which are manufactured and sold as second grade product. In this example, light emitting electronic devices are used as just one illustrative example, but the same support structure configurations can be applied to any active electronic, optical, or optoelectronic devices, wherein the active region can represent a region within which the devices being encapsulated are located.

The approach mentioned above to physically supporting the substrate in non-active areas has the benefit of being simple and relatively low cost, it does suffer from a drawback that in most instances such an approach includes portions of the center region of the substrate that are restricted from use for top quality uniform coatings, thereby reducing an effective productivity of the system. The present inventors have also recognized that such a drawback can be addressed by using a distributed vacuum region instead of individual vacuum grooves or holes, such as a continuous porous medium through which vacuum suction is provided. Remaining holes in the chuck associated with the lift pins can be restricted to one or more of a periphery of the substrate or a periphery of active regions (including regions opposite a surface defining a periphery of the substrate or a periphery of active regions of the substrate).

Alternatively, for example, the present inventors have also recognized, among other things, that the substrate can be uniformly supported at least in part using a gas cushion, such as during one or more of a printing operation or other processing such as before or during ultraviolet treatment in a curing module. Use of such a gas cushion can enhance uniformity of a coating or film layer on the substrate. For example, by floating the substrate above a physical substrate support surface, the substrate sees a uniform gas in all of the supported regions and is relatively less sensitive to the presence of holes for lift pins or other localized features that may be present on physical substrate support surface. In such a floating support example, lift pins in the center region of the substrate can be incorporated into the support mechanism without affecting film uniformity in those areas because the substrate is not in physical contact with extended or retracted lift pins and is supported by a gas cushion in the center region during processing such as printing, holding, or curing. In addition, or instead, the substrate can be further uniformly supported or retained by physical contact restricted to regions outside such active regions, such as in one or more of the substrate periphery or a periphery between active regions. In this way, all of the substrate area can offer a highly uniform coating and can be used productively, except, potentially, for an exclusion zone at the substrate edge where the substrate is physically contacted so as to constraint or hold it in place in the floatation plane.

At 4500, an organic material such as a monomer can be printed in a target deposition region of the substrate, such as including a monomer to form an organic encapsulation layer. The phrase "deposition region" generally refers to the region where the organic encapsulation layer is being formed. At 4600, the substrate can be transferred from the printing system to the transfer module. In an example, the substrate is retained in the enclosed printing system for a specified holding duration after printing to allow flowing or dispersal of an organic material deposited upon the substrate by the printing system. At 4700, the substrate can be transferred from the transfer module to a curing module.

At 4800, the substrate can be supported in the curing system, such as uniformly supported in one or more specified regions. The manner of supporting the substrate can be similar to or different from the substrate support technique used during the printing operation at 4500. However, generally, the substrate support can again provide uniform support, such as via uniform physical contact (e.g., a vacuum chuck such as providing a distributed vacuum region) or gas floatation, within those active areas to be uniformly coated, during printing, curing, or holding operations (e.g., during which a material flows or disperses prior to curing). For example, a chuck configured to support the substrate at least in part using a gas cushion. The curing module can be configured to treat the printed organic material at 4900, such as to provide a mura-free OTFE layer. For example, the curing module can be configured to provide optical treatment, such as an ultraviolet light treatment, to a printed monomer layer to polymerize or otherwise cure the monomer layer.

FIG. 4B illustrates another example 4150, such as for providing a mura-free OTFE layer. At 4200, as in the example of FIG. 4A, a substrate can be transferred from an ITFE system to a transfer chamber of an OTFE system. At 4350, the substrate can be transferred to a substrate support system of a printing system, such as to provide uniform support of the substrate at least in one or more active regions of the substrate. Such a substrate support system can include apparatus or techniques as mentioned above to help suppress or inhibit mura formation during one or more operations such as printing or holding (e.g., prior to curing so as to facilitate the dispersal or flow of the deposited material). For example, the substrate support system can include a floatation table configuration, such as having various floatation control zones including one or more of a pneumatically-supplied gas cushion, or a combination of pneumatic and at least partial vacuum supplied regions to provide a gas cushion supporting the substrate. In another example, a distributed vacuum region can be used such as to provide uniform support of the substrate at least in one or more active regions of the substrate. At 4550, a monomer can be printed over a target deposition region.

At 4600, the substrate can be transferred from the printing system to the transfer chamber, such as using a handler located in the transfer chamber, as mentioned above in relation to FIG. 4A. At 4750, the substrate can be transferred from the transfer chamber to a substrate support system of an OTFE curing module. The substrate support system can include a chuck configured to support the substrate in a manner that can suppress or inhibit mura formation during one or more of a holding operation or curing operation. For example, as described in other examples, the substrate can be held for a specified duration after printing and before treatment by the curing module, such as before ultraviolet treatment. At 4950, the monomer layer can be cured such as using an ultraviolet treatment provided by the curing module, such as to provide a mura-free OTFE layer.

The substrate support techniques mentioned in relation to FIGS. 4A and 4B are generally referred to in the context of the curing module or printing system. However, such techniques can also be used such as in relation to an end effector configuration for a handler robot configured to manipulate the substrate. For example, a handler robot can include an end effector configuration such as to provide support for a substrate while avoiding non-uniform direct physical contact with active regions on a first side of the substrate, or corresponding portions of a second side of the substrate opposite the first side.

Figure 5:
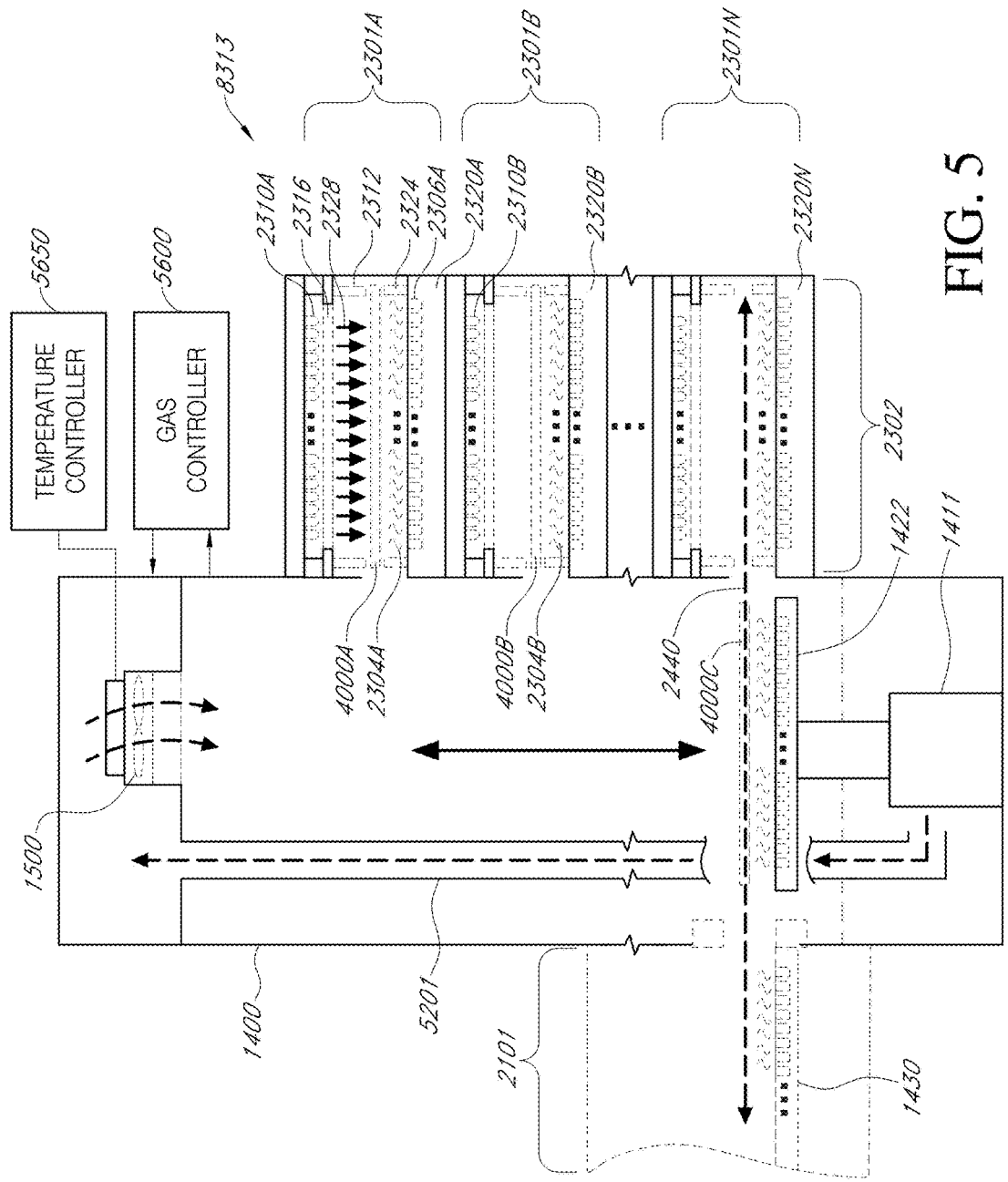
FIG. 5 illustrates generally an example of a diagram illustrating a portion of an ultraviolet treatment system that can be used in manufacturing a light emitting device.

FIG. 5 illustrates generally an example of a diagram illustrating a portion of an ultraviolet treatment system that can be used in manufacturing a light emitting device. The example of FIG. 5 can include apparatus or can include using techniques that can be combined other examples herein, such as those described above (e.g., to provide an organic encapsulation layer fabrication system or other system for performing processing of substrates, such as substrates including one or more OLED devices). The system of FIG. 5 can include an enclosure having a controlled environment, such as a non-reactive gas environment, such as including a transfer module 1400. The transfer module can include a handler 1411, such as coupled to an end effector 1422 to manipulate one or more substrates such as a first substrate 4000A, second substrate 4000B, or third substrate 4000C. As an illustrative example, the system can include a curing module 2302. The curing module can also be used for providing holding of substrates, such as to facilitate an evolution of a substrate from one processing state to another (e.g., for dispersal or flowing of the deposited material), or to provide buffering for queuing of substrates. Additionally, or alternatively, other processing modules can providing holding or buffering capabilities. The environmentally-controlled regions can include one or more of a specified gas purity, temperature, or particulate level.

Gas within various regions of the example of FIG. 5 can be circulated laterally across a surface of a substrate such as to provide a substantially laminar flow profile. Additionally, or instead, one or more fan filter units (FFUs) such as an FFU 1500 can provide a top-down flow profile, such as recovering gas through one or more ducts such as a duct 5201. As in other examples, a temperature controller 5650 can be coupled to one or more other portions of the system, such as to a heat exchanger located on or within the FFU 1500. In this manner, a temperature within the transfer module 1400 (or other portions of the system) can be controlled. The system can include or can be coupled to a gas purification system, such as including a gas controller 5600 configured to monitor or control a gas purity level of the controlled environment. The modules such as a holding module or the curing module 2302 can include separate gas purification loops, or such modules can share a controlled environment and purification facilities with the transfer module 1400.

The curing module 2302 can include one or more lamps such as an ultraviolet lamp. Such lamps can be located within the curing module 2302, or outside the chamber such as optically coupled to the chamber through a quartz (or other UV-transparent) window.

Generally, one or more of the substrates in the thermally-controlled regions can be supported by a chuck configuration such as including a plate, frame, or tray. As mentioned in other examples herein, such a plate, frame, or tray can include one or more retractable lift pins (e.g., a pin 2324). As in other examples, the one or more retractable pins or other mechanical support features can be located in regions at the perimeter or between display devices on the substrate. Similarly, a vacuum chuck can support the substrate. A vacuum chuck can be outfitted with vacuum ports and a vacuum supply, which can be turned on and off controllably, so as to provide vacuum suction to the backside of substrate during a processing operation to improve the stability of the substrate or the thermal contact between the substrate and the chuck during that processing operation. In various examples, instead of vacuum chuck, a non-vacuum chuck can be provided and the substrate can be held in place either primarily by gravity and friction, or primarily by mechanical clamping. Substrates can be placed or removed from various positions, such as using an end effector 1422 of a handler 1411.

One or more pins such as a lift pin can be used to elevate the substrate for access by the end effector, as described further below. As mentioned above, the curing module 2302 can also be used to facilitate the dispersal or flow of the film layer deposited on the substrate, such as to achieve a more planar and uniform coating (e.g., an OEL layer printed using a printing module), such as using one or more of gravity, rotation of the substrate, or using one or more vacuum ports to further planarize the substrate during one or more of the holding, material flowing or dispersing, or curing operation. However, the present inventors have recognized that using a vacuum chuck having large ports during one or more of holding, material flowing or dispersal or ultraviolet treatment can lead to unwanted visible defects or "mura." The configuration shown in FIG. 5 can help to facilitate production of an organic thin film encapsulant layer while inhibiting or suppressing mura formation.

As mentioned in examples elsewhere herein, a source of ultraviolet emission can be used such as to treat one or more layers deposited on a substrate being fabricated. For example, ultraviolet emission can be used to polymerize or otherwise treat an organic layer deposited on the substrate, such as for use in one or more processes related to manufacturing a flat panel display assembly, such as including an OLED display assembly. Similar to aspects of other examples described herein, the system of FIG. 5 can include one or more enclosed regions (e.g., "cells" or chambers) such as first region 2301A, a second region 2301B, and an "Nth" region 2301N. For example, three regions can be included (e.g., as shown illustratively in FIG. 5), and in another example, other numbers of regions can be included. The regions can be oriented in a "stacked" configuration along a vertical axis of the system, such as shown illustratively in FIG. 5.

In an illustrative example, such as after deposition of an organic layer on a substrate, a material flowing or dispersal operation can be performed, such as to improve the planarization or uniformity of a coating. A duration of the material flowing or dispersal operation can generally be greater than a duration of an ultraviolet treatment operation. Accordingly, in one approach, respective holding modules can be used, such as separate from the curing module 2302 and arranged in a stacked configuration with each region configured to house a substrate as shown in FIG. 21A or 21B. In this approach, the material flowing or dispersal operation can proceed without restricting access or otherwise tying up a separate ultraviolet treatment region. However, as discussed in examples elsewhere herein, multiple ultraviolet sources can be used, such including user lower-cost sources. In this manner, a throughput impact of idling an ultraviolet source need not preclude use of the same "cell" or region (e.g., 2301A through 2301N) for both a holding operation and ultraviolet treatment operation, because multiple regions are configured to provide ultraviolet treatment, enhancing throughput. Such an approach can also provide redundancy of the ultraviolet sources such that processing can continue even if a particular ultraviolet source fails or is undergoing maintenance. Yet another benefit to such an approach is that the substrate can undergo a material flowing or dispersal operation to disperse or flow a printed organic layer (e.g., to improve planarization or uniformity) and the substrate can be treated, such as receiving an ultraviolet treatment, without requiring movement of the substrate from the cell.

In the example of FIG. 5, a first ultraviolet source 2310A (e.g., an ultraviolet-emitting LED array) can provide ultraviolet emission 2328 having a specified range of wavelengths to a first substrate 4000A. The ultraviolet emission can be coupled to an interior of the enclosed region 2310A such as through a window 2310A (e.g., a quartz window or an assembly such as including a normalization filter, or other filters or coatings). As in the example of FIG. 6, FIG. 7A, FIG. 7B, FIG. 8A, or FIG. 8B, the environment within the region 2301A can be controlled and can be isolated from a housing containing the first ultraviolet source 2310A. In the second enclosed region 2310B, the second substrate 4000B can be held for a specified duration, such as for material flowing or dispersal or to await availability of other processes. During the specified holding duration, a second ultraviolet source 2310E can be disabled.

In examples elsewhere herein, a chuck can be used, such as contacting at least a portion of a substrate such as to one or more of convey, support, or retain the substrate. The present inventors have recognized, among other things, that for some operations or material systems, such as in relation to providing for the flowing or dispersing a deposited organic layer, visible defects can be induced in the display regions of the substrate 4000A when the substrate is supported in a non-uniform manner. For example, pins, support frames, holes in the chuck associated with retracted lift-pins, or vacuum apertures in the chuck under the substrate 4000A can induce visible defects in a finished device as shown illustratively in FIGS. 15A and 15B.

Without being bound by theory, it is believed that such defects can result from localized variations in thermal conductivity that can create local gradients in the temperature of the substrate 4000A during, for example, a material flowing or dispersal operation or from electrostatic interactions between the substrate 4000A and other portions of the system, such as can be influenced by contact between the substrate 4000A and other portions of the system. In an example, a specified temperature uniformity can be maintained in a local region of the substrate, for example, such that deviation in temperature adjacent to or within the local region is limited. For example, a significant temperature variation across the substrate can be tolerated but such variation can have a limited gradient such that the temperature does not vary significantly over a small distance along the substrate. In this manner, abrupt changes in visible characteristics of the finished display can be avoided and such gradual changes are less likely to be noticed or even detectable.

Figure 13A:
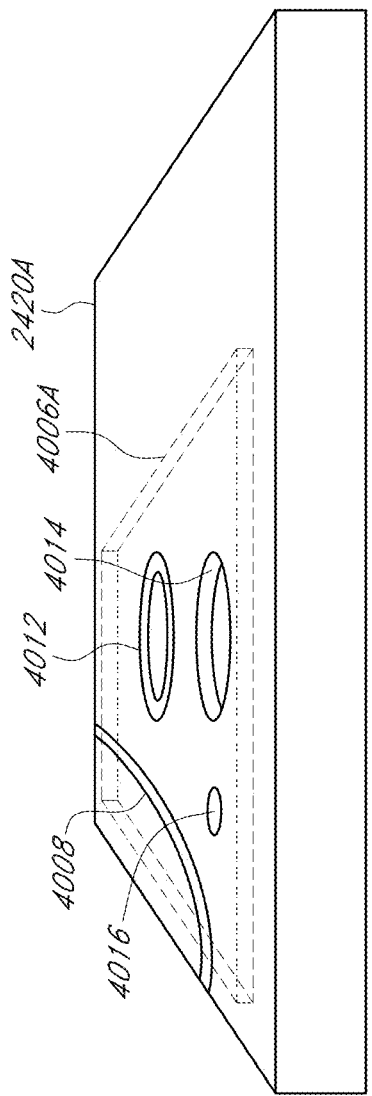
FIG. 13A and FIG. 13B illustrate generally illustrative examples of a chuck configuration that includes ports or grooves in contact with a substrate in FIG. 13A, such as during one or more of a deposition, holding, material flow or dispersal, or cure process, and corresponding visible non-uniformities (e.g., "mura") in a layer of the substrate in FIG. 13B.
Figure 13B:
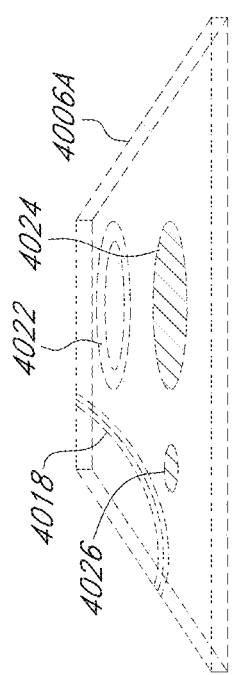

As mentioned elsewhere, in one approach, regions outside the emitting or display region of the substrate can be used to support substrate 4000A (e.g., as shown illustratively in FIG. 13A, FIG. 13B, or FIG. 13C). However, because large portions of the substrate 4000A generally do include emitting regions or portions of the actual display region, it can be impractical to support the substrate only at the periphery of such regions because such support induces unacceptable mechanical forces or stresses elsewhere across the substrate 4000A, which may either distort or fracture the substrate 4000A.

Accordingly, the present inventors have also recognized that the substrate 4000A can be supported by a chuck 2320A, such as during an ultraviolet treatment operation, such as at least in part using a pressurized gas 2304A to provide a gas cushion. According to various examples, the substrate 4000A can be supported exclusively by a controlled arrangement of the pressurized gas 2304A, such as to "float" the substrate 4000A. In another example, the substrate 4000A can be supported using a uniform vacuum region under active areas of the substrate or otherwise in areas where defects induced by non-uniformities would be deemed unacceptable. Retractable lift pins can be located in regions at the periphery of the substrate, or between active regions such as to facilitate loading or unloading of the substrate, such as shown illustratively in FIG. 15A or 15B.

In another approach, the substrate 4000A can be supported by a pressurized gas 2304A impinging on a first surface of the substrate 4000A, and an opposing force can be provided such as by a mechanical stop 2312 contacting an opposing face of the substrate 4000A or arranged to contact the substrate at one or more locations laterally. Generally, in examples where a gas cushion is used to the support the substrate, the substrate can be supported by a gas cushion provided between a surface of the substrate opposite the surface including the active regions or the organic encapsulation layer, such as in a "face up" example where the organic encapsulation is on a top surface of the substrate and the gas cushion is provided on a bottom surface.

A second chuck 2320B can be provided as a portion of the second cell (e.g., the region 2301B), and an "Nth" chuck 2320N can be provided as a portion of the "Nth" cell (e.g., the region 2301N). Similarly, an elevating handler 1411 (or a handler robot as described in other examples herein) can include a table (or a corresponding end effector 1422) including pressurized gas arrangement to support a substrate at least in part using the pressurized gas. A conveyor 1430, or other apparatus can also include such a pressurized gas arrangement, such that a substrate (e.g., a substrate 4000C) can be conveyed along a path 2440 from a region 2101 elsewhere in the system (or external to the system) to a desired cell, such as the region 2301N. For example, one or more of the conveyor 1430, the effector 1422, or the first through "Nth" chucks 2320A through 2320N can each define a "floatation zone." In one or more of the floatation zones, such as in a zone established by the first chuck 2320A, an arrangement (e.g., an array) of ports such as a port 2306A can be used to establish a gas cushion partially or entirely supporting the substrate 4000A.

In examples where the substrate 4000A is supported exclusively by the gas cushion, a combination of positive gas pressure and vacuum can be applied through the arrangement of ports. Such a zone having both pressure and vacuum control can effectively provide a fluidic spring between the chuck 2320A and a substrate. A combination of positive pressure and vacuum control can provide a fluidic spring with bidirectional stiffness. The gap that exists between the substrate (e.g., substrate 4000A) and a surface (e.g., the first chuck 2320A) can be referred to as the "fly height," and such a height can be controlled or otherwise established by controlling the positive pressure and vacuum port states. In this manner, the substrate orientation can be carefully controlled such as for one or more of a holding operation, a material flowing or dispersing operation or an ultraviolet treatment operation.

Elsewhere, such as where the fly height need not be controlled precisely, pressure-only floatation zones can be provided, such as along the conveyor 1430 or elsewhere. A "transition" zone can be provided such as where a ratio of pressure to vacuum nozzles or area increases or decreases gradually, such as along the conveyor 1430, along the table 1422, or elsewhere. In an illustrative example, there can be an essentially uniform height between a pressure-vacuum zone, a transition zone, and a pressure only zone, so that within tolerances, the three zones can lie essentially in one plane. A fly height of a substrate over pressure-only zones elsewhere can be greater than the fly height of a substrate over a pressure-vacuum zone, such as in order to allow enough height so that a substrate will not collide with a floatation table in the pressure-only zones. In an illustrative example, an OLED panel substrate can have a fly height of between about 150 micrometers (μ) to about 300μ above pressure-only zones, and then between about 30μ to about 50μ above a pressure-vacuum zone. In an illustrative example, one or more portions of the conveyor 1430, the table 1422, or the chucks 2320A through 2320N can include an "air bearing" assembly provided by NewWay® Air Bearings (Aston, Pa., United States of America). While the examples of gas pressurized support of a substrate are discussed in relation to FIG. 5, such techniques can be used in addition to or instead of other conveyance or support approaches, such as in relation other system examples described herein, and as discussed in relation to FIG. 19C.

In an example, mechanical retaining techniques, such as pins or a frame, can be used to restrict lateral translation of a substrate while the substrate is supported by a gas cushion. Such retaining techniques can include using spring loaded structures, such as to reduce the instantaneous forces incident the sides of the substrate while the substrate is being retained; this can be beneficial as a high force impact between a laterally translating substrate and a retaining means can cause substrate chipping or even catastrophic breakage.

Each of the regions 2301A through 2301N can either share one or more gas purification loops or can each be served by a respective gas purification loop. Similarly, one or more FFUs can be located to provide a laminar airflow parallel to a surface of substrate in each of the regions 2301A through 2301N. The regions 2301A through 2301N can each include a valve or gate, such as to isolate the controlled environment of each enclosed region 2301A through 2301N from the transfer module 1400 or from each other. For example, the ultraviolet sources 2310A through 2310N need not be housed in enclosures isolated from the interior of the regions 2301A through 2301N. Accordingly, such as during maintenance, a particular region can have its controlled environment isolated from the rest of the enclosed regions using a valve or gate.

A temperature within the enclosed transfer module 1400 or within other portions of the system can be controlled as described extensively in other examples herein, such as using a temperature controller 5650. The temperature controller 5650 can be coupled to the FFU 1500 or one or more FFUs elsewhere. The temperature controller 5650 or other techniques can be used such as to control a temperature of gas supplied by one or more of the chucks 2320A through 2320N, the table 1422, or the conveyor 1430. As mentioned in relation to FIG. 6, FIG. 7A, FIG. 7B, FIG. 8A, or FIG. 8B, one or more of the ultraviolet sources 2310A through 2310N can be cooled using a liquid or circulating gas, such as including one or more cooling loops isolated from other portions of the system.

Figure 6:
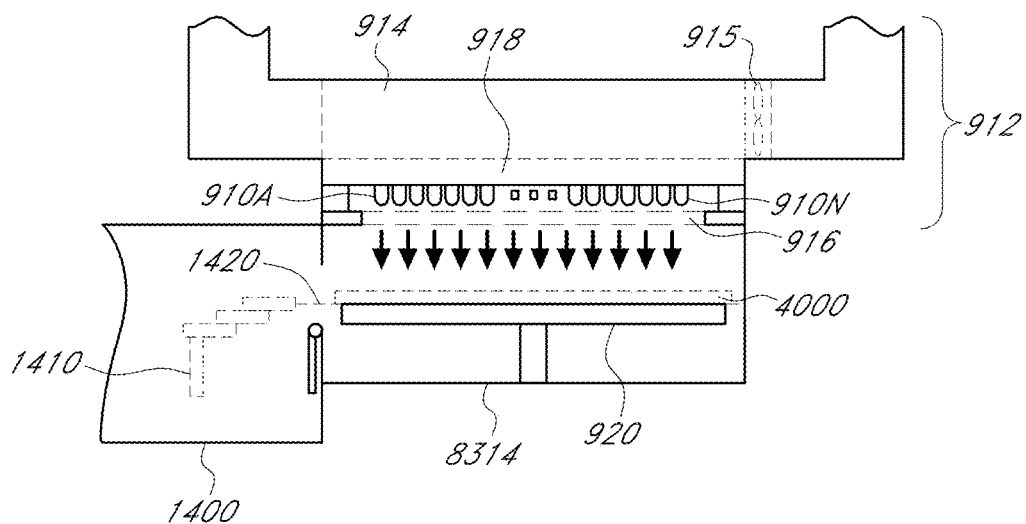
FIG. 6 illustrates generally an example of a diagram illustrating an ultraviolet treatment system that can be used in manufacturing a light emitting device.

FIG. 6 illustrates generally an example of a diagram illustrating an ultraviolet treatment system that can be used in manufacturing a light emitting device. The treatment system can be included as a portion of other systems or techniques described herein, such as for use as a curing module (or, e.g., for use as a combination curing and holding module). The ultraviolet treatment system can include an ultraviolet source assembly 912, such as configured to couple ultraviolet energy to a surface of a substrate 4000. As in other examples, a curing module 8314 can include a controlled environment, such as provided by one or more gas purification loops and coupled to one or more fan-filter-units (FFUs), such as to provide an environment having a specified maximum level of particulates or reactive contaminants.

The substrate 4000 can be loaded into the curing module 8314 or removed from the chamber 8314 such as using a handler 1410 and end effector 1420, which can access the curing module 8314 from an adjacent transfer module 1400, or through another chamber or assembly such as a load lock. A chuck 920 can be used to support the substrate 4000, such as using physical contact and vacuum to hold the substrate in place or using a gas cushion arrangement as mentioned in other examples. One or more lift pins can be used, such as to elevate the substrate 4000 so that the substrate 4000 can be manipulated by the end effector 1420, such as shown illustratively in FIG. 15A or 15B.

An array of ultraviolet sources, such as sources 910A through 910N, can provide ultraviolet energy, such as including a wavelength selected from the range of about 350 nanometers to about 400 nanometers. For example, a wavelength of about 385 nanometers or about 395 nanometers can be used. The sources can include a variety of configurations, such as using relatively small number of high-power sources as shown in the example of FIG. 7A, or using an array of relatively lower-power sources, such as shown illustratively in FIG. 9, FIG. 10, or FIG. 11. The sources can include generally-available ultraviolet emitters, such as ultraviolet-emitting light-emitting diodes (UV LEDs) or one or more mercury-based devices, such as one or more mercury arc sources.

In an example, a substrate or housing 918 of the ultraviolet source assembly 912 can be liquid or air-cooled. For example, a plenum 914 can be provided, such as having one or more blowers such as a blower 915 to force air across or through a portion of the ultraviolet source assembly 912. Such a cooling loop can be separated from the controlled environment within the curing module 8314 or the transfer module 1400, for example. The environment surrounding the sources 910A through 910N can include the curing module 8314 controlled environment, or the environment surrounding the sources 910A through 910N can form a separate enclosure, such as having a window 916 to allow ultraviolet energy to pass from the source enclosure to the curing module 8314. In this manner, maintenance of the source enclosure need not disturb the controlled environment within the curing module 8314.

As discussed in the examples below, the window 916 need not be uniformly transmissive. For example, the window can include or can be coupled to optics to converge, diverge, or collimate the ultraviolet energy. In another example, the window 916 can include transmission characteristics that vary in a specified manner over the area of the window, such as to invert or otherwise compensate for a non-uniform power density of delivered ultraviolet energy in the plane of the substrate 4000, such as within a specified region of the substrate. In the example of FIG. 6, the window and the ultraviolet sources 910A through 910N are shown as arranged in a planar configuration, but other configurations are possible, such as a cylindrical, parabolic, or spherical configuration. In an example the ultraviolet sources 910A through 910N can be used to treat one or more organic material layers to encapsulate an organic light emitting diode (OLED) display device being fabricated as a portion of the substrate 4000. Such treatment generally includes providing a specified dose of ultraviolet energy within a specified range of wavelengths, and having a specified uniformity over a specified area of the substrate 4000.

A treatment process can generally be established in terms of a desired dose or dose-range of ultraviolet exposure, such as specified in terms of energy per unit area (e.g., Joules per square centimeter). Dose can be calculated such as by multiplying incident power density by exposure duration. A trade-off can exist between intensity (e.g., incident power) and exposure duration. For example, a relatively high-power source can be used and a desired UV dose can be achieved using a relatively short exposure duration, which beneficially shortens processing time. However, such high-power UV irradiation may damage or degrade other portions of the display assembly, so a limit can exist as to the power density provided at the substrate by the ultraviolet source such as to avoid such damage or degradation.

As mentioned above, a uniformity of delivered ultraviolet energy can also be controlled, such as to avoid variation in organic encapsulation layer characteristics over a surface of the substrate 4000. In one example, such a uniformity can be specified in terms of incident power or delivered UV dose, such as having a value of no more than 20% variation from highest to lowest incident power or dose over a specified curing area of the substrate 4000, or having no more than 50% variation from highest to lowest incident power or dose over the specified curing area of the substrate 4000, or having no more than 10% variation from highest to lowest incident power or dose over the specified curing area of the substrate 4000.

Various UV source configurations can be used for the sources 910A through 910N. For example, a linear array or "bar" source can be used as shown in the configuration 8315 of FIG. 7A. Such a bar configuration can include a precision reflector, such as to focus or collimate the ultraviolet energy in a direction towards the substrate 4000. In another example, such a bar configuration can include one or more of a diffuser or transmissive filter, such as discussed in relation to other examples herein.

Figure 9:
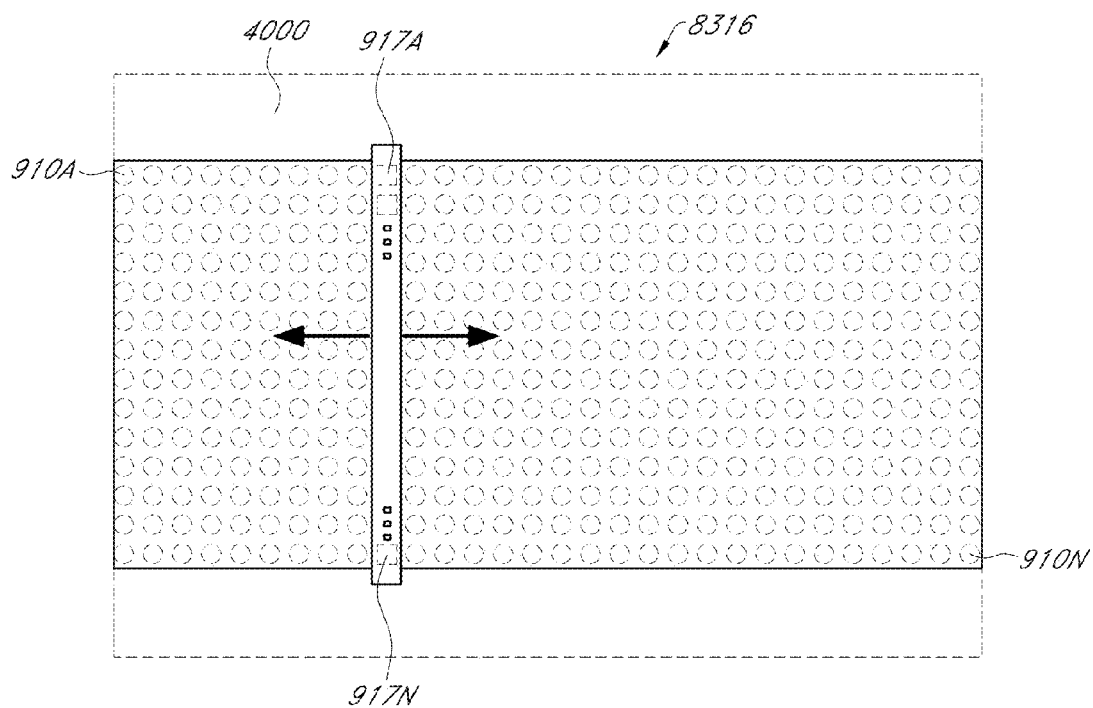
FIG. 9 illustrates generally an example of a diagram illustrating a portion of an ultraviolet treatment system that can include a two-dimensional array configuration of ultraviolet sources, such as can be used in manufacturing a light emitting device.
Figure 10:
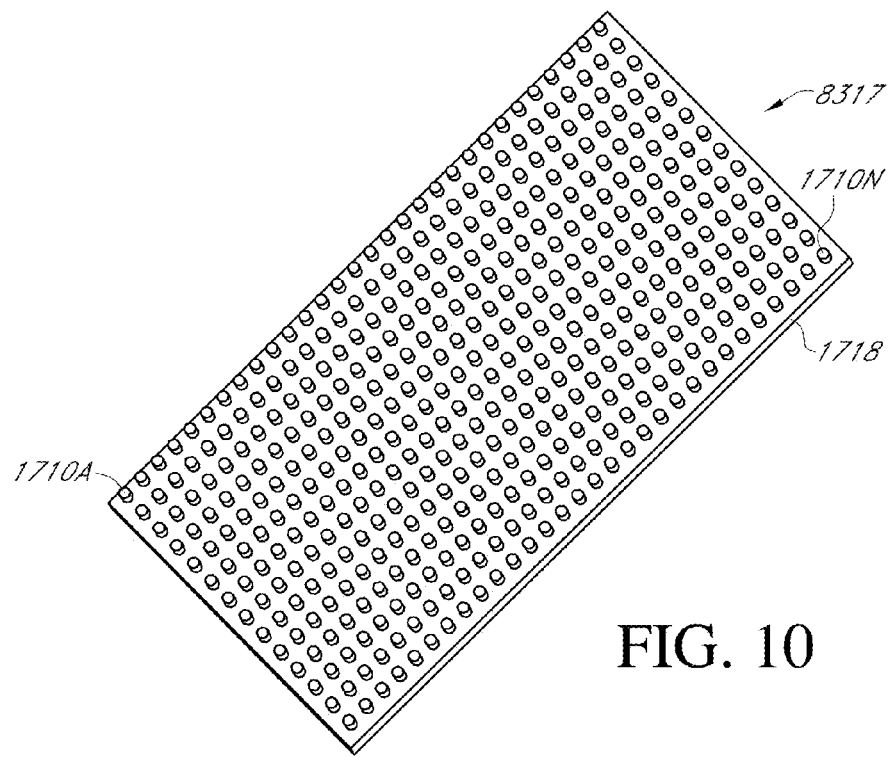
FIG. 10 illustrates generally an example of a two-dimensional array configuration of ultraviolet sources, such as can be used as a portion of an ultraviolet treatment system.
Figure 11:
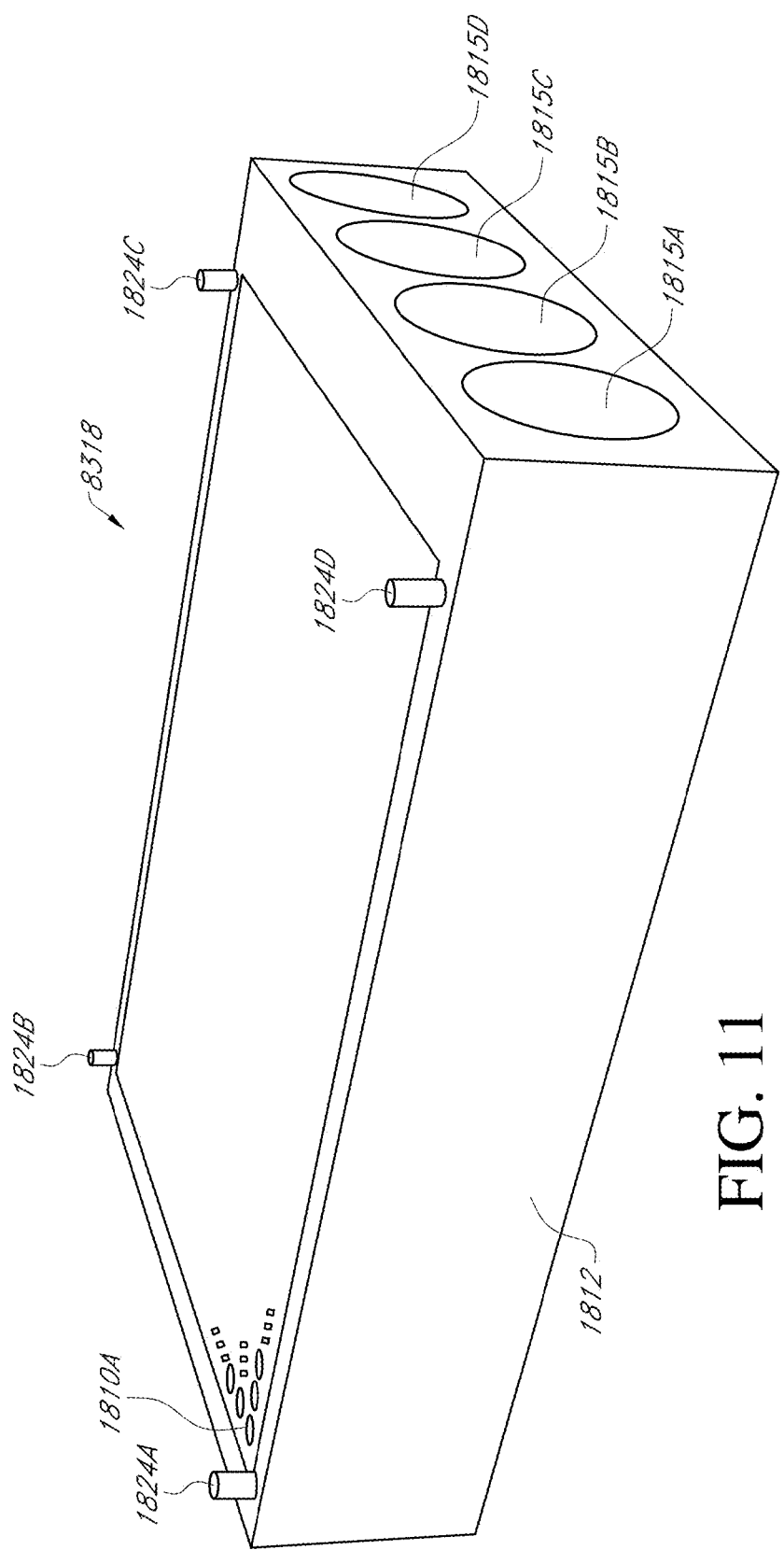
FIG. 11 illustrates generally an example of a housing configuration for an array of ultraviolet sources, such as can be included as a portion of an ultraviolet treatment system.

A two-dimensional array configuration can be used, such as shown illustratively in the configurations 8316 through 8318 of FIG. 9, FIG. 10, or FIG. 11. A sparse array of high-intensity sources can be used, such as can provide the power density illustrated in the example of FIG. 12, such as including one or more reflectors. One or more of these source configurations can be mechanically fixed, or can be scanned across a surface of the substrate. In such examples, either or both the substrate 4000 or the sources 910A through 910N can be scanned. For example, the sources 910A through 910N can be fixed, and the substrate 4000 can be repositioned, such as to create a relative motion between the substrate 4000 and the sources 910A through 910N to achieve scanning.

FIG. 7A, FIG. 7B, FIG. 8A, and FIG. 8B illustrate generally examples illustrating a portion of an ultraviolet treatment system 8315 that can include a linear array configuration 910 of ultraviolet sources such as can be used in manufacturing a light emitting device. The linear array 910 can be scanned in at least one axis to sweep a beam of ultraviolet emission 922 across a specified region of the substrate 4000, such as in a region where a monomer has been deposited and is to be cured or otherwise treated with ultraviolet light. Such scanning can be achieved through either or both of repositioning the substrate 4000 or the linear array 910, such as during ultraviolet treatment. A window 916 can be used, such as when the linear array 910 is located in an enclosure separate from a chamber 8314 housing the substrate 4000. Such a window 916 can include or can be coupled to one or more of optics or a filter, such as discussed below in relation to FIG. 12 or other examples.

The linear array 910 can offer an advantage of fewer ultraviolet sources (e.g., about 5 to about 10 LED sources, in an illustrative example). But, such a linear area 910 may result in additional system complexity where mechanical scanning is used to provide exposure to all of the specified curing area of the substrate 4000. Mechanical scanning can be simplified in part by specifying that the linear array 910 is at least as wide or as a long as one axis of the substrate, so that scanning is used only in the orthogonal axis (e.g., such axis as shown by arrows in FIGS. 7A and 8A). In this manner, an entire width or length of the substrate 4000 can be treated with UV radiation while scanning the linear array 910 "gantry" only in a single axis, such as shown illustratively in FIG. 7A, FIG. 7B, FIG. 8A, and FIG. 8B. The linear array 910 can include a precision reflector configuration, as mentioned above. As an illustrative example, a high-power UV LED light bar supplying light at or near 395 nm wavelength is available from Phoseon Technology (Hillsboro, Oreg., USA), such as including a reflector configuration to enhance uniformity of a field illuminated by the linear array 910. In addition or instead of such a precision reflector, one or more of a filter or diffuser can be used, such as statically configured nearby the window 916 or included as a portion of the window 916. In another example, one or more of a filter or diffuser can be included as a portion of the linear array 910 assembly, such as mechanically scanned as a portion of the linear array 910. In an example, the power density supplied by the linear UV source is between 20 mW/cm$^2$ and 400 mW/cm$^2$.

Figure 8A:
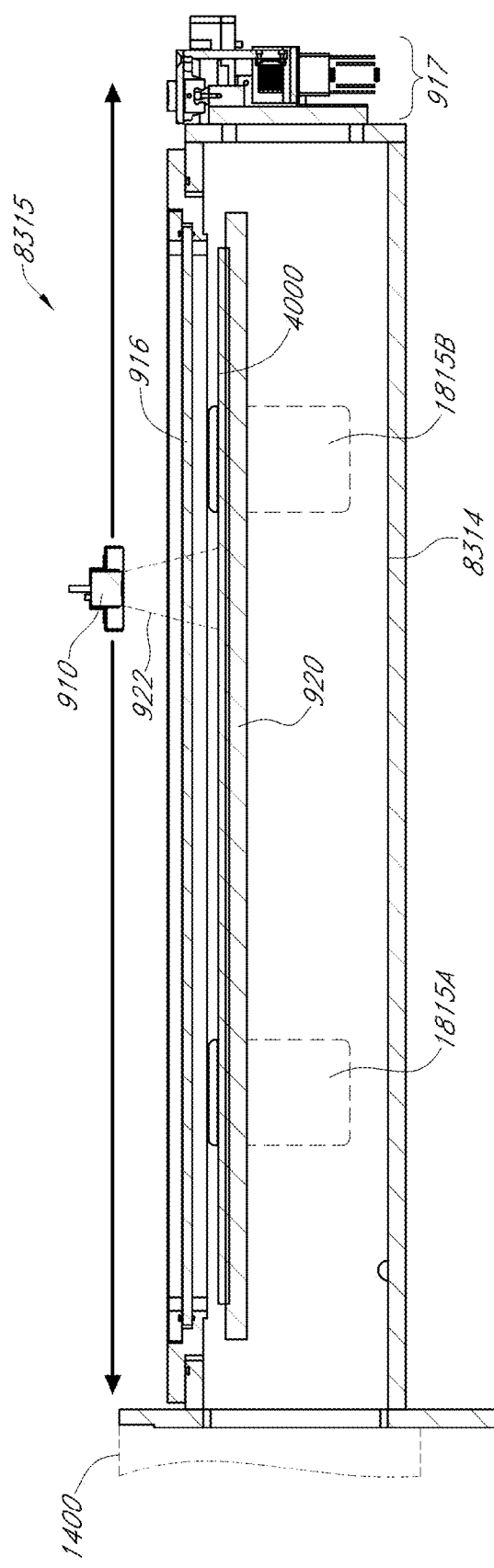
FIG. 8A and FIG. 8B illustrate generally examples of at least a portion of an ultraviolet treatment system that can include a linear configuration of ultraviolet sources and a photodetector.
Figure 8B:
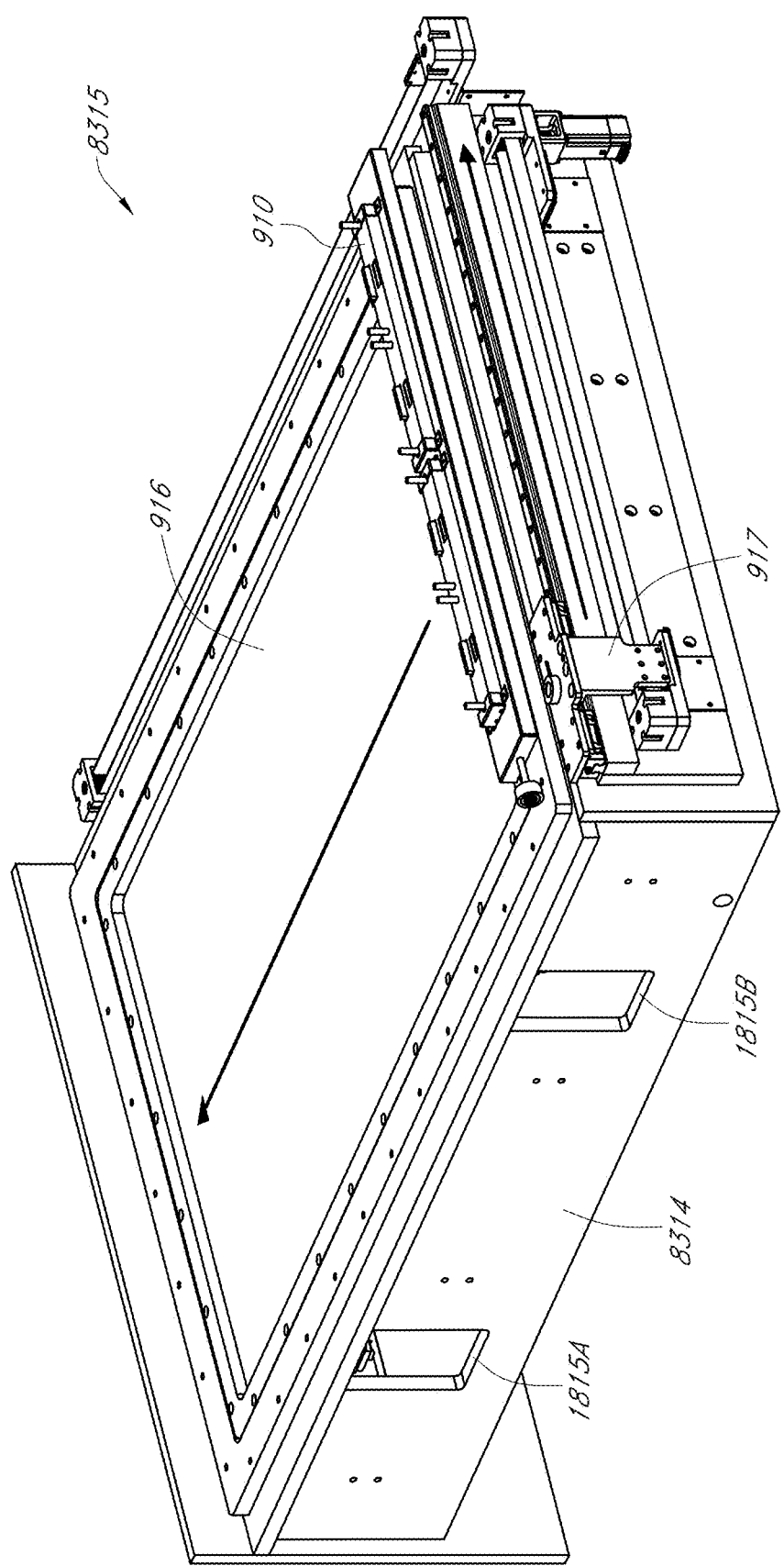

The present inventors have also recognized that a uniformity of ultraviolet illumination can be compromised by degradation or failure of one or more ultraviolet sources. In the illustrations of FIGS. 8A and 8B, an optical sensor 917 such as an ultraviolet-sensitive photometer can be used to monitor the health of the linear array 910. For example, the optical sensor 917 can be mechanically scanned in an axis parallel to the linear array 910 so that information can be obtained regarding the state of one or more optical sources included along the linear array 910. In another example, the optical sensor 917 can include multiple sensors placed along an axis parallel to the linear array 910, such as obviating a need for mechanical scanning of the optical sensor 917. Other configurations of optical sensors can be used, such as mentioned in relation to other examples below. As in other examples discussed herein, one or more apertures can be provided in the chamber 8314, such as to provide a mounting location for a fan or fan filter unit, or to provide a location for an inlet or outlet of a non-reactive gas to be used within the chamber 8314, such as to facilitate coupling of a duct to the chamber 8314.

A linear array 910 source height from an upward-facing portion of the substrate 4000 can be represented by "H," a relative velocity between the optical energy emitted by the array 910 and the substrate can be represented by "V." The velocity can be established by moving one or more of the array 910 relative to the substrate 4000 (e.g., scanning the array mechanically) or the substrate 4000 relative to the array, such as by either floating the substrate on a cushion of gas or by moving a chuck 920 supporting the substrate. An illuminated width can be represented by "W," with such a width increasing as H increases and decreasing as H decreases. For dose modeling, a width of the array 910 can be multiplied by the illuminated width W to estimate an area of the substrate 4000 irradiated by the array 910.

Generally, in view of the large scale of substrates 4000 that can be accommodated by the examples described herein, throughput is a consideration. Accordingly, one objective can be to provide an ultraviolet dose in a manner that the appropriate dose is delivered in a short or minimum amount of time, which can also reduce likelihood of damaging other portions of the substrate 4000 either through reducing or minimizing exposure to energy from the source, or merely through reducing or minimizing the time during which the substrate is being processed. However, a tradeoff can exist between various processing parameters such that the velocity, dose of energy, and source height H are generally not arbitrarily established.

FIG. 9 illustrates generally an example of a diagram illustrating a portion of an ultraviolet treatment system that can include a two-dimensional array configuration 8316 of ultraviolet sources 910A through 910N, such as can be used as a portion of an ultraviolet treatment system for treating a specified area of a substrate 4000. By contrast with the illustrative examples described in relation to FIG. 7A, FIG. 7B, FIG. 8A, and FIG. 8B, a dense two-dimensional array of low-power ultraviolet sources can be used. Such low-power sources can include low-power UV LEDs, which are generally more cost effective and reliable than mercury arc devices. Such low-power UV LEDs can also be used for large substrate 4000 geometries (e.g., exceeding 1 meter by 1 meter), such as where high-power UV LEDs would become cost prohibitive due to the large numbers of devices generally used to cover the large substrate 4000 area.

The dense array of hundreds of individual emitters can provide enhanced uniformity of delivered power at the substrate 4000 surface, as compared to other approaches. Remaining non-uniformity can be addressed such as using a diffuser plate or other filter or optics between the array 8316 and the substrate 4000. As in the example of FIG. 8A or 8B, degradation or failure of one or more of the ultraviolet sources 910A through 910N can result in a non-uniform ultraviolet exposure field. Such a non-uniform field can lead to visible defects or unwanted variations in one or more layers of the substrate 4000. Accordingly, one or more optical sensors 917A through 917N (e.g., photometric sensors) can be used to sense such degradation or failure. As shown in the illustration of FIG. 9, each of the optical sensors 917A through 917N can, but need not, be aligned to provide a 1:1 correspondence to an optical source in a particular row or column and a corresponding optical sensor position, so that a failure of an individual optical source can be detected. In another approach, a spatially-averaged or spatially-cumulative specified intensity can be used as a go/no criterion, and fewer sensors can be used. A failure of an individual optical source can reduce an average intensity or a cumulative intensity detected at one or more of the optical sensors, such as triggering repair or replacement of the optical source array or otherwise halting further processing.

For example, one or more of the array 8316 of ultraviolet sources 910A through 910N or the optical sensors 917A can be mechanically scanned, such as to sample the output of the ultraviolet sources 910A through 910N. In the event of a detected degradation or failure, further processing can be halted until the array 8316 is repaired or replaced. In an example, the array 8316 can include redundant sources amongst the sources 910A through 910N. In the event of degradation or failure, use of a combination of one or more defective sources can be suppressed, and a combination of other redundant ultraviolet sources can be used instead.

FIG. 10 illustrates generally an example of a two-dimensional array configuration 8317 of UV LED sources 1710A through 1710N, such as can be used as a portion of an ultraviolet treatment system for treating a specified area of a substrate 4000. The two-dimensional array 8317 shown in FIG. 10 can eliminate use of precision reflectors, since such an array generally provides UV radiation in the desired direction without use of large reflectors. Use of low-power UV LEDs can also allow precision control of intensity (through duty cycle modulation or current modulation) and exposure duration, such as allowing duration control to a precision of about 20 milliseconds. A substrate 1718 of the array 8317 can include a heat-sink material, such as to assist in coupling heat away from the individual sources 1710A through 1710N in the array 8317. The substrate 1718 can include or can be coupled to a structural support frame. The individual sources 1710A through 1710N can each include a lens structure, such as to provide a converging, diverging, or collimated ultraviolet beam for each of the individual sources 1710A through 1710N.

FIG. 11 illustrates generally an example of a housing configuration 8318 for an array of ultraviolet sources, such as can be included as a portion of an ultraviolet treatment system. The housing can include forced air circulation, such as using one or more fans as indicated by apertures 1815A through 1815D. An array of UV LEDs, such as a UV LED 1810A, can be included within a housing 1812. One or more alignment or support posts can be included, such as one or more of posts 1824A through 1824D.

Figure 12:
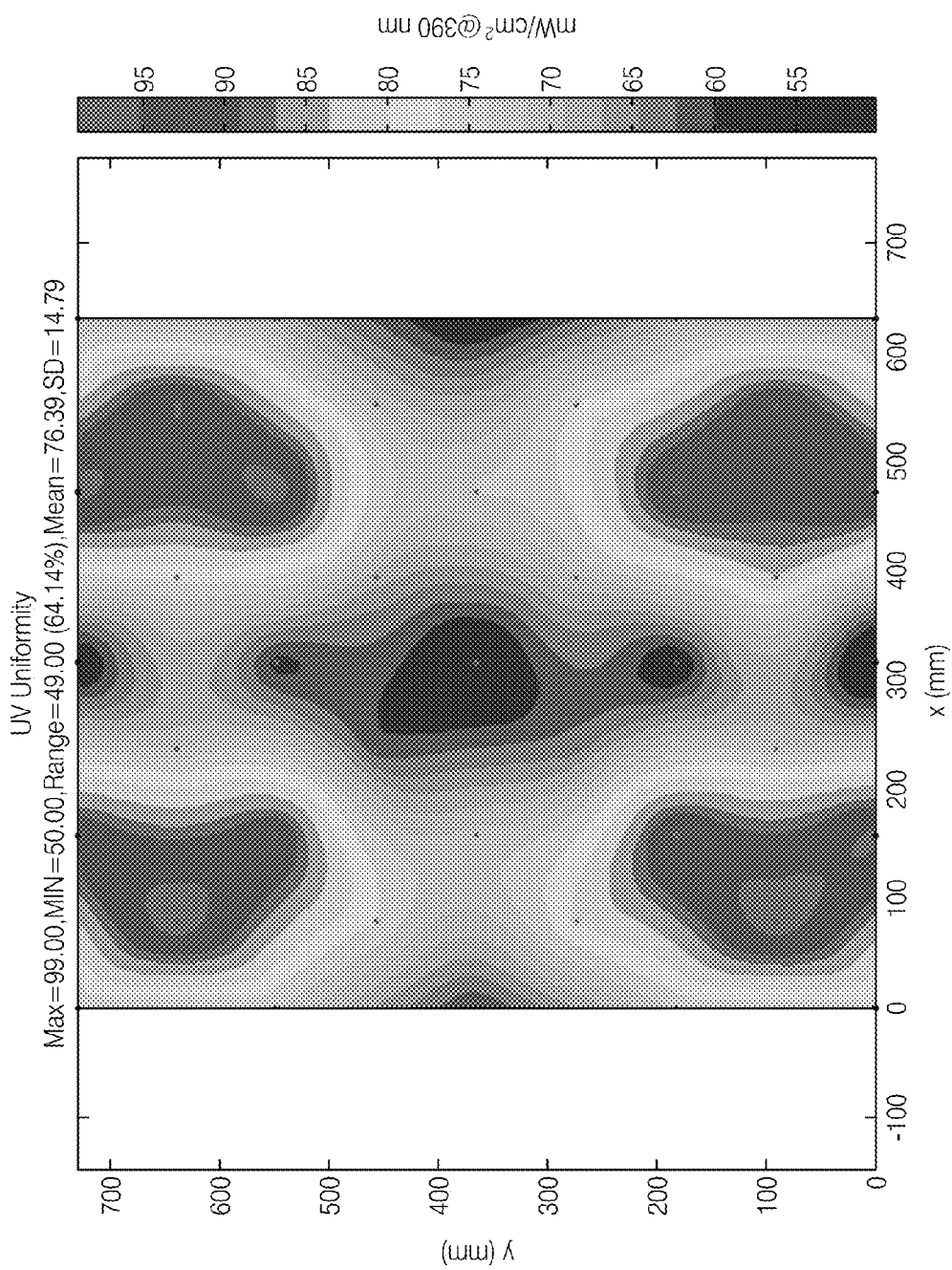
FIG. 12 illustrates generally an illustrative example of an intensity plot showing a non-uniformity of delivered ultraviolet energy, such as can be used to establish an inverse or normalization filter configuration.

FIG. 12 illustrates generally an illustrative example of an intensity plot 1900 showing a non-uniformity of delivered ultraviolet energy corresponding to a known distance from the UV sources and the substrate. Such an intensity plot can be used to establish an inverse or normalization filter configuration. In one approach, such as shown illustratively in FIG. 7A, a small number of fixed high-power lamps can be used along with a reflector, such as illuminating a desired curing area of the substrate 4000. However, while mechanically simple, such an approach can have drawbacks.

For example, in the illustrative example of FIG. 12, four high-power LEDs are used to illuminate an area of about 0.650 meters by about 0.725 meters. Such an approach can provide areas of relatively higher incident power, such as an area 1902, along with areas of relatively lower incident power, such as in the center of the plot 1900. Uniformity can be enhanced by increasing a density of sources, but at the cost of using a greater number of individual high-power LEDs. The present inventors have recognized, among other things, that information about an intensity map such as shown in the plot 1900 can be used to establish an inverting filter to provide a uniform intensity or power distribution over a desired cure area while still using a sparse array or relatively small number of UV sources.

For example, the plot 1900 can be normalized to a least intense region and then the plot 1900 can be inverted. The inverted representation can be used to establish a transmissive filter whereby the least intense regions of the plot 1900 have the least, less, or no filtering as compared to other regions, and the more intense regions are filtered to reduce transmission of energy through the filter proportionally in those more intense regions and thereby level out their transmission to a value similar to the least intense regions. In this manner, a uniform area illumination can be achieved on the substrate. Such inversion and transmission need not be continuously varying, and in some examples all areas can be filtered to some extent. In an example, a transmissive filter can include a half-tone or other dithering pattern of opaque material (e.g., an array of dots or other regions) such as to provide a range of transmitted intensities across a surface of the filter corresponding to the inverted intensity pattern of a UV source.

The transmissive filter can be included as a portion of a window as discussed in other examples, or can be coupled to a window. For example, an absorbing coating can be patterned on a flexible film or on a rigid medium such as glass or quartz. In an illustrative example, the transmissive filter is coupled to a quartz window or a transparent support plate at a specified location between the substrate 4000 and UV sources. In another illustrative example, the transmissive filter is patterned on a film and structurally supported by a frame at a specified location between the substrate 4000 and the UV sources.

In another approach (or in combination with the transmissive filter approach described above), a diffuser can be used to provide a more uniform illumination field. A diffuser can be more efficient than a transmissive filter having optically opaque regions. This inefficiency of a transmissive filter can occur because brighter regions in the illumination field (e.g., "hotspots") are generally reflected or absorbed (e.g., blocked) by the transmissive filter, such as to achieve uniformity of illumination of the substrate. By contrast, a diffuser can assist in providing more uniform illumination by redirection of propagating light using one or more of refraction, diffraction, or scattering, such as comprising a translucent material.

For example, the window region 916 in one or more of FIG. 7A, FIG. 7B, FIG. 8A, or FIG. 8B, or other examples herein, can include a diffuser such as including a plate or film similar to the examples discussed above in relation to the transmissive filter. For example, a diffuser can include a holographically-imprinted plate or film. Such a diffuser can be used in examples where the UV light source is static (e.g., an array source as shown in FIG. 9, FIG. 10, or FIG. 11). Such a diffuser can also be used in examples where the UV light source is mechanically scanned relative to the substrate or vice versa (e.g., FIG. 7A, FIG. 7B, FIG. 8A, or FIG. 8B). Examples of diffusers can include one or more light management films such as can be obtained from WaveFront Technology, Inc. (Paramount, Calif., United States of America), such as can include a micro-diffuser including a holographically recorded surface relief microstructure. Other diffuser technologies can be used, such as can include bead structures or prismatic structures, for example. In another example, a homogenizing diffuser can be used, such as available from Luminit, LLC (Torrance, Calif., United States of America).

Such a diffuser arrangement can provide a more space-efficient UV exposure apparatus, such as by eliminating large reflectors and compressing a distance between individual UV sources (e.g., LEDs) and the substrate, as compared to approaches where the UV sources are mounted with a large separation from the substrate, and large reflectors are used to assist in collimating or otherwise providing a more uniform illumination field. In an illustrative example, a diffuser can provide a transmissive efficiency of greater than 80 percent, or greater than 90 percent, such as to provide UV illumination having a field uniformity of better than 15% (e.g., having a uniformity that does not vary more than 15% in intensity from a lowest intensity portion of the specified region defining the field to a highest intensity portion of the specified region defining the field).

FIG. 13A and FIG. 13B illustrate generally illustrative examples of a chuck configuration 2420A that includes ports or grooves in contact with a substrate 4006A in FIG. 13A, such as during one or more of a deposition, holding, material flow or dispersal, or cure process, and corresponding visible non-uniformities (e.g., "mura") in a layer of the substrate in FIG. 13B. In the example of FIG. 13A, the chuck 2420A can include one or more of a groove 4008 (e.g., coupled to a vacuum or included for another purpose), a retracted lift pin 4016, a large vacuum port 4014, a vacuum groove 4012, or one or more other features. In an illustrative example, the chuck 2420A can be used to retain a substrate 4006A during processing, such as during deposition of an organic thin film encapsulant, or during other operations such as providing for the flow or dispersal of a deposited encapsulant layer (e.g., to achieve a more uniform or planar coating), or during thermal or ultraviolet treatment of such an encapsulant layer. In FIG. 13B, a resulting layer uniformity on the substrate 4006A can exhibit visible defects such as a defect 4018 corresponding to the groove 4016, a defect 4026 corresponding to the retracted lift pin 4016, a defect 4022 corresponding to the vacuum groove 4012, and a defect 4024 corresponding to the vacuum port 4014. Such defects can manifest as rainbow-colored interference patterns that having varying color uniformity creating visible outlines of the shapes shown in FIG. 13B, or shadows where display brightness or color rendering or not consistent in such regions. Without being bound by theory, it is believed that such variations can be caused at least in part by variations in the thermal environment in contact with the substrate 2420A, even if such variations occur in relation to features contacting a side of the substrate (e.g., a back side) opposite the deposition side. As discussed above, the present inventors have recognized, among other things, that such mura can be suppressed or inhibited using various s uniform support techniques such as described below and elsewhere herein.

The use of uniform support techniques to suppress mura can also beneficially reduce other sources of degradation such as particulate contamination. Such degradation can be driven at least in part by incorporation of chemically or electrically/optically contaminants into the device structure, either within the bulk material of each film or at the interfaces between layers in the overall device stack. Over time chemically active contaminants can trigger a chemical reaction in the film that degrades the film material. Such chemical reactions can occur simply as a function of time, absent any other triggers, or can be triggered by ambient optical energy or injected electrical energy, for example. Electrically or optically active contaminants can create parasitic electrical or optical pathways for the electrical or optical energy introduced or generated in the device during operation. Such pathways can result in suppression of light output, or generation of incorrect light output (e.g., light output of the wrong spectrum.) The degradation or loss may manifest as failure of an individual OLED display elements, "black" spotting in portions of an array of OLED elements, visible artifacts or loss of electrical or optical efficiency, or unwanted deviation in color rendering accuracy, contrast, or brightness in various affected regions of the array of OLED elements.

FIG. 14A, FIG. 14B, FIG. 14C, and FIG. 14D include illustrative examples depicting various regions of a substrate, and corresponding fixtures such as a chuck or end effector that can include one or more pressurized gas ports, vacuum ports, or vacuum regions. As mentioned elsewhere, a substrate 4000 can include a glass material or one or more other materials. Generally, for production of flat panel displays, the substrate 4000 can include either a single large display or two or more smaller displays that can be singulated from the substrate 4000. In the illustrative example of FIG. 14A, four display regions 4002A, 4002B, 4002C, and 4002D are shown. These can be referred to as "active" regions or "emitting regions," for example. Use of the term "active" in this example does not somehow imply that such regions are actually optically emissive during processing, but instead refers to regions that can include devices configured to emit light or regions that otherwise form an emissive or transmissive portion of a display that is visible to an end user. Generally, visible defects in the regions 4002A through 4002D will be deemed unacceptable by end users, and accordingly various techniques can be used such as to enhance a visible uniformity of the regions 4002A through 4002D. Other variations in panel configuration of the substrate 4000 are possible. For example, a substrate 4000 can include a single display or array of OLED devices. In other examples, the substrate 4000 can be divided up into two, four, or eight regions, such as establishing corresponding perimeters for support, or such as having corresponding distributed porous media regions as mentioned in other examples herein. For other manufacturing examples in which other optical, electrical, or optoelectronic devices are on the substrate and being coated, the definition of "active" can be adjusted to suitably encompass the regions corresponding to those devices.

In an example where the substrate 4000 is supported by direct physical contact, support can be uniform within each of the display regions 4002A through 4002D and can be non-uniform within the region 4004, extending around the periphery of the substrate 4000 as a whole and extends into the interior spaces between each of the display regions 4002A through 4002D. Such a region 4004 can be referred to as a "keep out" area, indicating that emitting or active elements of the display should be kept clear of such non-uniform support regions (or vice versa). For example, one or more "lift pins" can be located in an area as shown illustratively in FIG. 14A, such as in a first region 2124A, a second region 2124B (e.g., in a location between display regions 4002A and 4002B), and an "Nth" region 2124N, and after the substrate is lowered onto the chuck and such lift pins are therefore in the retracted position, the hole into which the lift pin is retracted will represent a gap region in the physical support of the substrate. Alternatively, or in addition, one or more of the locations in the array can instead include a vacuum port, such as to retain the substrate in place and hold it flat and in level physical contact with the chuck surface. For example, one or more lift pins can be used to raise or lower the substrate relative to a chuck before or after processing, and one or more vacuum ports can be used to retain the substrate during processing.

As in other examples, the substrate can be supported by a cushion of gas. For example, in FIG. 14A, the chuck may comprise a continuous array of small pressure apertures, or a continuous porous plate, providing a continuous flow of pressurized gas on which the substrate can float. Holes can still be provided in the chuck surface, such as 2124A and 2124B, for example, for lift pins (which when retracted sit below the chuck surface), but because the substrate floats above the chuck surface, the presence of mura or non-uniformity in the coated over such holes can be reduced or eliminated. In this way, even the interior regions in between regions 4002A through 4002D may be utilized as active regions, improve productivity and enabling the manufacture of a larger continuous active device. As in yet other examples, a combination of pressurized gas ports and vacuum ports can be used, such as shown in the illustrative example of FIGS. 14B through 14D. For example, in the top view of FIG. 14B or the side view of FIG. 14C, the substrate 4000 can be retained such as by one or more vacuum ports (e.g., circular ports, or slots, for example) such as in the regions 2124A through 2124N as shown in region 4004 of FIG. 14B. Such a region 4004 can again include a periphery of a substrate 4000. In an illustrative example, physical contact between the substrate 4000 and any fixtures can generally be restricted to such a periphery region 4004 during certain processing operations, such as during one or more of a deposition operation (e.g., printing of a material on substrate 4000), a holding operation, a material flow or dispersal operation, or a heat or ultraviolet treatment operation. Such operations can be included as at least a portion of a thin film encapsulation (TFE) process, where the substrate 4000 may be susceptible to creation of imperfections or visible defects Such a region 4004 can, for example, extend inward from the edges of the substrate by 100 millimeters or 200 millimeters. Elsewhere, the substrate can be supported at least in part in the region 4002 using one or more pressurized gas ports 2106A through 2106N. Such a combination of vacuum ports and pressurized gas ports can avoid imparting undue stress on a large substrate 4000 because the substrate can be supported physically in the periphery region 4004, and supported at least in part by pressurized gas in the central region 4002. In this manner, it does not matter whether the substrate 4000 includes a single large display being fabricated, or several smaller displays. Therefore, a common fixture 2120 configuration can be used for a variety of different display configurations because such a fixture 2120 can restrict contact to the peripheral region 4004 of the substrate 4000 while supporting the substrate 4000 elsewhere (e.g., centrally) with pressurized gas. In an example where the fixture 2120 serves as a chuck, one or more of the regions 2124A through 2124N can include a lift pin instead of a vacuum port, or in addition to a vacuum port, such as to lift the substrate 4000 to allow clearance under the substrate for manipulation by a handler. In addition, a flow of pressurized gas can be modulated at one or more of the gas ports 2106A through 2106N, such as to assist in supporting or lifting the substrate for or during manipulation. In another approach, the combination of gas ports 2106A through 2106N can be used to assist in "floating" the substrate for conveyance to other equipment, as mentioned in other examples.

Figure 14A:
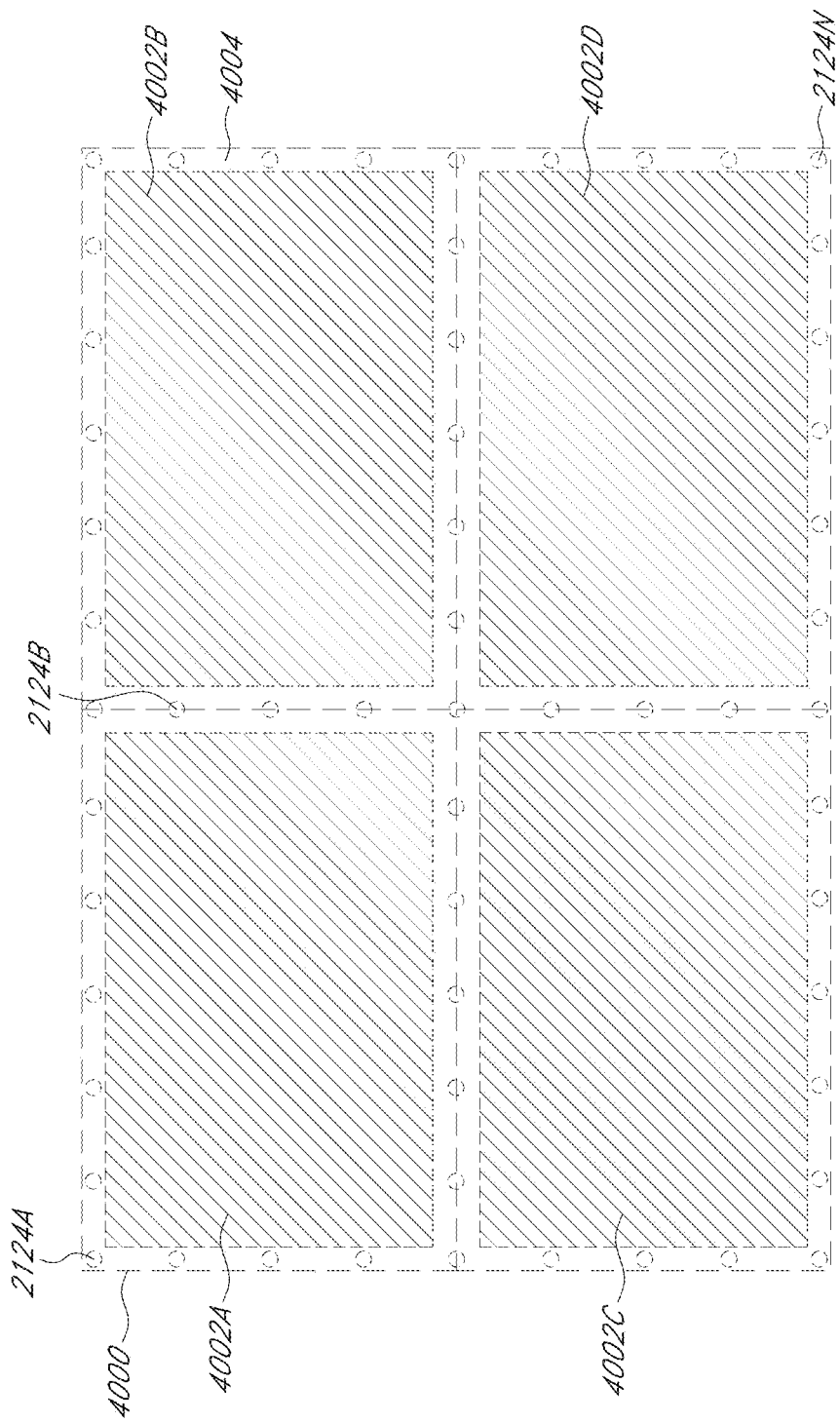
Figure 14D:
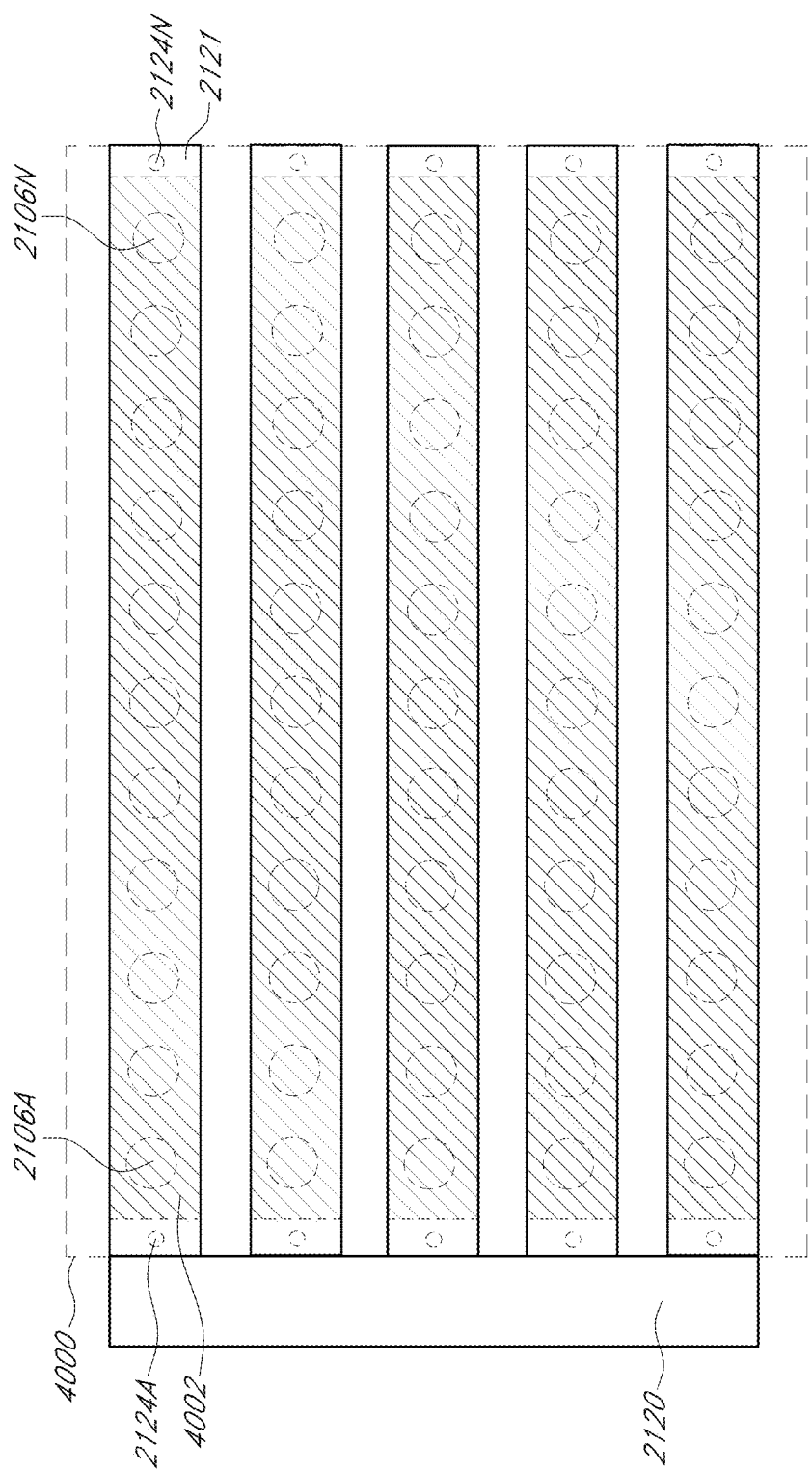

FIG. 14D illustrates generally that the combination of pressurized gas and vacuum ports need not be restricted to a static chuck configuration as shown in FIG. 14B. For example, an end effector of a handler can include a combination of pressurized gas ports 2106A through 2106N, and vacuum ports in the regions 2124A through 2124N. The side view of FIG. 14C can also describe a side view of one of the "tines" of the forked end effector configuration shown in FIG. 14D. Such an end effector can be used to manipulate the substrate 4000 without physically contacting the substrate 4000 in regions other than the region 4004.

Figure 15A:
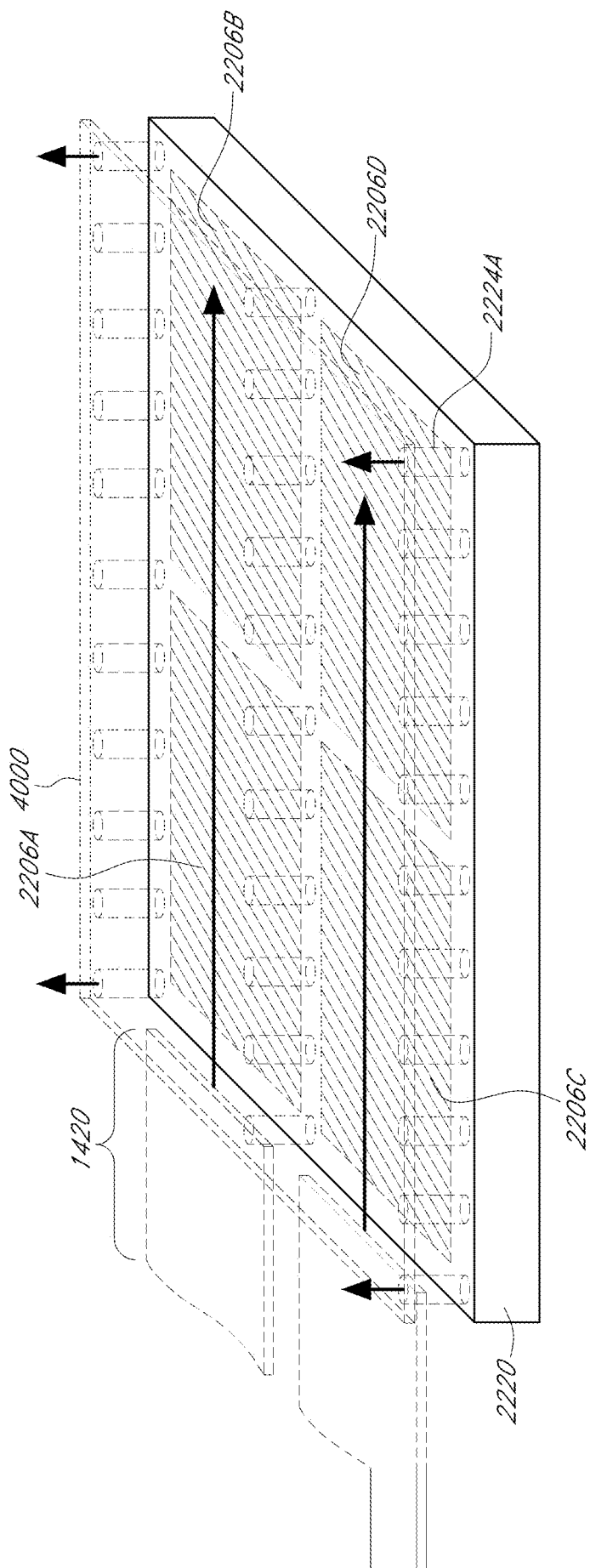
FIG. 15A and FIG. 15B illustrate generally illustrative examples of a chuck configuration that can include a combination of one or more mechanical support pins and one or more vacuum regions.
Figure 15B:
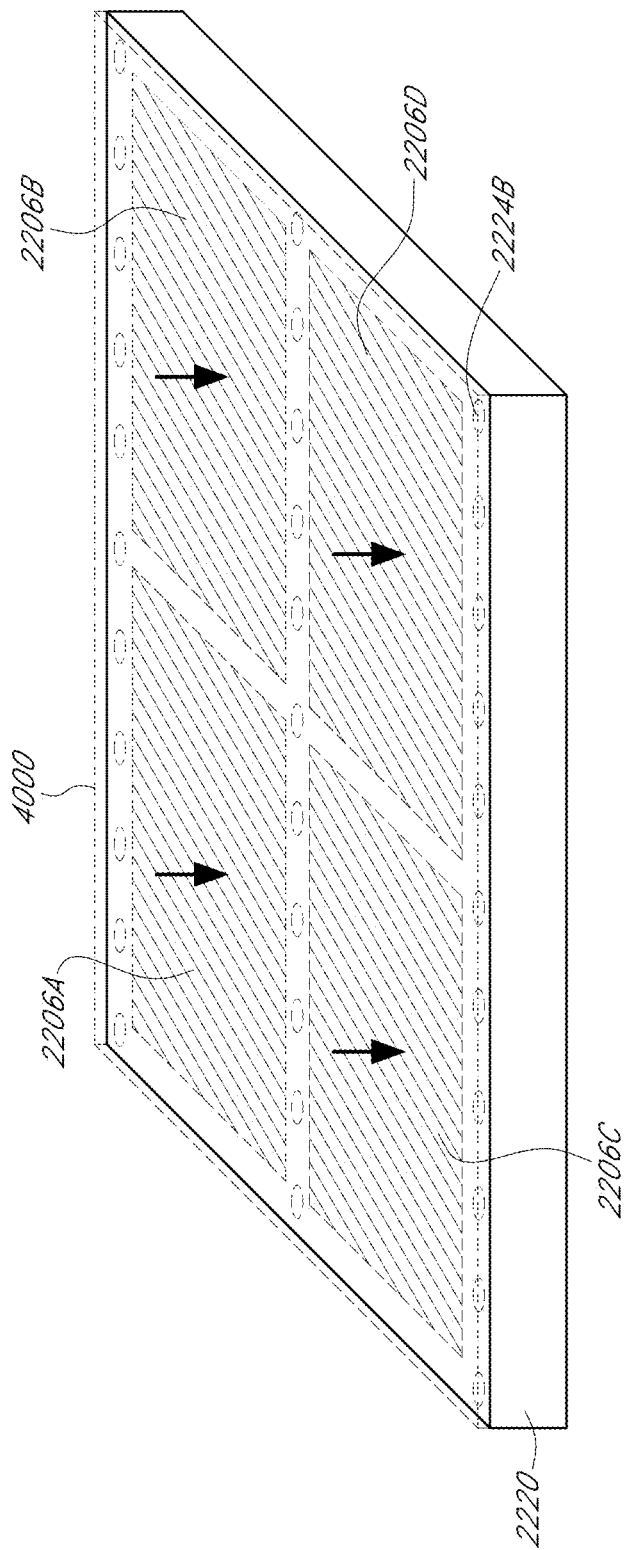

Alternatively, or in addition to the examples above, a distributed vacuum region can be established such as aligned with one or more of the regions 4002A through 4002D or 4002 of FIGS. 14A through 14C, such as shown and discussed in the illustrative examples of FIGS. 15A and 15B, to assist in retaining and maintaining a planar configuration of the substrate 4000. As discussed below, such a distributed vacuum region can include using a porous material such as a carbon or ceramic material, sintered glass, or some other material such as can include a pore size of less than 1 micrometer or even less than 0.5 micrometers in diameter. Such a small pore size can suppress formation of visible mura that would otherwise be present if large vacuum ports were used in the regions 4002A through 4002D, such as discussed in relation to FIGS. 14A and 14B, above, and elsewhere herein. In another example, such as mentioned in relation to FIG. 5, a gas cushion established by a pressurized gas can be used at least in part to support the substrate such as within the display regions 4002A through 4002D, such as to avoid formation of visible defects during a holding, a material flow or dispersal operation or an ultraviolet treatment operation, or during other production processes. Such an example is illustrated generally in FIGS. 16A and 16B.

FIG. 15A and FIG. 15B illustrate generally illustrative examples of a chuck configuration that can include a combination of one or more mechanical support pins and one or more vacuum regions. Similar to the example of FIG. 14A, and other examples discussed elsewhere herein, a chuck 2220 can include one or more mechanical support pins (e.g., including an extended lift pin 2224A). The mechanical support pins can include an extended configuration and a retracted configuration, such as actuated pneumatically, hydraulically, or electrically. As discussed in relation to FIG. 14A and elsewhere, the mechanical support pins can be located in regions other than the active areas of one or more displays, in the case that substrate is supported via physical contact (whereas in contrast, one of the benefits of using a floatation support mechanism is the ability to achieve mura free coatings even over lift pin holes). In the example of FIG. 15A, the mechanical support pins, including the extended lift pin 2224A, can illustrate generally an extended configuration, such as displacing a substrate 4000 vertically. Such a configuration can allow a gap under the substrate 4000, such as to accommodate manipulation of the substrate by one or more end effectors, such as forked end effector 1420. The end effector 1420 can include grooves, slots, other features, or can otherwise be sized and shaped to avoid interference with one or more of the mechanical support pins when the pins are in the extended configuration.

After the substrate 4000 is manipulated into place, the one or more mechanical support pins can be retracted, such as to a location flush or below flush with a surface of the chuck 2220, such as shown in FIG. 15B, including a retracted lift pin 2224B. In some examples, the substrate 4000 can be further processed without further retention or anchoring. However, during certain operations, such as during one or more of deposition, a holding operation, a material flow/dispersing operation, or other treatment (e.g., ultraviolet treatment) of an organic encapsulation layer (or other layers) on the substrate 4000, one or more of vacuum ports or distributed vacuum regions can be used, such as to assist in maintaining the substrate in a planar configuration. For example, one or more distributed (e.g., porous) vacuum regions can be included as a portion of the chuck 2220, such as including regions 2206A, 2206B, 2206C, and 2206D.

Unlike larger vacuum ports, or mechanical support pins, such regions 2206A through 2206D can be located directly below portions of the substrate 4000 where "active" or "emitting" regions are being fabricated. Such distributed vacuum regions can reduce or suppress formation of visible defects in one or more layers being deposited or otherwise formed on the substrate 4000, because such distributed vacuum regions avoid the abrupt changes in thermal characteristics (e.g., thermal conductivity) presented by other types of structures, such as discussed above in relation to FIGS. 13A and 13B. Without being bound by theory, it is believed that the use of the chuck structures shown herein, such as a distributed vacuum region provided by a porous medium, can also enhance uniformity of a coating or film layer deposited on the substrate 4000 such as providing a uniform electrostatic coupling or field between the substrate 4000 and the porous regions 2206A, 2206B, 2206C, and 2206D.

Figure 16A:
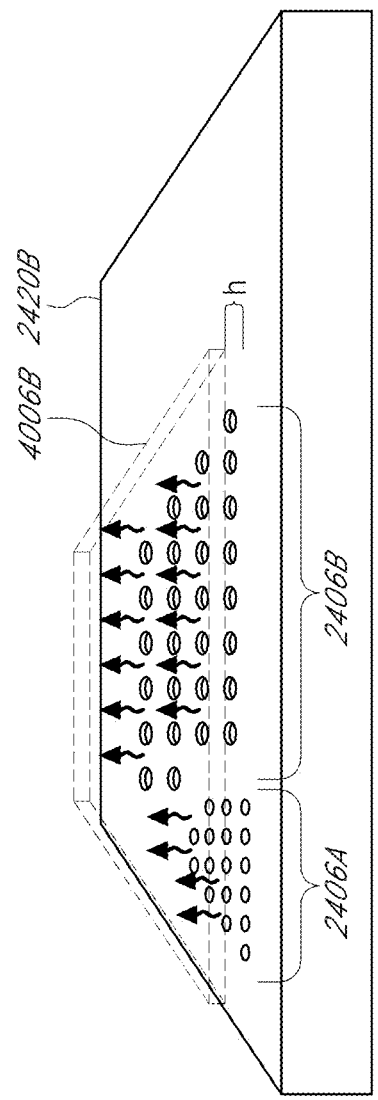
FIG. 16A and FIG. 16B, by contrast with FIGS. 13A and 13B, include illustrative examples of a chuck configuration that can include ports configured to establish a pressurized gas cushion to support a substrate in FIG. 16A, such as during one or more of a deposition (e.g., printing), holding, or cure process, and a corresponding uniformity in the resulting substrate in FIG. 16B.
Figure 16B:
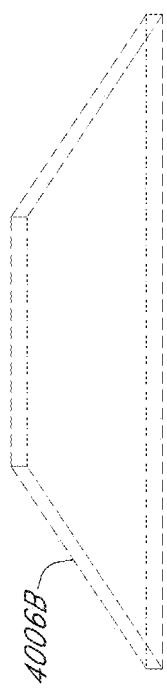

As mentioned above, in one approach mechanical features such as lift pins or vacuum ports can be confined to a region peripheral to active or emitting areas of individual displays included in the substrate 4006A. However, such an approach can have disadvantages. For example, if processing equipment is to be used for multiple substrate shapes, sizes, and display configurations, tool change-outs of the chuck 2420A might be necessary depending on an arrangement of "keep out" regions. FIGS. 16A and 16B, by contrast with FIGS. 13A and 13B, illustrate generally examples of a chuck 2420B configuration that includes ports configured to establish a pressurized gas cushion to support a substrate 4006B in FIG. 16A, such as during one or more of a deposition, a holding operation, a material dispersing or flowing operation, or cure process, and a corresponding uniformity in the resulting substrate in FIG. 16B. In this approach, because the substrate 4006B is not required to contact thermally-non-uniform features of the chuck 24208 during various processes, a substrate 4006B as shown in FIG. 16B can avoid the large and highly-visible mura produced by the features shown FIG. 13A. Different port configurations can be used, such as having a first port density in the region 2406A, and a second port density in the region 2406B. As mentioned in other examples herein, a fly height, "h" can be established such as by using a combination of vacuum and pressurized gas ports, such as in the arrays of the regions 2406A and 2406B. For example, in each row of ports, the ports can alternate between being assigned as a vacuum port or a pressurized gas port. In this manner, precise control of the height, h, can be established and the substrate 4006B can be stabilized in the z-dimension with respect to the chuck surface. As in other examples herein, a combination of mechanical anchoring and pressurized gas can also be used. For example, lateral motion of the substrate 4006B (e.g., in a direction parallel a surface of the chuck) can be limited, such as by using one or more lateral stops or bumpers.

Figure 16C:
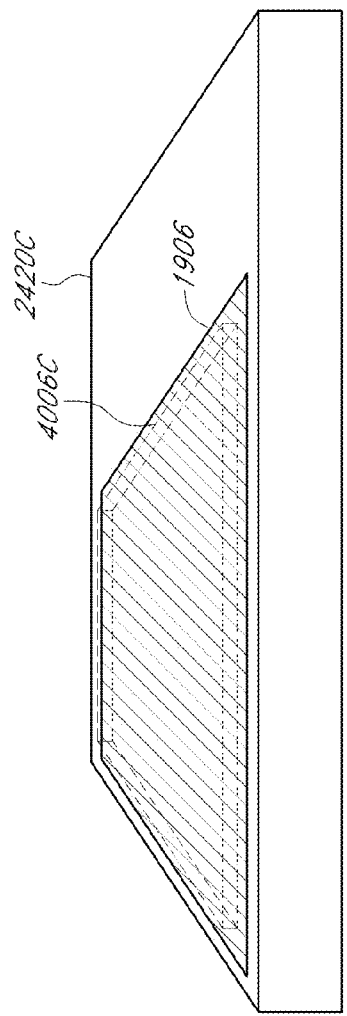
FIGS. 16C and 16D, by contrast with FIGS. 13A and 13B, illustrate generally illustrative examples of a chuck configurations that include a porous medium, such as to establish a distributed vacuum or pressurized gas cushion during one or more of a deposition (e.g., printing), holding, material flow or dispersal, or cure process, such as providing uniformity in the resulting substrate as shown in FIG. 16E.
Figure 16D:
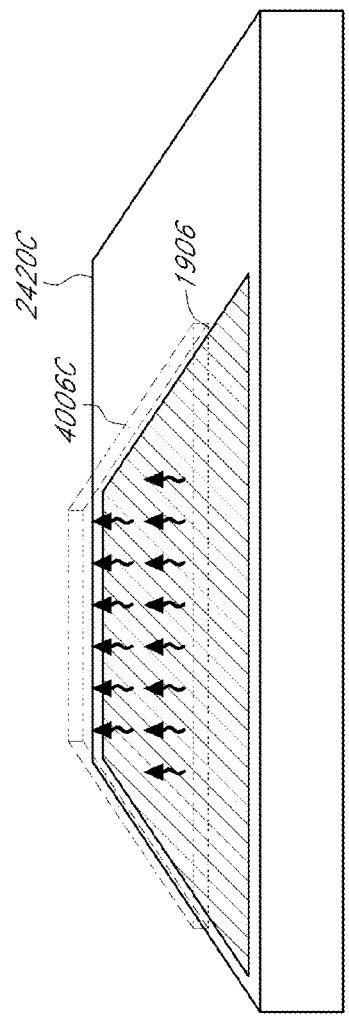
Figure 16E:
FIG. 16E illustrates generally and illustrative example of a resulting substrate, such as can be provided using a chuck configuration shown in FIG. 16C or FIG. 16D.

FIGS. 16C and 16D, by contrast with FIGS. 13A and 13B, illustrate generally examples of a chuck configuration that includes a porous medium 1906, such as to establish a distributed vacuum (in FIG. 16C) or distributed pressure during one or more of a deposition, a holding operation, a material dispersing or flowing operation, or curing process, such as providing uniformity in the resulting substrate as shown in FIG. 16E. As mentioned in relation to other examples herein, a porous medium 1906 "plate" such as coupled to or included as a portion of a chuck 2420C can provide a "distributed" vacuum to securely hold the substrate 4006C during processing, or a pressurized gas cushion to support the substrate 4006C, such as without using large apertures as shown in FIG. 13A, and providing a substrate 4006C as shown in FIG. 16E having reduced or minimize the formation of mura or other visible defects. As mentioned in relation to other examples herein, a porous medium 1906 "plate" such as coupled to or included as portion of a chuck 2420C can provide a "distributed" pressure to uniformly float the substrate 4006C during processing, such as without using individual apertures as shown in FIG. 16A.

A porous medium 1906 as mentioned in relation to FIG. 15A, 16C, 16D, or similar distributed pressure or vacuum regions as mentioned elsewhere herein, can be obtained such as from Nano TEM Co., Ltd. (Niigata, Japan), such as having physical dimensions specified to occupy an entirety of the substrate 4006C, or specified regions of the substrate such as display regions or regions outside display regions. Such a porous medium can include a pore size specified to provide a desired vacuum holding force over a specified area, while reducing or eliminating mura or other visible defect formation such as during holding, curing, or material dispersal or flowing operations. As mentioned above, without being bound by theory it is believed that use of a porous medium can enhance uniformity of a coating or film layer on the substrate 4006C, such as by reducing or minimizing mura or other visible defects associated with non-uniform thermal profile or electrostatic field profiled across the surface of the substrate, or on a surface opposite the coating or film layer. Alternatively, a porous medium can be coupled to a pneumatic supply, such as to provide a gas cushion, or various porous media regions can be coupled to a pneumatic supply and a vacuum supply, respectively, to provide a gas cushion having a controlled "fly height," such as in one or more specified zones as mentioned in FIG. 19C. When such porous medium is utilized to provide a distributed vacuum to hold down the substrate on the chuck surface, the presence of holes for lift pins can still provide non-uniformity and can therefore include placement of such holes so as to avoid impacting the active regions of the substrate. When such porous medium is used to provide a distributed pressure supply to float the substrate above the chuck surface, the presence of holes for lift pins (e.g., for retracted lift pins) need not cause non-uniformity, therefore making a greater portion of the substrate area available for the active regions.

The chuck configurations discussed in the examples of FIG. 5, FIG. 6, FIG. 14A, FIG. 14B, FIG. 14C, FIG. 14D, FIG. 15A, FIG. 16A, 16C, 16D, and other examples herein can be used in a variety of operations. For example, such chuck configurations can be included as a portion of an enclosed printing module, a holding module, a transfer module, a curing module such as including one or more ultraviolet treatment regions, or in modules configured to perform a combination of such operations, such as within an environment having specified particulate contamination levels and a specified reactive species contamination level.

As in other examples shown and described herein, one or more of the modules shown in the systems 1000A, 1000B, 3000A, or 3000B, or in other examples can include shared or dedicated gas purification and monitoring facilities, temperature control facilities, or particulate control facilities. For example, each module can include one or more gas purification loops, fan filter units, or temperature controllers. A controlled environment in a respective module can be contiguous (e.g., fluidically coupled) to an adjacent module, or the modules can include controlled environments that can be isolated from one another, such as for enhanced control of gas purity, temperature, particulate levels, or maintenance of a particular module.

For redundancy or maintenance, such as systems can include valving or gates such as to isolate an environment in one or more modules from one or more other modules, such as to facilitate maintenance of temperature control, gas purification, solvent abatement, or particulate control systems without requiring dumping or purging of the controlled environment contained in other modules, or without substantially altering an environment contained in other modules.

An environment within or surrounding the fabrication systems discussed elsewhere in this document herein can include illumination selected to avoid or suppress degradation of the materials used in fabrication or the devices being fabricated. Also, various examples described in this document can refer to gas-filled enclosures, such as providing a controlled environment having one or more of a specified temperature, impurity level, or particulate level.

According to various examples, different light sources can be used in lighting elements to illuminate interior portions of the systems shown and described herein or to illuminate other regions, such as for visualization of portions of the system by operators or machine vision systems. A number or a grouping of lighting elements can be selected in a variety of manners, for use within or surrounding the systems shown and described elsewhere herein. For example, one or more lighting elements can be mounted flat, or in an adjustable manner to provide a variety of lighting positions or illumination angles. The placement of lighting elements need not be limited to a ceiling location, and such lighting elements can be located on other interior or exterior surfaces of the systems shown and described herein.

The lighting elements can comprise any number, type, or combination of lights, for example, halogen lights, white lights, incandescent lights, arc lamps, or light emitting diodes or devices (LEDs). In an illustrative example, a lighting element can include from 1 LED to about 100 LEDs, from about 10 LEDs to about 50 LEDs, or greater than 100 LEDs. LED or other lighting devices can emit any color or combination of colors in the visible color spectrum, outside the visible color spectrum, or a combination thereof.

Some materials that can be used in OLED device fabrication, such as in a printing system, can be sensitive to some wavelengths of light. Accordingly, a wavelength of light for lighting elements installed in or used to illuminate an OLED fabrication system can be selected to suppress or eliminate material degradation during processing. For example, a 4× cool white LED can be used, as can a 4× yellow LED, or any combination thereof. An example of a 4× cool white LED can include part number LF1B-D4S-2THWW4 available from IDEC Corporation of Sunnyvale, Calif. An example of a 4× yellow LED can include part number LF1B-D4S-2SHY6, also available from IDEC Corporation. LEDs or other lighting elements can be positioned or hung from any position on any interior portion of a ceiling frame or on another surface of an OLED fabrication system. Lighting elements are not limited to LEDs, and other types of lighting elements or combinations of lighting elements can be used.

Figure 17:
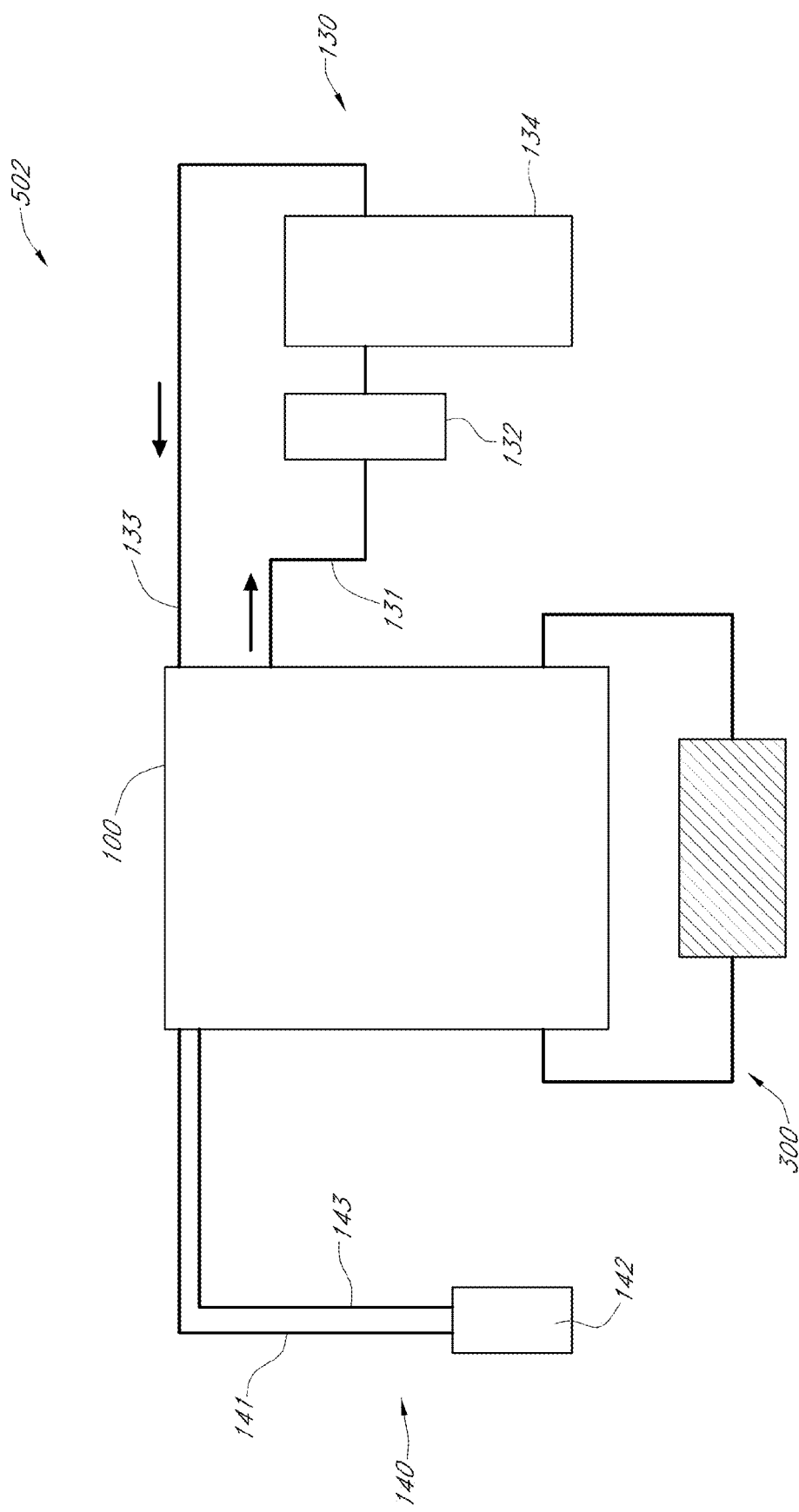
FIG. 17 illustrates generally a schematic representation of a gas purification scheme that can be used in relation to portions or entireties of one or more other examples described herein, such as to establish or maintain an controlled environment in an enclosure housing fabrication equipment used in manufacturing a light emitting device (e.g., an OLED device).

FIG. 17 illustrates generally a schematic representation of a gas purification scheme that can be used in relation to portions or entireties of one or more other examples described herein, such as to establish or maintain an controlled environment in an enclosure housing fabrication equipment used in manufacturing a light emitting device (e.g., an OLED device). For example, a gas enclosure system 502 can include a gas enclosure assembly 100 (e.g., an enclosure having a controlled environment), a gas purification loop 130 in fluid communication with the gas enclosure assembly 100, and a thermal regulation system 140 (e.g., as can be referred to as a temperature controller in other examples herein).

The system 502 can include a pressurized gas recirculation system 300, which can supply gas for operating various devices, such as a substrate flotation table or other pressurized-gas devices, such as for an OLED printing system. The pressurized gas recirculation system 300 can include or use a compressor, a blower, or both. Additionally, the gas enclosure system 502 can have a circulation and filtration system internal to gas enclosure system 502 (e.g., one or more fan filter units (FFUs) as described in other examples herein).

One or more ducts or baffles can separate non-reactive gas circulated through the gas purification loop 130 from the non-reactive gas that is otherwise filtered and circulated internally for various embodiments of a gas enclosure assembly. For example, the gas purification loop 130 can include an outlet line 131 from the gas enclosure assembly 100. A solvent removal component 132 can be provided, for solvent abatement, and gas to be purified can be routed from the solvent removal component 132 to a gas purification system 134. Gas purified of solvent and other reactive gas species, such as one or more of ozone, oxygen, and water vapor, can be circulated back to the gas enclosure assembly 100, such as through an inlet line 133.

The gas purification loop 130 can include appropriate conduits and connections such as to interface with monitoring or control devices. For example, ozone, oxygen, water vapor, or solvent vapor sensors can be included. A gas circulating unit, such as a fan, blower, or other arrangement, can be separately provided or integrated, for example, in gas purification system 134, such as to circulate gas through the gas purification loop 130. In the illustration of FIG. 17, the solvent removal component 132 and gas purification system 134 are shown as separate units. However, the solvent removal component 132 and gas purification system 134 can be housed together as a single unit.

The gas purification loop 130 of FIG. 17 can have solvent removal component 132 placed upstream of gas purification system 134, so that gas circulated from gas enclosure assembly 100 can pass through solvent removal component 132, such as via an outlet line 131. In an example, the solvent removal component 132 can include a solvent trapping system based on adsorbing solvent vapor from a gas passing through the solvent removal component 132. For example, a bed or beds of a sorbent, such as activated charcoal, molecular sieves, or the like, can effectively remove a wide variety of organic solvent vapors. In another example, a cold trap technology can be used to remove solvent vapors as a portion of the solvent removal component 132. Sensors, such as ozone, oxygen, water vapor and solvent vapor sensors, can be used to monitor the removal of such species from gas continuously circulating through a gas enclosure system, such as gas enclosure system 502. For example, information obtained from such sensors or other devices can indicate when sorbent, such as activated carbon, molecular sieves, or the like, have reached capacity or have otherwise become less effective, so that the bed or beds of sorbent can be regenerated or replaced, for example.

Regeneration of a molecular sieve can involve heating the molecular sieve, contacting the molecular sieve with a forming gas, a combination thereof, or the like. For example, molecular sieves configured to trap various species, including ozone, oxygen, water vapor, or solvents, can be regenerated by heating and exposure to a forming gas. In an illustrative example, such a forming gas can include hydrogen, for example, a forming gas comprising about 96% nitrogen and about 4% hydrogen, with said percentages being by volume or by weight. Physical regeneration of activated charcoal can be done using a procedure of heating under a controlled environment.

A portion of the gas purification system 134 of the gas purification loop 130 can include systems available, for example, from MBRAUN Inc., of Statham, N.H., or Innovative Technology of Amesbury, Mass. The gas purification system 134 can be used to purify one or more gases in gas enclosure system 502, for example, to purify the entire gas atmosphere within a gas enclosure assembly. As mention above, in order to circulate gas through gas purification loop 130, the gas purification system 134 can have a gas circulating unit, such as a fan or blower, for example. A gas purification system can be selected or configured depending on the volume of the enclosure, which can define a volumetric flow rate for moving a non-reactive gas through a gas purification system. In an illustrative example, a gas enclosure system having a gas enclosure assembly can include a volume of about 4 cubic meters and a gas purification system that can move about 84 cubic meters per hour can be used. In another illustrative example, a gas enclosure system having a gas enclosure assembly can include a volume of about 10 cubic meters and a gas purification system that can move about 155 cubic meters per hour can be used. In yet another illustrative example, a gas enclosure assembly having a volume of between about 52 to about 114 cubic meters, more than one gas purification system can be used.

Gas filters, dryers, or other purifying devices can be included in the gas purification system 134. For example, a gas purification system 134 can include two or more purifying devices, such as in a parallel configuration or otherwise arranged such that one of the devices can be taken off line for maintenance and one or more other devices can be used to continue system operation without interruption. For example, the gas purification system 134 can comprise one or more molecular sieves, such as at least a first molecular sieve and a second molecular sieve, such that, when one of the molecular sieves becomes saturated with impurities, or otherwise is deemed not to be operating efficiently enough, the system can switch to the other molecular sieve while regenerating the saturated or non-efficient molecular sieve. A control unit can be provided for determining the operational efficiency of each molecular sieve, for switching between operation of different molecular sieves, for regenerating one or more molecular sieves, or for a combination thereof. As previously mentioned, molecular sieves can be regenerated and reused.

The thermal regulation system 140 of FIG. 17 can include at least one chiller 142, which can have a fluid outlet line 141 for circulating a coolant into a gas enclosure assembly, and fluid inlet line 143 for returning the coolant to the chiller. An at least one fluid chiller 142 can be provided for cooling the gas atmosphere within gas enclosure system 502. For example, the fluid chiller 142 can deliver cooled fluid to heat exchangers within the enclosure, where gas can be passed over a filtration system internal the enclosure. At least one fluid chiller can also be provided with gas enclosure system 502 to cool heat evolving from an apparatus enclosed within gas enclosure system 502. In an illustrative example, a fluid chiller can also be provided for gas enclosure system 502 to cool heat evolving from an OLED printing system. The thermal regulation system 140 can include heat-exchange or Peltier devices and can have various cooling capacities. For example, a chiller can provide a cooling capacity of from between about 2 kilowatts (kW) to about 20 kW of capacity.

According to various examples, the gas enclosure system 502 can have a plurality of fluid chillers that can chill one or more fluids. A fluid chiller can use various fluids as a heat transfer medium, for example, such as water, anti-freeze, a refrigerant, or combination thereof. Leak-free, locking connections can be used in connecting the associated conduits and system components.

While the examples above mentioning cooling capacities and chilling applications, the examples above can also be applied to applications where including buffering of substrates in a controlled environment, or for applications where circulating gas can be maintained at a temperature similar to other portions of the system, such as to avoid unwanted heat transfer from substrates being fabricated or to avoid disruption of temperature uniformity across a substrate or between substrates.

Figure 18A:
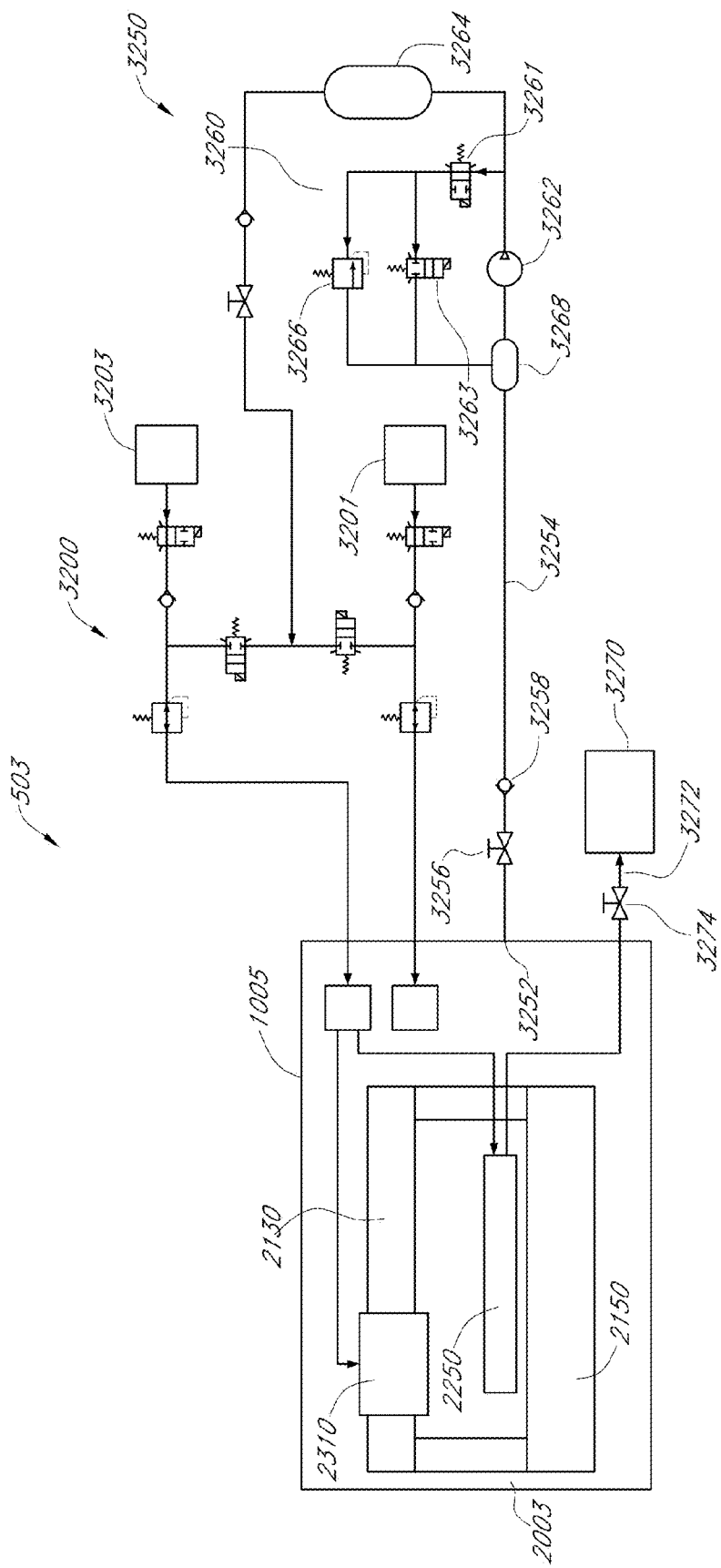
FIGS. 18A and 18B illustrate generally examples of a gas enclosure system for integrating and controlling non-reactive gas and clean dry air (CDA) sources such as can be used to establish the controlled environment referred to in other examples described elsewhere herein, and such as can include a supply of pressurized gas for use with a floatation table.
Figure 18B:
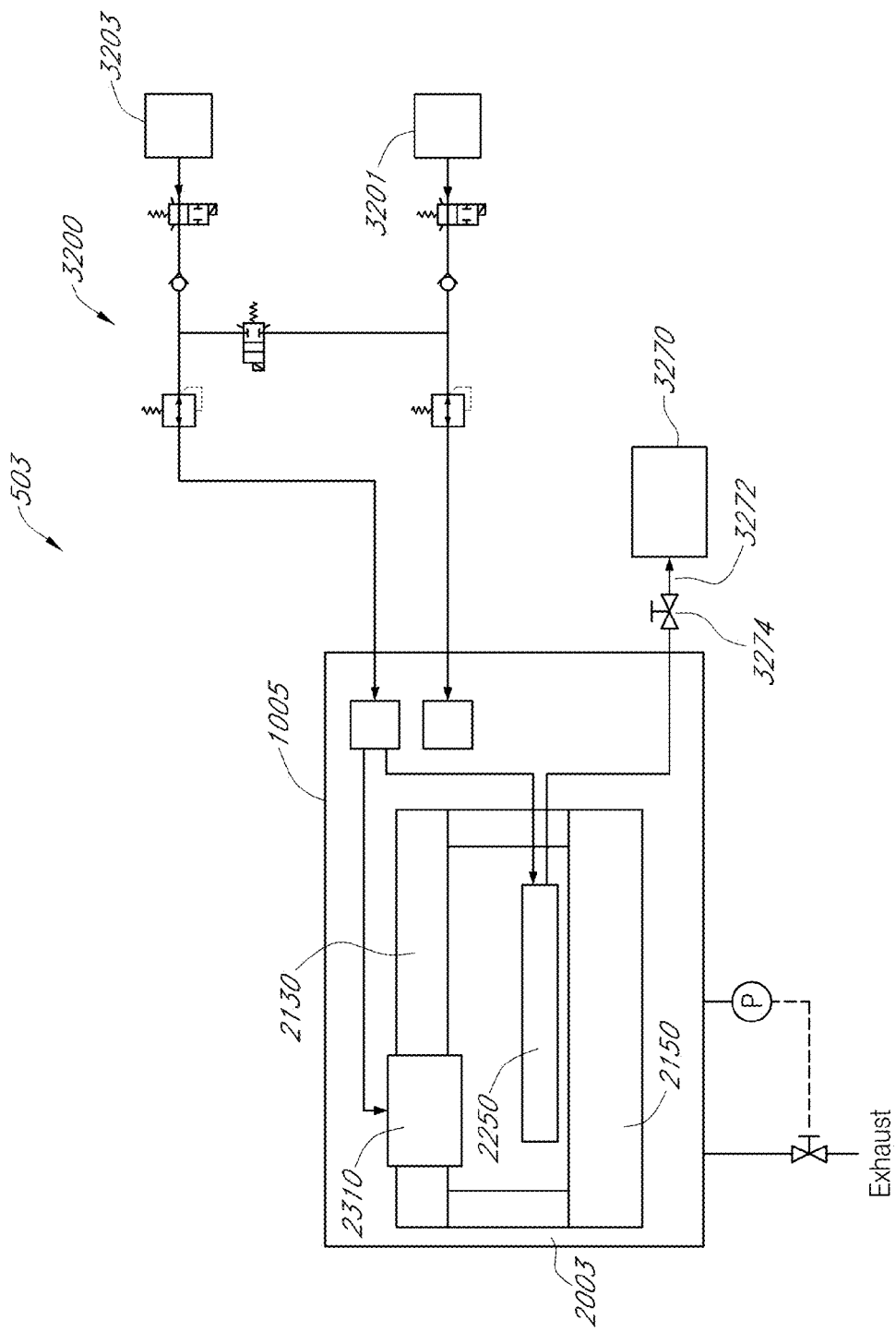

FIGS. 18A and 18B illustrate generally examples of a gas enclosure system for integrating and controlling non-reactive gas and clean dry air (CDA) sources such as can be used to establish the controlled environment referred to in other examples described elsewhere herein, and such as can include a supply of pressurized gas for use with a floatation table. FIGS. 19A and 19B illustrate generally examples of a gas enclosure system for integrating and controlling non-reactive gas and clean dry air (CDA) sources such as can be used to establish the controlled environment referred to in other examples described elsewhere herein, and such as can include a blower loop to provide, for example, pressurized gas and at least partial vacuum for use with a floatation table. FIG. 19C illustrates generally a further example of a system for integrating and controlling one or more gas or air sources, such as to establish floatation control zones included as a portion of a floatation conveyance system.

Various examples described herein include enclosed modules that can be environmentally-controlled. Enclosure assemblies and corresponding support equipment can be referred to as a "gas enclosure system" and such enclosure assemblies can be constructed in a contoured fashion that reduces or minimizes an internal volume of a gas enclosure assembly, and at the same time provides a working volume for accommodating various footprints of OLED fabrication system components, such as the deposition (e.g., printing), holding, loading, or treatment modules described herein. For example, a contoured gas enclosure assembly according to the present teachings can have a gas enclosure volume of between about 6 m$^3$ to about 95 m$^3$ for various examples of a gas enclosure assembly of the present teachings covering, for example, substrate sizes from Gen 3.5 to Gen 10. Various examples of a contoured gas enclosure assembly according to the present teachings can have a gas enclosure volume of, for example, but not limited by, of between about 15 m$^3$ to about 30 m$^3$, which might be useful for OLED printing of, for example, Gen 5.5 to Gen 8.5 substrate sizes or other substrate sizes. Various examples of an auxiliary enclosure can be constructed as a section of gas enclosure assembly and readily integrated with gas circulation and filtration, as well as purification components to form a gas enclosure system that can sustain a controlled, substantially low-particle environment for processes requiring such an environment.

As shown in FIG. 18A and FIG. 19A, various examples of a gas enclosure system can include a pressurized non-reactive gas recirculation system. Various examples of a pressurized gas recirculation loop can utilize a compressor, a blower and combinations thereof. According to the present teachings, several engineering challenges were addressed in order to provide for various examples of a pressurized gas recirculation system in a gas enclosure system. First, under typical operation of a gas enclosure system without a pressurized non-reactive gas recirculation system, a gas enclosure system can be maintained at a slightly positive internal pressure (e.g., above atmospheric pressure) relative to an external pressure in order to safeguard against outside gas or air from entering the interior should any leaks develop in a gas enclosure system. For example, under typical operation, for various examples of a gas enclosure system of the present teachings, the interior of a gas enclosure system can be maintained at a pressure relative to the surrounding atmosphere external to the enclosure system, for example, of at least 2 mbarg, for example, at a pressure of at least 4 mbarg, at a pressure of at least 6 mbarg, at a pressure of at least 8 mbarg, or at a higher pressure.

Maintaining a pressurized gas recirculation system within a gas enclosure system can be challenging, as it presents a dynamic and ongoing balancing act regarding maintaining a slight positive internal pressure of a gas enclosure system, while at the same time continuously introducing pressurized gas into a gas enclosure system. Further, variable demand of various devices and apparatuses can create an irregular pressure profile for various gas enclosure assemblies and systems of the present teachings. Maintaining a dynamic pressure balance for a gas enclosure system held at a slight positive pressure relative to the external environment under such conditions can provide for the integrity of an ongoing OLED fabrication process. For various examples of a gas enclosure system, a pressurized gas recirculation system according to the present teachings can include various examples of a pressurized gas loop that can utilize at least one of a compressor, an accumulator, and a blower, and combinations thereof. Various examples of a pressurized gas recirculation system that include various examples of a pressurized gas loop can have a specially designed pressure-controlled bypass loop that can provide internal pressure of a non-reactive gas in a gas enclosure system of the present teachings at a stable, defined value. In various examples of a gas enclosure system, a pressurized gas recirculation system can be configured to re-circulate pressurized gas via a pressure-controlled bypass loop when a pressure of a gas in an accumulator of a pressurized gas loop exceeds a pre-set threshold pressure. The threshold pressure can be, for example, within a range from between about 25 psig to about 200 psig, or more specifically within a range of between about 75 psig to about 125 psig, or more specifically within a range from between about 90 psig to about 95 psig. In that regard, a gas enclosure system of the present teachings having a pressurized gas recirculation system with various examples of a specially designed pressure-controlled bypass loop can maintain a balance of having a pressurized gas recirculation system in an hermetically sealed gas enclosure.

According to the present teachings, various devices and apparatuses can be disposed in the interior of a gas enclosure system and in fluid communication with various examples of a pressurized gas recirculation system. For various examples of a gas enclosure and system of the present teachings, the use of various pneumatically operated devices and apparatuses can provide low-particle generating performance, as well as being low maintenance. Exemplary devices and apparatuses that can be disposed in the interior of a gas enclosure system and in fluid communication with various pressurized gas loops can include, for example, but not limited by, one or more of a pneumatic robot, a substrate floatation table, an air bearing, an air bushing, a compressed gas tool, a pneumatic actuator, and combinations thereof. A substrate floatation table, as well as air bearings can be used for various aspects of operating an OLED printing system in accordance with various examples of a gas enclosure system of the present teachings. For example, a substrate floatation table utilizing air-bearing technology can be used to transport a substrate into position in a printhead chamber, as well as to support a substrate during an OLED printing process.

For example, as shown in FIG. 18A, FIG. 18B, FIG. 19A, and FIG. 19B, various examples of gas enclosure system 503 and gas enclosure system 504 can have external gas loop 3200 for integrating and controlling a non-reactive gas source 3201 and clean dry air (CDA) source 3203 for use in various aspects of operation of gas enclosure system 503 and gas enclosure system 504. Gas enclosure system 503 and gas enclosure system 504 can also include various examples of an internal particle filtration and gas circulation system, as well as various examples of an external gas purification system, as previously described. Such examples of a gas enclosure system can include a gas purification system for purifying various reactive species from a gas. Some commonly used non-limiting examples of a non-reactive gas can include nitrogen, any of the noble gases, and any combination thereof. Various examples of a gas purification system according to the present teachings can maintain levels for each species of various reactive species, including various reactive atmospheric gases, such as water vapor, oxygen, ozone, as well as organic solvent vapors at 1000 ppm or lower, for example, at 100 ppm or lower, at 10 ppm or lower, at 1.0 ppm or lower, or at 0.1 ppm or lower. In addition to external loop 3200 for integrating and controlling gas source 3201 and CDA source 3203, gas enclosure system 503 and gas enclosure system 504 can have compressor loop 3250, which can supply gas for operating various devices and apparatuses that can be disposed in the interior of gas enclosure system 503 and gas enclosure system 504. A vacuum system 3270 can be also be provided, such as in communication with gas enclosure assembly 1005 through line 3272 when valve 3274 is in an open position.

Compressor loop 3250 of FIG. 18A can include compressor 3262, first accumulator 3264 and second accumulator 3268, which are configured to be in fluid communication. Compressor 3262 can be configured to compress gas withdrawn from gas enclosure assembly 1005 to a desired pressure. An inlet side of compressor loop 3250 can be in fluid communication with gas enclosure assembly 1005 via gas enclosure assembly outlet 3252 through line 3254, having valve 3256 and check valve 3258. Compressor loop 3250 can be in fluid communication with gas enclosure assembly 1005 on an outlet side of compressor loop 3250 via external gas loop 3200. Accumulator 3264 can be disposed between compressor 3262 and the junction of compressor loop 3250 with external gas loop 3200 and can be configured to generate a pressure of 5 psig or higher. Second accumulator 3268 can be in compressor loop 3250 for providing dampening fluctuations due to compressor piston cycling at about 60 Hz. For various examples of compressor loop 3250, first accumulator 3264 can have a capacity of between about 80 gallons to about 160 gallons, while second accumulator can have a capacity of between about 30 gallons to about 60 gallons. According to various examples of gas enclosure system 503, compressor 3262 can be a zero ingress compressor. Various types of zero ingress compressors can operate without leaking atmospheric gases into various examples of a gas enclosure system of the present teachings. Various examples of a zero ingress compressor can be run continuously, for example, during an OLED fabrication process utilizing the use of various devices and apparatuses requiring compressed gas.

Accumulator 3264 can be configured to receive and accumulate compressed gas from compressor 3262. Accumulator 3264 can supply the compressed gas as needed in gas enclosure assembly 1005. For example, accumulator 3264 can provide gas to maintain pressure for various components of gas enclosure assembly 1005, such as, but not limited by, one or more of a pneumatic robot, a substrate floatation table, an air bearing, an air bushing, a compressed gas tool, a pneumatic actuator, and combinations thereof. As shown in FIG. 18A for gas enclosure system 503, gas enclosure assembly 1005 can have an OLED printing system 2000 enclosed therein. As schematically depicted in FIG. 18A, printing system 2000 can be supported by printing system base 2150, which can be a granite stage. Printing system base 2150 can support a substrate support apparatus, such as a chuck, for example, but not limited by, a vacuum chuck, a substrate floatation chuck having pressure ports, and a substrate floatation chuck having vacuum and pressure ports. In various examples of the present teachings, a substrate support apparatus can be a substrate floatation table, such as substrate floatation table printing region 2250. Substrate floatation table printing region 2250 can be used for the frictionless support of a substrate. In addition to a low-particle generating floatation table, for frictionless Y-axis conveyance of a substrate, printing system 2000 can have a Y-axis motion system utilizing air bushings.

Additionally, printing system 2000 can have at least one X,Z-axis carriage assembly with motion control provided by a low-particle generating X-axis air bearing assembly. Various components of a low-particle generating motion system, such as an X-axis air bearing assembly, can be used in place of, for example, various particle-generating linear mechanical bearing systems. For various examples of a gas enclosure and system of the present teachings, the use of a variety of pneumatically operated devices and apparatuses can provide low-particle generating performance, as well as being low maintenance. Compressor loop 3250 can be configured to continuously supply pressurized gas to various devices and apparatuses of gas enclosure system 503. In addition to a supply of pressurized gas, substrate floatation table printing region 2250 of inkjet printing system 2000, which utilizes air bearing technology, also utilizes vacuum system 3270, which is in communication with gas enclosure assembly 1005 through line 3272 when valve 3274 is in an open position.

A pressurized gas recirculation system according to the present teachings can have pressure-controlled bypass loop 3260 as shown in FIG. 18A for compressor loop 3250, which acts to compensate for variable demand of pressurized gas during use, thereby providing dynamic balance for various examples of a gas enclosure system of the present teachings. For various examples of a gas enclosure system according to the present teachings, a bypass loop can maintain a constant pressure in accumulator 3264 without disrupting or changing the pressure in enclosure 1005. Bypass loop 3260 can have first bypass inlet valve 3261 on an inlet side of bypass loop, which is closed unless bypass loop 3260 is used. Bypass loop 3260 can also have back pressure regulator 3266, which can be used when second valve 3263 is closed. Bypass loop 3260 can have second accumulator 3268 disposed at an outlet side of bypass loop 3260. For examples of compressor loop 3250 utilizing a zero ingress compressor, bypass loop 3260 can compensate for small excursions of pressure that can occur over time during use of a gas enclosure system. Bypass loop 3260 can be in fluid communication with compressor loop 3250 on an inlet side of bypass loop 3260 when bypass inlet valve 3261 is in an opened position. When bypass inlet valve 3261 is opened, gas shunted through bypass loop 3260 can be recirculated to the compressor if gas from compressor loop 3250 is not in demand within the interior of gas enclosure assembly 1005. Compressor loop 3250 is configured to shunt gas through bypass loop 3260 when a pressure of the gas in accumulator 3264 exceeds a pre-set threshold pressure. A pre-set threshold pressure for accumulator 3264 can be from between about 25 psig to about 200 psig at a flow rate of at least about 1 cubic feet per minute (cfm), or from between about 50 psig to about 150 psig at a flow rate of at least about 1 cubic feet per minute (cfm), or from between about 75 psig to about 125 psig at a flow rate of at least about 1 cubic feet per minute (cfm) or between about 90 psig to about 95 psig at a flow rate of at least about 1 cubic feet per minute (cfm).

Various examples of compressor loop 3250 can utilize a variety of compressors other than a zero ingress compressor, such as a variable speed compressor or a compressor that can be controlled to be in either an on or off state. As previously discussed herein, a zero ingress compressor ensures that no atmospheric reactive species can be introduced into a gas enclosure system. As such, any compressor configuration preventing atmospheric reactive species from being introduced into a gas enclosure system can be utilized for compressor loop 3250. According to various examples, compressor 3262 of gas enclosure system 503 can be housed in, for example, but not limited by, an hermetically-sealed housing. The housing interior can be configured in fluid communication with a source of gas, for example, the same gas that forms the gas atmosphere for gas enclosure assembly 1005. For various examples of compressor loop 3250, compressor 3262 can be controlled at a constant speed to maintain a constant pressure. In other examples of compressor loop 3250 not utilizing a zero ingress compressor, compressor 3262 can be turned off when a maximum threshold pressure is reached, and turned on when a minimum threshold pressure is reached.

In FIG. 19A for gas enclosure system 504, blower loop 3280 utilizing vacuum blower 3290 is shown for the operation of substrate floatation table printing region 2250 of inkjet printing system 2000, which are housed in gas enclosure assembly 1005. As previously discussed herein for compressor loop 3250, blower loop 3280 can be configured to continuously supply pressurized gas to a substrate floatation table printing region 2250 of printing system 2000.

Various examples of a gas enclosure system that can utilize a pressurized gas recirculation system can have various loops utilizing a variety of pressurized gas sources, such as at least one of a compressor, a blower, and combinations thereof. In FIG. 19A for gas enclosure system 504, compressor loop 3250 can be in fluid communication with external gas loop 3200, which can be used for the supply of gas for high consumption manifold 3225, as well as low consumption manifold 3215. For various examples of a gas enclosure system according to the present teachings as shown in FIG. 19A for gas enclosure system 504, high consumption manifold 3225 can be used to supply gas to various devices and apparatuses, such as, but not limited by, one or more of a substrate floatation table, a pneumatic robot, an air bearing, an air bushing, and a compressed gas tool, and combinations thereof. For various examples of a gas enclosure system according to the present teachings, low consumption 3215 can be used to supply gas to various apparatuses and devises, such as, but not limited by, one or more of an isolator, and a pneumatic actuator, and combinations thereof.

For various examples of gas enclosure system 504 of FIGS. 19A and 19B, a blower loop 3280 can be utilized to supply pressurized gas to various examples of substrate floatation table printing region 2250. In addition to a supply of pressurized gas, substrate floatation table printing region 2250 of OLED inkjet printing system 2000, which utilizes air bearing technology, also utilizes blower vacuum 3290, which is in communication with gas enclosure assembly 1005 through line 3292 when valve 3294 is in an open position. Housing 3282 of blower loop 3280 can maintain first blower 3284 for supplying a pressurized source of gas to substrate floatation table printing region 2250, and second blower 3290, acting as a vacuum source for substrate floatation table printing region 2250, which is housed in a gas environment in gas enclosure assembly 1005. Attributes that can make blowers suitable for use as a source of either pressurized gas or vacuum for various examples a substrate floatation table include, for example, but not limited by, that they have high reliability; making them low maintenance, have variable speed control, and have a wide range of flow volumes; various examples capable of providing a volume flow of between about 100 m$^3$/h to about 2,500 m$^3$/h. Various examples of blower loop 3280 additionally can have first isolation valve 3283 at an inlet end of blower loop 3280, as well as check valve 3285 and a second isolation valve 3287 at an outlet end of blower loop 3280. Various examples of blower loop 3280 can have adjustable valve 3286, which can be, for example, but not limited by, a gate, butterfly, needle or ball valve, as well as heat exchanger 3288 for maintaining gas from blower loop 3280 to substrate floatation table printing region 2250 at a defined temperature.

FIG. 19A depicts external gas loop 3200, also shown in FIG. 18A, for integrating and controlling gas source 3201 and clean dry air (CDA) source 3203 for use in various aspects of operation of gas enclosure system 503 of FIG. 18A and gas enclosure system 504 of FIG. 19A. External gas loop 3200 of FIG. 18A and FIG. 19A can include at least four mechanical valves. These valves include first mechanical valve 3202, second mechanical valve 3204, third mechanical valve 3206, and fourth mechanical valve 3208. These various valves are located at positions in various flow lines that allow control of both a non-reactive gas and an air source such as clean dry air (CDA). According to the present teachings, a non-reactive gas can be any gas that does not undergo a chemical reaction under a defined set of conditions. Some commonly used non-limiting examples of non-reactive gas can include nitrogen, any of the noble gases, and any combination thereof. From a house gas source 3201, a house gas line 3210 extends. House gas line 3210 continues to extend linearly as low consumption manifold line 3212, which is in fluid communication with low consumption manifold 3215. A cross-line first section 3214 extends from a first flow juncture 3216, which is located at the intersection of house gas line 3210, low consumption manifold line 3212, and cross-line first section 3214. Cross-line first section 3214 extends to a second flow juncture 3218. A compressor gas line 3220 extends from accumulator 3264 of compressor loop 3250 and terminates at second flow juncture 3218. A CDA line 3222 extends from a CDA source 3203 and continues as high consumption manifold line 3224, which is in fluid communication with high consumption manifold 3225. A third flow juncture 3226 is positioned at the intersection of a cross-line second section 3228, clean dry air line 3222, and high consumption manifold line 3224.

Cross-line second section 3228 extends from second flow juncture 3218 to third flow juncture 3226. Various components that are high consumption can be supplied CDA during maintenance, by means high consumption manifold 3225. Isolating the compressor using valves 3204, 3208, and 3230 can prevent reactive species, such as ozone, oxygen, and water vapor from contaminating a gas within the compressor and accumulator.

By contrast with FIGS. 18A and 19A, FIGS. 18B and 19B illustrate generally a configuration wherein a pressure of gas inside the gas enclosure assembly 1005 can be maintained within a desired or specified range, such as using a valve coupled to a pressure monitor, P, where the valve allows gas to be exhausted to another enclosure, system, or a region surrounding the gas enclosure assembly 1005 using information obtained from the pressure monitor. Such gas can be recovered and re-processed as in other examples described herein. As mentioned above, such regulation can assist in maintaining a slight positive internal pressure of a gas enclosure system, because pressurized gas is also contemporaneously introduced into the gas enclosure system. Variable demand of various devices and apparatuses can create an irregular pressure profile for various gas enclosure assemblies and systems of the present teachings. Accordingly, the approach shown in FIGS. 18B and 19B can be used in addition or instead of other approaches described herein such as to assist in maintaining a dynamic pressure balance for a gas enclosure system held at a slight positive pressure relative to the environment surrounding the enclosure.

FIG. 19C illustrates generally a further example of a system 505 for integrating and controlling one or more gas or air sources, such as to establish floatation control zones included as a portion of a floatation conveyance system. Similar to the examples of FIGS. 19A and 19B, FIG. 19C illustrates generally a floatation table printing region 2250. Additionally shown in the illustrative example of FIG. 19C are an input region 2100 and an output region 2300. The regions 2100, 2200, 2300 are referred to as input, printing, and output for illustration only. Such regions can be used for other processing steps, such as conveyance of a substrate, or support of a substrate such as during one or more of holding, drying, or curing of the substrate in one or more other modules. In the illustration of FIG. 19C, a first blower 3284A is configured to provide pressurized gas in one or more of the input or output regions 2100 or 2300 of a floatation table apparatus. Such pressurized gas can be temperature controlled such as using a first chiller 142A coupled to a first heat exchanger 1502A. Such pressurized gas can be filtered using a first filter 1503A. A temperature monitor 8701A can be coupled to the first chiller 142 (or other temperature controller).

Similarly, a second blower 3284B can be coupled to the printing region 2200 of the floatation table. A separate chiller 142B can be coupled to a loop including a second heat exchanger 1502B and a second filter 1503B. A second temperature monitor 8701B can be used to provide independent regulation of the temperature of pressurized gas provided by the second blower 3284B. In this illustrative example, the input and output regions 2100 and 2300 are supplied with positive pressure, but the printing region 2200 can include use of a combination of positive pressure and vacuum control to provide precise control over the substrate position. For example, using such a combination of positive pressure and vacuum control, the substrate can be exclusively controlled using the floating gas cushion provided by the system 504 in the zone defined by the printing region 2200. The vacuum can be established by a third blower 3290, such as also provided at least a portion of the make-up gas for the first and second blowers 3284A or 3284B within the blower housing 3282.

Figure 20A:
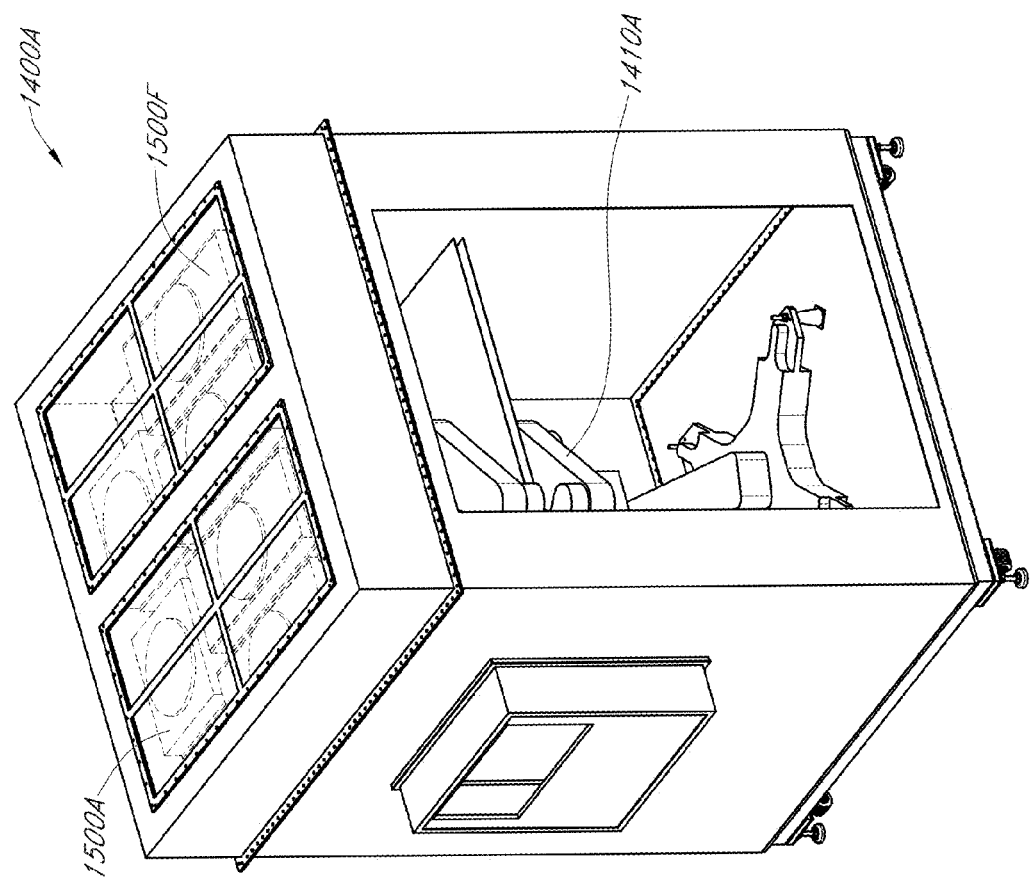
FIG. 20A, FIG. 20B, and FIG. 20C illustrate generally views of at least a portion of a system, such as including a transfer module, that can be used in manufacturing an electronic device (e.g., an organic light emitting diode (OLED) device).
Figure 20B:
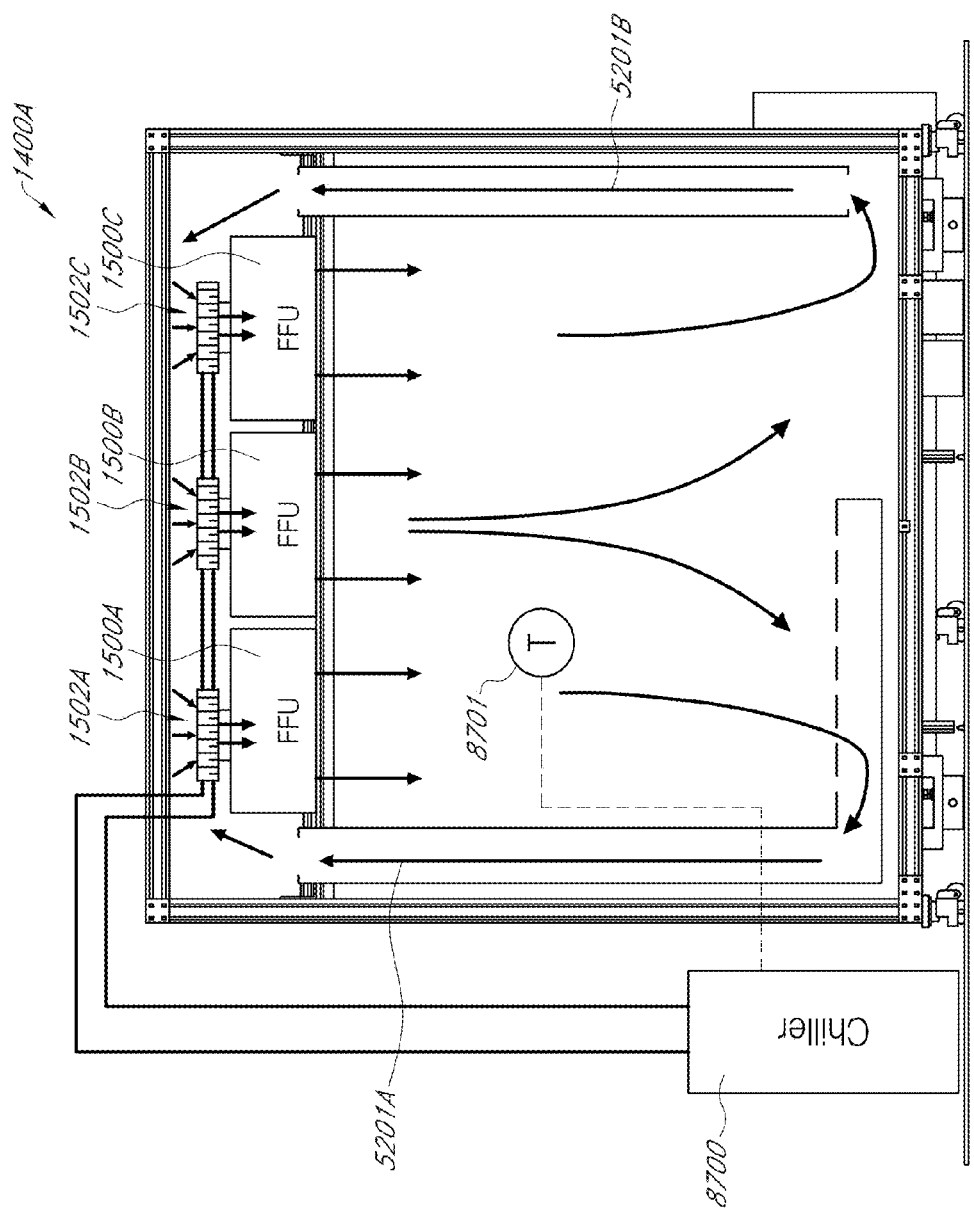
Figure 20C:
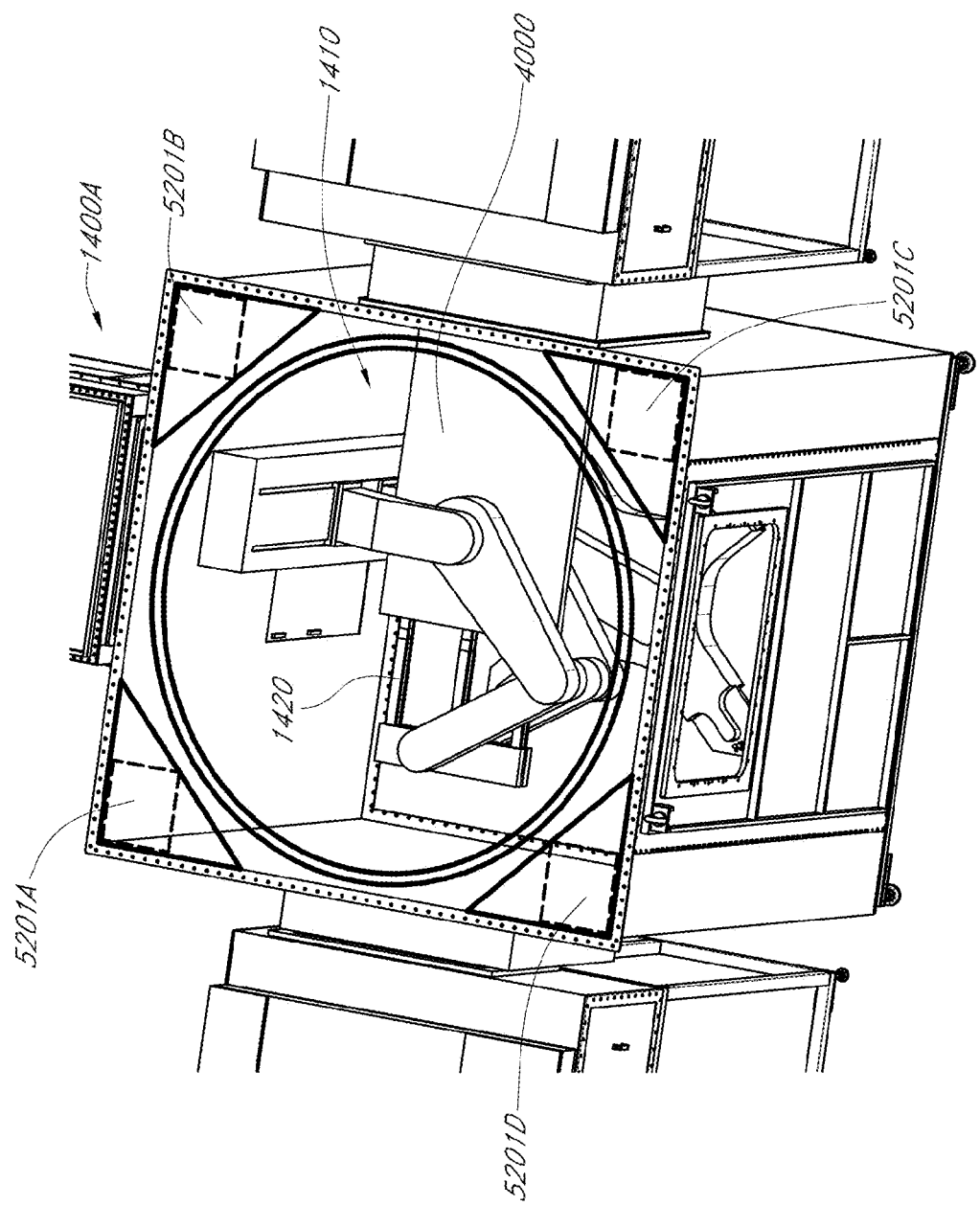

FIG. 20A, FIG. 20B, and FIG. 20C illustrate generally views of at least a portion of a system, such as including a transfer module, that can be used in manufacturing an electronic device (e.g., an organic light emitting diode (OLED) device). The controlled environment within various enclosures of a system can include a controlled particulate level. Particulates can be reduced or minimized such as by using air circulation units and filters, such as can be referred to as fan filter units (FFUs). An array of FFUs can be located along a path traversed by the substrate during processing. The FFUs need not provide a down-flow direction of air flow. For example, an FFU or ductwork can be positioned to provide a substantially laminar flow in a lateral direction across a surface of the substrate. Such laminar flow in the lateral direction can enhance or otherwise provide particulate control.

In the example of FIG. 20A, FIG. 20B, and FIG. 20C, one or more fan filter units (FFUs), such as FFUs 1500A through 1500F can be used to assist in maintaining an environment within the transfer module 1400A having a controlled level of particulates or contaminants. Ducting such as first and second ducts 5201A or 5201E can be used, such as to provide a return air pathway as shown in the down-flow examples of FIG. 20B and FIG. 20C. A controlled temperature can be maintained at least in part using a temperature controller 8700, such as coupled to one or more heat exchangers 1502. One or more temperature monitors, such as a temperature monitor 8701, can be placed in specified locations (e.g., on or nearby a substrate, such, or end effector) to provide feedback to assist in maintaining a substrate or a region nearby a substrate within a specified range of temperatures. In an example, as discussed below, the temperature monitor can be a non-contact sensor, such as an infrared temperature monitor configured to provide information indicative of a surface temperature sampled by the sensor. Other configurations are possible, such as can include placing the heat exchanger within or nearby a return air duct in a lower portion of the chamber as shown illustratively in FIG. 21B.

In FIG. 20C, a circle denotes generally an outer dimensional limit of sweep of the handler 1410, and the regions indicated in the corners can be used as ducts 5201A, 5201B, 5201C, or 5201D, such as to provide a return pathway for a purified gas (e.g., nitrogen) to be captured from the bottom of the transfer module 1400A and then recirculated or scrubbed, such as for reinjection through one or more FFUs 1500A through 1500F located at the top of the transfer module 1400A.

FIG. 21A and FIG. 21B illustrate generally views of a portion of a system, such as can include a stacked configuration of substrate 4000 processing areas. A port of the processing module 1200 can include one or more doors or hatches, such as a door 3301. For example, such doors can be mechanically or electrically interlocked so that a door accessible to an exterior of a fabrication system is unable to be opened unless a corresponding door elsewhere on or within the system is closed. For example, the door 3301 can be used to perform maintenance, while the processing module 1200 is otherwise isolated from an inert environment, or a particulate or contaminant-controlled environment in other enclosed portions of a fabrication system.

As mentioned above, such a particulate or contaminant-controlled environment can be maintained at least in part using one or more FFUs 1500. In the example of FIG. 21B, a cross-flow configuration is used, such as to maintain a substantially laminar flow of gas (e.g., a non-reactive gas) across each of one or more cells 3350 that can include a substrate. A heat exchanger 1502 can, but need not be located nearby or as a portion of the FFU 1500. For example, the heat exchanger 1502 can be located below a substrate handling area, such as included within or as a portion of a return duct 5201. A temperature can be controlled by a temperature controller 8700, such as coupled to a temperature sensor 8701. The curved profile of portions of the duct 5201 can be specified at least in part using a computational fluid dynamics technique, such as to maintain specified flow characteristics (e.g., laminar flow) within the processing module 1200.

In addition to queuing substrates (or instead of queuing substrates), such as until the next module is ready to receive such substrates, the processing module 1200 can functionally participate in the substrate fabrication process, for example by providing drying functions, or by holding the substrate for a specified duration (or until specified criteria are met) so as to allow the substrate to evolve from one condition to another. In the case of holding for the purpose of evolving the substrate, for example, the substrate can be held so as to allow for a liquid to settle or flow. A temperature of the substrate during such evolution can be controlled through the controlled application of temperature controlled gas flow across the substrate surface, such as laminar flow, which can be provided to flow across the plane of the substrate, as indicated in FIG. 21B.

In general, the holding module temperature need not be the same as the temperature of the environment in or surrounding the other system modules, for example, the printing module or the substrate handling module. In another example, the substrate can rest on a cushion of temperature-controlled gas (similar to other examples described herein, such as where the substrate is supported using a floating cushion of gas for one or more of printing, holding, or curing operations such a curing operation including ultraviolet treatment).

In the case of drying a substrate in a processing module 1200, the controlled environment can provide for continuous removal of evaporated vapors via a vapor trap or gas recirculation and purification system, and the dying process can be further controlled through the controlled application of gas flow across the substrate surface, such as laminar flow, which can be provided to flow across the plane of the substrate, as indicated in FIG. 21B. In an example, the processing module 1200 includes a drying module, and other portions of a system can be configured to at least partially evacuate or purge an atmosphere within the drying module to facilitate a drying operation, such as after a printing operation.

Figure 22A:
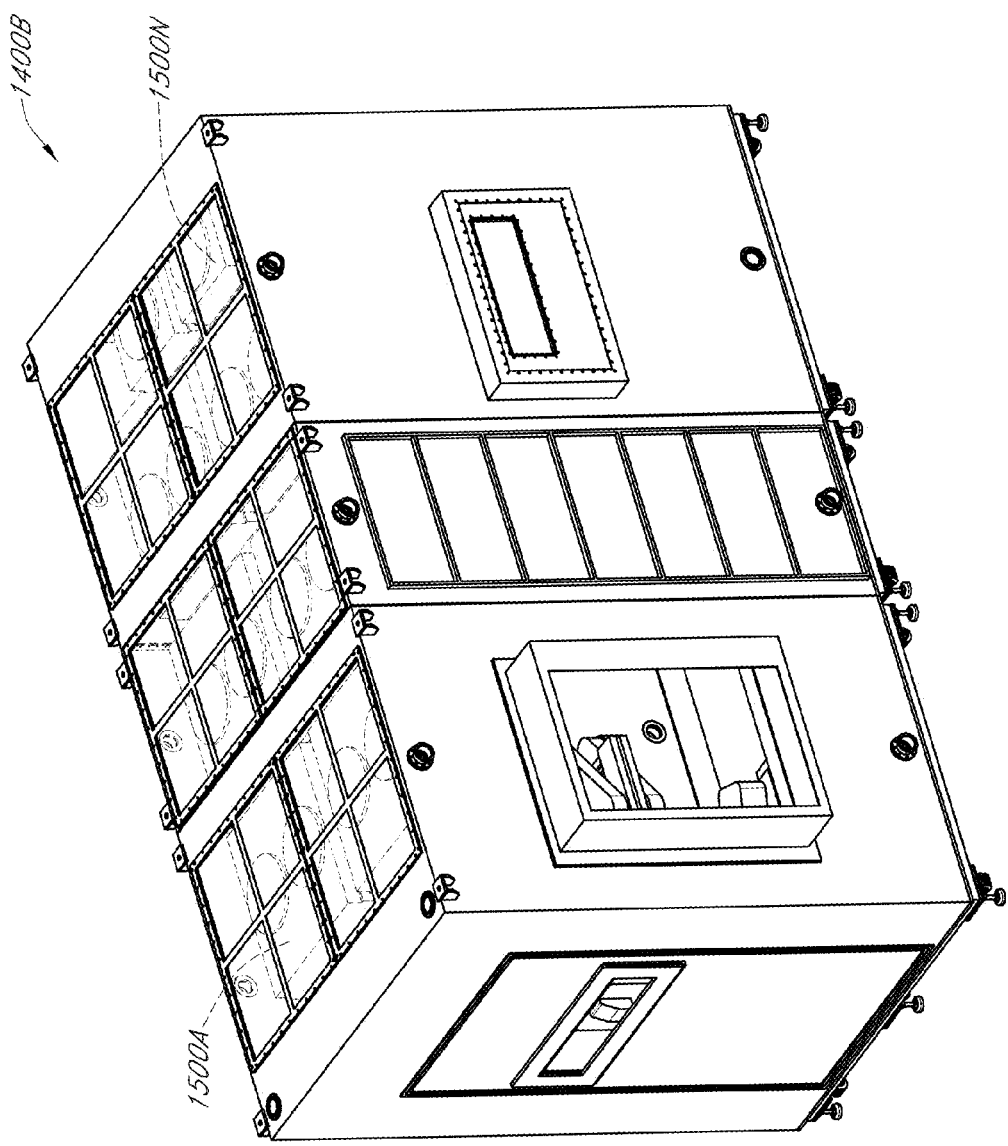
FIG. 22A illustrates generally a portion of a system, such as including a transfer module coupled to other chambers or modules, that can be used in manufacturing an electronic device (e.g., an organic light emitting diode (OLED) device).
Figure 22B:
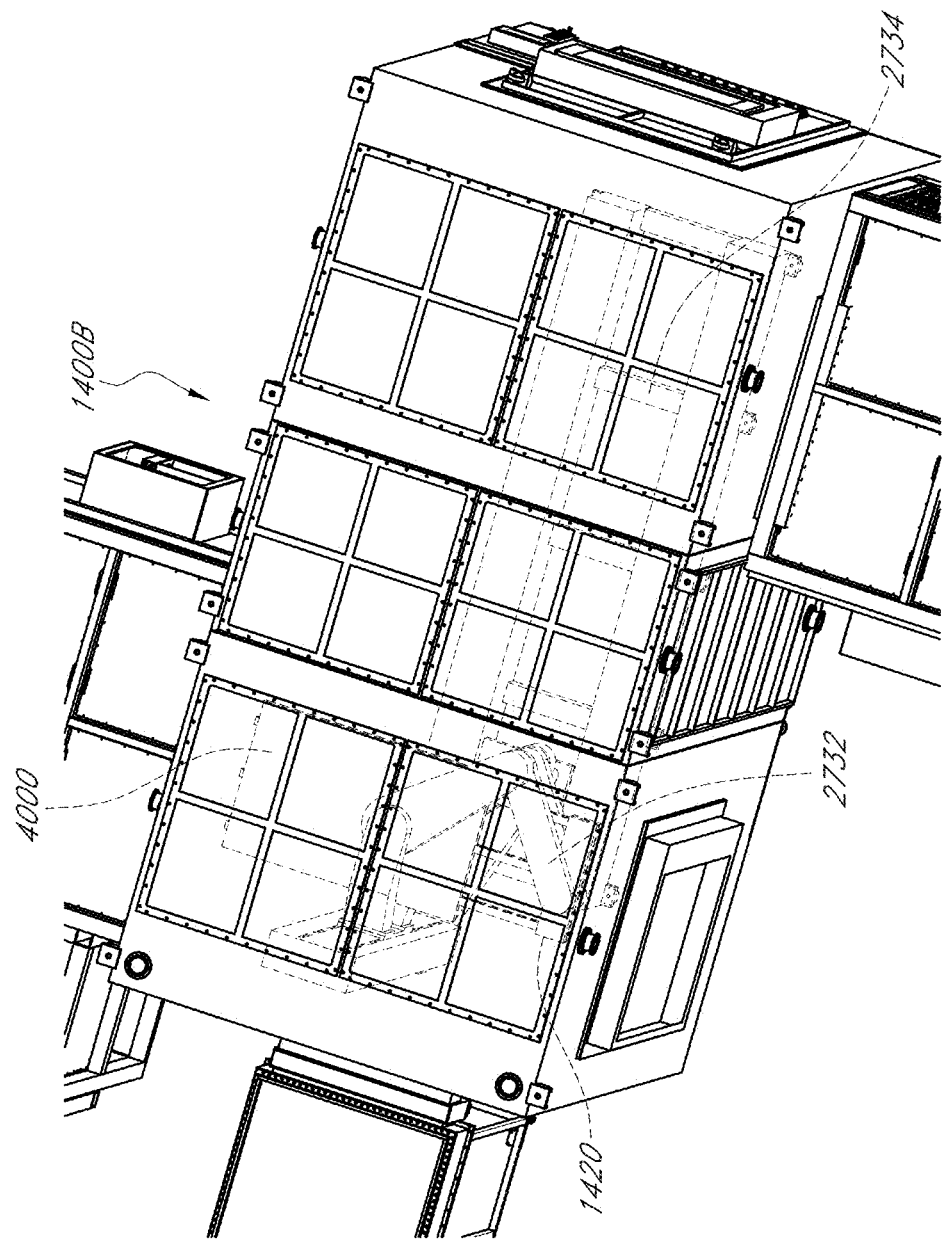
FIG. 22B illustrates generally a handler configuration that can be used, such as for manipulating a substrate within the module shown in FIG. 22A.

FIG. 22A illustrates generally a portion of a system, such as including a transfer module coupled to other chambers or modules, that can be used in manufacturing an electronic device (e.g., an organic light emitting diode (OLED) device). FIG. 22B illustrates generally a handler configuration that can be used, such as for manipulating a substrate within the module shown in FIG. 12A.

As in the example of FIG. 20A, the transfer module 1400E can include one or more fan filter units (FFUs), such as 1500A through 1500N (e.g., 14 FFUs). FIG. 22B illustrates generally a handler 2732 configuration that can be used, such as for manipulating a substrate 4000 within the module 1400B shown in FIG. 21A. By contrast with the handler 1410A of the transfer module 1400A of FIG. 21A, the handler 1410B of FIG. 22B illustrates generally that a track 2734 or rail configuration can be used, such as to provide linear translation of the handler 2732 in an axis. In this manner, a broad range of other chambers or modules can be coupled to the transfer module 1400B, such as in a clustered configuration, without requiring that each other module or chamber be coupled in a manner radiating out from a single point. As in the example of FIG. 20C, one or more ducts can be located in portions of the transfer module 1400E in a region outside the race-track shaped range of motion of the handler 1410B. For example, such locations can be used to provide return ducts to bring a gas (e.g., nitrogen) from a lower portion of the transfer module 1400E upwards to a plenum above the FFU array as shown in other examples.

An end effector of the handlers shown in FIG. 20C or 22B can include a uniform substrate support system similar to the various examples of chuck and end effector configurations described elsewhere herein, such as to facilitate formation of a mura-free organic encapsulation layer.

VARIOUS NOTES & EXAMPLES

Example 1 can include or use subject matter (such as an apparatus, a method, a means for performing acts, or a device readable medium including instructions that, when performed by the device, can cause the device to perform acts), such as can include or use a coating system for providing a coating on a substrate, the system comprising an enclosed printing system configured to deposit a patterned organic layer on a substrate, the patterned organic layer coating at least a portion of a light-emitting device fabricated upon the substrate, an enclosed curing module including an ultraviolet treatment region configured to accommodate a substrate and configured to provide an ultraviolet treatment to the patterned organic layer, and an enclosed substrate transfer module configured to receive the substrate from an atmospheric environment different from an environment of one or more of the enclosed printing system or the enclosed curing module. In Example 1, the patterned organic layer is to occupy a deposition region of the substrate on a first side of the substrate, and the enclosed curing module is configured to uniformly support the substrate in the ultraviolet treatment region using a gas cushion, the gas cushion provided to a second side of the substrate opposite the first side, the gas cushion established between the substrate and a chuck.

Example 2 can include, or can optionally be combined with the subject matter of Example 1, to optionally include a deposition region on the first side of the substrate that overlaps with an active region of the substrate comprising the light-emitting device, and wherein the gas cushion is provided to the second side of the substrate opposite the active region.

Example 3 can include, or can optionally be combined with the subject matter of Example 2, to optionally include a chuck configured to support the substrate using physical contact with the second side of the substrate, opposite the first side, where the physical contact is in an area corresponding to a region outside the active region.

Example 4 can include, or can optionally be combined with the subject matter of one or any combination of Examples 1 through 3 to optionally include a chuck that comprises a porous ceramic material, and wherein the gas cushion is established by forcing gas through the porous ceramic material to support the second side of the substrate above the porous ceramic material.

Example 5 can include, or can optionally be combined with the subject matter of one or any combination of Examples 1 through 4 to optionally include a gas cushion established using pressurized gas.

Example 6 can include, or can optionally be combined with the subject matter of one or any combination of Examples 1 through 5 to optionally include a gas cushion that is established using a combination of a pressurized gas region and at least a partial vacuum region.

Example 7 can include, or can optionally be combined with the subject matter of Example 6, to optionally include at least one of pressurized gas or evacuated gas used to establish the gas cushion that is recovered and recirculated.

Example 8 can include, or can optionally be combined with the subject matter of one or any combination of Examples 1 through 7 to optionally include a patterned organic layer comprising at least a portion of an encapsulation structure, the substrate comprising a glass sheet and light-emitting devices, the encapsulation structure established to seal at least a portion of the light-emitting devices from exposure to ambient air against the glass sheet, and the enclosed curing module configured (1) to hold the substrate at rest for a duration for dispersal of the patterned organic layer to cover the light-emitting devices, and (2) to provide the ultraviolet treatment without requiring further movement of the substrate between holding and ultraviolet treatment operations.

Example 9 can include, or can optionally be combined with the subject matter of one or any combination of Examples 1 through 8 to optionally include an ultraviolet treatment region of the curing module comprising a gantry-mounted ultraviolet (UV) source, the gantry configured to transport the UV source relative to the substrate during curing.

Example 10 can include, or can optionally be combined with the subject matter of one or any combination of Examples 1 through 9 to optionally include an enclosed printing system and the enclosed curing module configured to provide controlled processing environments at or near atmospheric pressure and established to remain below specified limits of particulate contamination level, water vapor content, and oxygen content.

Example 11 can include, or can optionally be combined with the subject matter of one or any combination of Examples 1 through 10 to optionally include a deposition region that includes a length dimension and a width dimension, and an ultraviolet treatment region that comprises an ultraviolet (UV) source including an array of UV emitters, the array having a span in at least one dimension that is greater than at least one of the length dimension or the width dimension.

Example 12 can include, or can optionally be combined with the subject matter of Example 11, to optionally include an array of UV emitters that extends in two dimensions.

Example 13 can include, or can optionally be combined with the subject matter of Example 11, to optionally include an array of UV emitters comprising an array of light emitting diodes.

Example 14 can include, or can optionally be combined with the subject matter of one or any combination of Examples 1 through 13 to optionally include an ultraviolet treatment region that comprises an ultraviolet (UV) source and a diffuser, the diffuser configured to normalize an intensity of the UV source across an area of the deposition region treated using the UV source.

Example 15 can include, or can optionally be combined with the subject matter of one or any combination of Examples 1 through 14 to optionally include an enclosed curing is configured to control a temperature of the substrate in a manner to maintain a specified temperature uniformity across the deposition region.

Example 16 can include, or can optionally be combined with the subject matter of one or any combination of Examples 1 through 15 to include, subject matter (such as an apparatus, a method, a means for performing acts, or a machine readable medium including instructions that, when performed by the machine, that can cause the machine to perform acts), such as can include providing a coating, comprising transferring a substrate from an inorganic thin film encapsulation system to a transfer module of an organic thin film encapsulation system, transferring the substrate to an enclosed printing system, the enclosed printing system configured to deposit a patterned organic layer in a deposition region on a first side of the substrate, the patterned organic layer coating at least a portion of a light-emitting device fabricated upon the substrate, uniformly supporting the substrate in the enclosed printing system using a first gas cushion provided to a second side of the substrate opposite the deposition region, printing monomer over the deposition region of the substrate using the enclosed printing system, transferring the substrate from the enclosed printing system to the transfer module, transferring the substrate from the transfer module to an enclosed curing module, uniformly supporting the substrate in the enclosed curing module using a second gas cushion provided to the second side of the substrate opposite the first side, and treating the monomer film layer in the enclosed curing module to provide a mura-free polymerized organic layer in the deposition region.

Example 17 can include, or can optionally be combined with the subject matter of Example 16, to optionally include a deposition region on the first side of the substrate that overlaps with an active region of the substrate comprising the light-emitting device, and wherein at least one of the first or second gas cushions is provided to the second side of the substrate opposite the active region.

Example 18 can include, or can optionally be combined with the subject matter of Example 17, to optionally include at least one of supporting the substrate in the enclosed printing system or the enclosed curing module including using physical contact with the second side of the substrate, opposite the first side, where the physical contact is in an area corresponding to a region outside the active region.

Example 19 can include, or can optionally be combined with the subject matter of one or any combination of Examples 16 through 18 to optionally include treating the monomer layer including providing an ultraviolet treatment.

Example 20 can include, or can optionally be combined with the subject matter of Example 19, to optionally include a holding the substrate in the enclosed curing module for a specified duration after deposition of the monomer layer and before ultraviolet treatment.

Example 21 can include, or can optionally be combined with the subject matter of one or any combination of Examples 16 through 20 to optionally include transferring the substrate from the inorganic thin film deposition system to the transfer module of the organic thin film deposition system includes receiving the substrate from an atmospheric environment different from an environment of one or more of the printing system or the curing module.

Example 22 can include, or can optionally be combined with the subject matter of one or any combination of Examples 16 through 21 to optionally include at least one of the first or second gas cushions established using a porous ceramic material by forcing gas through the porous ceramic material to support the second side of the substrate above the porous ceramic material.

Example 23 can include, or can optionally be combined with the subject matter of one or any combination of Examples 16 through 22 to optionally include establishing at least one of the first or second gas cushions using pressurized gas.

Example 24 can include, or can optionally be combined with the subject matter of one or any combination of Examples 16 through 22 to optionally include establishing at least one of the first or second gas cushions using a combination of a pressurized gas region and at least a partial vacuum region.

Example 25 can include, or can optionally be combined with the subject matter of one or any combination of Examples 16 through 24 to optionally include the enclosed printing system and the enclosed curing module providing controlled processing environments at or near atmospheric pressure and established to remain below specified limits of particulate contamination level, water vapor content, and oxygen content.

Example 26 can include, or can optionally be combined with the subject matter of one or any combination of Examples 1 through 25 to include, subject matter (such as an apparatus, a method, a means for performing acts, or a machine readable medium including instructions that, when performed by the machine, that can cause the machine to perform acts), such as can include a coating system for providing a coating on a substrate, the system comprising an enclosed printing system configured to deposit a patterned organic layer on a substrate, the patterned organic layer coating at least a portion of a light-emitting device being fabricated upon the substrate, the enclosed first printing system configured to provide a first processing environment, an enclosed curing module including a stacked configuration of ultraviolet treatment regions, the ultraviolet treatment regions offset from each other and each configured to accommodate a substrate, the enclosed curing module configured to provide a second processing environment, and an enclosed substrate transfer module comprising a chamber configured to receive the substrate from an atmospheric environment different from the environment of one or more of the enclosed printing system or the enclosed curing module. In Example 26, the first and second processing environments comprise controlled environments at or near atmospheric pressure and established to remain below specified limits of limits of particulate contamination level, water vapor content, and oxygen content.

Example 27 can include, or can optionally be combined with the subject matter of Example 26, to optionally include respective ones of the ultraviolet treatment regions configured to hold the substrate for a specified duration.

Example 28 can include, or can optionally be combined with the subject matter of one or any combination of Examples 26 or 27 to optionally include respective ones of the ultraviolet treatment regions configured to hold the substrate for a specified duration after deposition of the patterned organic layer and before ultraviolet treatment.

Example 29 can include, or can optionally be combined with the subject matter of one or any combination of Examples 26 through 28 to optionally include an enclosed holding module configured to provide a third processing environment comprising a controlled environment at or near atmospheric pressure and established to remain below specified limits of limits of particulate contamination level, water vapor content, and oxygen content, the enclosed holding module configured to hold the substrate when the substrate is transferred to the enclosed holding module from one or more of the printing system or from elsewhere.

Example 30 can include, or can optionally be combined with the subject matter of one or any combination of Examples 26 through 29 to optionally include a substrate oriented in a face-up configuration for deposition of the patterned organic layer on the upward-facing surface of the substrate.

Example 31 can include, or can optionally be combined with the subject matter of one or any combination of Examples 26 through 30 to optionally include an atmospheric environment different from the environment of one or more of the printing system or the curing module comprising a vacuum.

Example 32 can include, or can optionally be combined with the subject matter of one or any combination of Examples 26 through 31 to optionally include a substrate loading module configured to transition the substrate to an environment above atmospheric pressure and to provide the substrate to the transfer module.

Example 33 can include, or can optionally be combined with the subject matter of one or any combination of Examples 26 through 32 to optionally include a printing system comprising an inkjet printing system.

Example 34 can include, or can optionally be combined with the subject matter of one or any combination of Examples 26 through 33 to optionally include first and second processing environments including a non-reactive gas specified for minimal or no reactivity with a species deposited on the substrate.

Example 35 can include, or can optionally be combined with the subject matter of one or any combination of Examples 26 through 34 to optionally include first and second processing environments comprising nitrogen above atmospheric pressure.

Example 36 can include, or can optionally be combined with the subject matter of one or any combination of Examples 26 through 35 to optionally include first and second processing environments established to maintain an environment having less than 100 parts-per-million of oxygen and less than 100 parts-per-million of water vapor.

Example 37 can include, or can optionally be combined with the subject matter of one or any combination of Examples 26 through 36 to optionally include a particulate contamination level controlled at least in part using multiple fan filter units located along or nearby a path traversed by the substrate.

Example 38 can include, or can optionally be combined with the subject matter of one or any combination of Examples 26 through 37 to optionally include first and second processing environments are substantially the same.

Each of the non-limiting examples described herein can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples," Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A coating system for providing a coating on a substrate, the coating system comprising:
    an inkjet printing system to deposit an organic material on the substrate; and
    a curing module comprising a stacked configuration of optical curing regions, an ultraviolet energy source, and a window separating the optical curing regions from the ultraviolet energy source, the ultraviolet energy source being positioned to transmit ultraviolet light through the window to cure the organic material deposited on the substrate located in one of the optical curing regions,
    wherein the optical curing regions are offset from each other and each of the optical curing regions is sized to receive the substrate to cure the organic material to form an organic layer over at least a portion of a light-emitting device fabricated on the substrate,
    wherein each of the inkjet printing system and the curing module is housed in an enclosure to provide a controlled processing environment at or near atmospheric pressure.

2. The coating system of claim 1, wherein the curing module is configured to hold the substrate for a specified duration when the substrate is received in any one of the optical curing regions.

3. The coating system of claim 1, wherein the curing module is configured to hold the substrate for a specified duration after deposition of the organic material and before optical curing of the organic material to form the organic layer.

4. The coating system of claim 1, wherein the controlled processing environment comprises a controlled gas environment that is nonreactive with the organic material deposited on the substrate.

5. The coating system of claim 4, wherein the controlled gas environment comprises nitrogen.

6. The coating system of claim 1, wherein the controlled processing environment maintains reactive species at or below a specified limit.

7. The coating system of claim 6, wherein the reactive species comprise at least one of ozone, oxygen, water vapor, and organic solvent vapor.

8. The coating system of claim 7, wherein the specified limit is 100 ppm.

9. The coating system of claim 1, wherein the controlled processing environment comprises a particulate contamination maintained at or below a specified limit.

10. The coating system of claim 9, wherein the specified limit of the particulate contamination is better than a Class 10 specification for particles greater than or equal to 2 microns in diameter.

11. The coating system of claim 1, further comprising a substrate transfer module comprising a chamber configured to receive the substrate from an atmospheric environment different from the controlled processing environment of the inkjet printing system and the curing module.

12. The coating system of claim 1, wherein the inkjet printing system further comprises a substrate support apparatus to establish a pressurized gas cushion between the substrate and the substrate support apparatus.

13. The coating system of claim 12, wherein the substrate support apparatus comprises a porous ceramic material.

14. The coating system of claim 1, wherein the curing module further comprises a substrate support apparatus to establish a pressurized gas cushion between the substrate and the substrate support apparatus.

15. The coating system of claim 14, wherein the substrate support apparatus comprises a porous ceramic material.

16. The coating system of claim 1, wherein the inkjet printing system is further configured to deposit the organic material so as to form the organic layer in a pattern on the substrate.

17. The coating system of claim 1, further comprising a gas recirculation system that comprises a pressurized gas loop operably coupled to supply a pressurized gas to a pneumatic component of at least one of the inkjet printing system and the curing module.

18. The coating system of claim 17, wherein the pressurized gas loop comprises a pressure-controlled bypass loop configured to compensate for variable demand of the pressurized gas supplied to the pneumatic component so as to maintain the controlled processing environment at or near atmospheric pressure.

19. The coating system of claim 1, wherein the enclosure in which each of the inkjet printing system and curing module is housed is configured to provide the processing environment at a pressure above atmospheric pressure.

20. The coating system of claim 19, wherein the enclosure in which each of the inkjet printing system and curing module is housed is configured to provide the processing environment at a pressure at about 2 mbarg or greater.

21. The coating system of claim 19, wherein the enclosure in which each of the inkjet printing system and curing module is housed is configured to provide the processing environment at about 6 mbarg or greater.

22. The coating system of claim 1, wherein the ultraviolet energy source comprises a linear array of LED sources, the substrate and linear array of LED sources being moveable relative to each other.

23. The coating system of claim 22, wherein the linear array has a length so as to span across at least one of a length and a width of the substrate.

24. The coating system of claim 22, further comprising an optical sensor positioned to detect a failure of one or more of the LED sources of the ultraviolet energy source.

25. The coating system of claim 1, further comprising a substrate support apparatus to establish a pressurized gas cushion between the substrate and the substrate support apparatus in both of the inkjet printing system and in the curing module.

26. The coating system of claim 15, wherein:
the inkjet printing system comprises an input region, a printing region, and an output region, and
the substrate support apparatus is configured to control floatation of the substrate in at least one of the input region, the printing region, and the output region in a different manner from another of the input region, the printing region, and the output region.

27. The coating system of claim 1, wherein the window is configured to converge, diverge, or collimate the ultraviolet energy transmitted through the window.

* * * * *